(12) United States Patent
Yamazaki

(10) Patent No.: US 12,283,612 B1
(45) Date of Patent: *Apr. 22, 2025

(54) METAL OXIDE AND TRANSISTOR INCLUDING METAL OXIDE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/430,771

(22) Filed: Feb. 2, 2024

Related U.S. Application Data

(63) Continuation of application No. 17/825,209, filed on May 26, 2022, now Pat. No. 11,923,423, which is a (Continued)

(30) Foreign Application Priority Data

Mar. 12, 2018 (JP) .................................. 2018-044786
Mar. 16, 2018 (JP) .................................. 2018-049535
(Continued)

(51) Int. Cl.
*H01L 29/24* (2006.01)
*H01L 29/04* (2006.01)
(Continued)

(52) U.S. Cl.
CPC .............. *H01L 29/24* (2013.01); *H01L 29/04* (2013.01); *H01L 29/1033* (2013.01); *H01L 29/0673* (2013.01)

(58) Field of Classification Search
CPC ..... H01L 29/24; H01L 29/04; H01L 29/1033; H01L 29/0673
(Continued)

(56) References Cited

U.S. PATENT DOCUMENTS 4,908,678 A 3/1990 Yamazaki
7,674,650 B2 3/2010 Akimoto et al.
(Continued)

FOREIGN PATENT DOCUMENTS

JP 63-094680 A 4/1988
JP 2007-320829 A 12/2007
(Continued)

OTHER PUBLICATIONS

International Search Report (Application No. PCT/IB2019/051595) Dated Jun. 4, 2019.
(Continued)

*Primary Examiner* — Tong-Ho Kim
(74) *Attorney, Agent, or Firm* — Eric J. Robinson; Robinson Intellectual Property Law Office, P.C.

(57) ABSTRACT

A novel metal oxide is provided. One embodiment of the present invention is a crystalline metal oxide. The metal oxide includes a first layer and a second layer; the first layer has a wider bandgap than the second layer; the first layer and the second layer form a crystal lattice; and in the case where a carrier is excited in the metal oxide, the carrier is transferred through the second layer. Furthermore, the first layer contains an element M (M is one or more selected from Al, Ga, Y, and Sn) and Zn, and the second layer contains In.

9 Claims, 32 Drawing Sheets

Related U.S. Application Data continuation of application No. 16/975,833, filed as application No. PCT/IB2019/051595 on Feb. 28, 2019, now Pat. No. 11,387,330.

(30) Foreign Application Priority Data

| Mar. 23, 2018 | (JP) | ................................. 2018-055807 |
| Mar. 23, 2018 | (JP) | ................................. 2018-055943 |

(51) Int. Cl.
　　H01L 29/10　　(2006.01)
　　H01L 29/786　　(2006.01)
　　H01L 29/06　　(2006.01)

(58) Field of Classification Search
　　USPC ........................................................ 257/288
　　See application file for complete search history.

(56) References Cited

U.S. PATENT DOCUMENTS

| 8,426,868 | B2 | 4/2013 | Akimoto et al. |
| 8,748,886 | B2 | 6/2014 | Yamazaki et al. |
| 8,759,820 | B2 | 6/2014 | Godo et al. |
| 8,847,220 | B2 | 9/2014 | Yamazaki |
| 8,860,108 | B2 | 10/2014 | Yamazaki et al. |
| 8,878,288 | B2 | 11/2014 | Isobe et al. |
| 8,907,336 | B2 | 12/2014 | Shieh et al. |
| 8,921,853 | B2 | 12/2014 | Yamazaki |
| 8,952,377 | B2 | 2/2015 | Yamazaki et al. |
| 8,952,381 | B2 | 2/2015 | Yamazaki |
| 9,034,104 | B2 | 5/2015 | Yamazaki et al. |
| 9,099,563 | B2 | 8/2015 | Shieh et al. |
| 9,147,768 | B2 | 9/2015 | Yamazaki |
| 9,190,525 | B2 | 11/2015 | Yamazaki |
| 9,214,474 | B2 | 12/2015 | Yamazaki |
| 9,230,996 | B2 | 1/2016 | Miyake et al. |
| 9,240,492 | B2 | 1/2016 | Yamazaki |
| 9,245,958 | B2 | 1/2016 | Yamazaki |
| 9,267,199 | B2 | 2/2016 | Yamazaki et al. |
| 9,293,602 | B2 | 3/2016 | Yamazaki |
| 9,306,078 | B2 | 4/2016 | Shieh et al. |
| 9,425,217 | B2 | 8/2016 | Ishihara et al. |
| 9,536,904 | B2 | 1/2017 | Miyake et al. |
| 9,660,104 | B2 | 5/2017 | Yamazaki |
| 9,722,088 | B2 | 8/2017 | Hanaoka et al. |
| 9,761,734 | B2 | 9/2017 | Ishihara et al. |
| 9,768,317 | B2 | 9/2017 | Ito et al. |
| 9,786,690 | B2 | 10/2017 | Miyake et al. |
| 9,911,864 | B2 | 3/2018 | Ishihara et al. |
| 10,134,914 | B2 | 11/2018 | Yamazaki et al. |
| 10,522,347 | B2 | 12/2019 | Yamazaki et al. |
| 10,796,903 | B2 | 10/2020 | Yamazaki et al. |
| 11,139,166 | B2 | 10/2021 | Yamazaki et al. |
| 11,387,330 | B2 * | 7/2022 | Yamazaki ......... H01L 29/78696 |
| 11,557,612 | B2 | 1/2023 | Yamazaki et al. |
| 11,637,015 | B2 | 4/2023 | Yamazaki et al. |
| 11,923,423 | B2 * | 3/2024 | Yamazaki ........... H01L 29/7869 |
| 2010/0289004 | A1 | 11/2010 | Nakahara et al. |
| 2011/0073856 | A1 | 3/2011 | Sato et al. |
| 2011/0309411 | A1 | 12/2011 | Takemura |
| 2012/0085999 | A1 | 4/2012 | Song et al. |
| 2012/0187395 | A1 | 7/2012 | Koezuka |
| 2012/0227663 | A1 | 9/2012 | Jha et al. |
| 2013/0299819 | A1 | 11/2013 | Yamazaki et al. |
| 2013/0320334 | A1 | 12/2013 | Yamazaki et al. |
| 2014/0042434 | A1 | 2/2014 | Yamazaki |
| 2014/0184165 | A1 | 7/2014 | Takahashi et al. |
| 2014/0346495 | A1 | 11/2014 | Shieh et al. |
| 2015/0084043 | A1 | 3/2015 | Ishihara et al. |
| 2015/0179803 | A1 | 6/2015 | Yamazaki et al. |
| 2015/0287835 | A1 | 10/2015 | Yamazaki |
| 2016/0005872 | A1 | 1/2016 | Kurata et al. |
| 2016/0149055 | A1 | 5/2016 | Yamazaki et al. |
| 2016/0160342 | A1 | 6/2016 | Yamazaki et al. |
| 2016/0172383 | A1 | 6/2016 | Nagatsuka |
| 2016/0172500 | A1 | 6/2016 | Yamazaki et al. |
| 2016/0284862 | A1 | 9/2016 | Yamazaki et al. |
| 2016/0349557 | A1 | 12/2016 | Shishido et al. |
| 2016/0349558 | A1 | 12/2016 | Shishido et al. |
| 2016/0356645 | A1 | 12/2016 | Yoneda et al. |
| 2016/0365367 | A1 | 12/2016 | Kimura et al. |
| 2016/0372606 | A1 | 12/2016 | Ito et al. |
| 2016/0381266 | A1 | 12/2016 | Ohmaru |
| 2017/0373192 | A1 | 12/2017 | Yamazaki |
| 2017/0373194 | A1 | 12/2017 | Yamazaki |
| 2017/0373195 | A1 | 12/2017 | Yamazaki |
| 2023/0260785 | A1 | 8/2023 | Yamazaki et al. |

FOREIGN PATENT DOCUMENTS

| JP | 2010-121068 A | 6/2010 |
| JP | 2011-146698 A | 7/2011 |
| JP | 2011-228691 A | 11/2011 |
| JP | 2012-064932 A | 3/2012 |
| JP | 2012-235102 A | 11/2012 |
| JP | 2014-057056 A | 3/2014 |
| JP | 2014-194076 A | 10/2014 |
| JP | 2015-084416 A | 4/2015 |
| JP | 2015-188059 A | 10/2015 |
| JP | 2018-006734 A | 1/2018 |
| JP | 2018-019072 A | 2/2018 |
| JP | 2018-019073 A | 2/2018 |
| KR | 2015-0033549 A | 4/2015 |
| TW | 201813094 | 4/2018 |
| WO | WO-2007/108176 | 9/2007 |
| WO | WO-2011/074506 | 6/2011 |
| WO | WO-2015/097595 | 7/2015 |
| WO | WO-2017/153882 | 9/2017 |
| WO | WO-2018/002763 | 1/2018 |

OTHER PUBLICATIONS

Written Opinion (Application No. PCT/IB2019/051595) Dated Jun. 4, 2019.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

Murakami.M et al., "Theoretical Examination On a Significantly Low Off-State Current of a Transistor Using Crystalline In—Ga—Zn-Oxide", AM-FPD'12 Digest of Technical Papers, Jul. 4, 2012, pp. 171-174.

Nomura.K et al., "Local coordination structure and electronic structure of the large electron mobility amorphous oxide semiconductor In—Ga—Zn—O: Experiment and ab initio calculations", Phys. Rev. B (Physical Review. B), Jan. 18, 2007, vol. 75, No. 3, pp. 035212-1-035212-5.

Kurosawa. Y et al., "The crystallinity of nano-crystalline IGZO thin films", Extended Abstracts (The 75th Autumn Meeting 2014), The Japan Society of Applied Physics and Related Societies, Sep. 18, 2014, pp. 21-033.

Yamazaki.S et al., "Future Possibilities of Crystalline Oxide Semiconductor, Especially C-Axis-Aligned Crystalline IGZO", SID Digest '15 : SID International Symposium Digest of Technical Papers, Jun. 1, 2015, pp. 673-676.

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10, The Japan Society of Applied Physics.

Wager.J, "Oxide TFTs: a Progress Report", Information Display, 2016, vol. 32, No. 1, pp. 16-21.

Xiao. T et al., "Metal Oxide TFT Turnkey Manufacturing Solutions for a—Si TFT Lines", SID Digest'16 : SID International Symposium Digest of Technical Papers, 2016, pp. 318-321.

Matsubayashi.D et al., "20-nm-node trench-gate-self-aligned crystalline In—Ga—Zn-Oxide FET with high frequency and low off-

(56) References Cited

OTHER PUBLICATIONS state current", IEDM 15: Technical Digest of International Electron Devices Meeting, Dec. 7, 2015, pp. 141-144.
Yamazaki.S, "Discovery of Indium Gallium Zinc Oxide (CAAC/CAC-OS) and Application to Next-generation Display Devices", 9th HTCMC & GFMAT, Jun. 27, 2016, pp. 1-55.

* cited by examiner

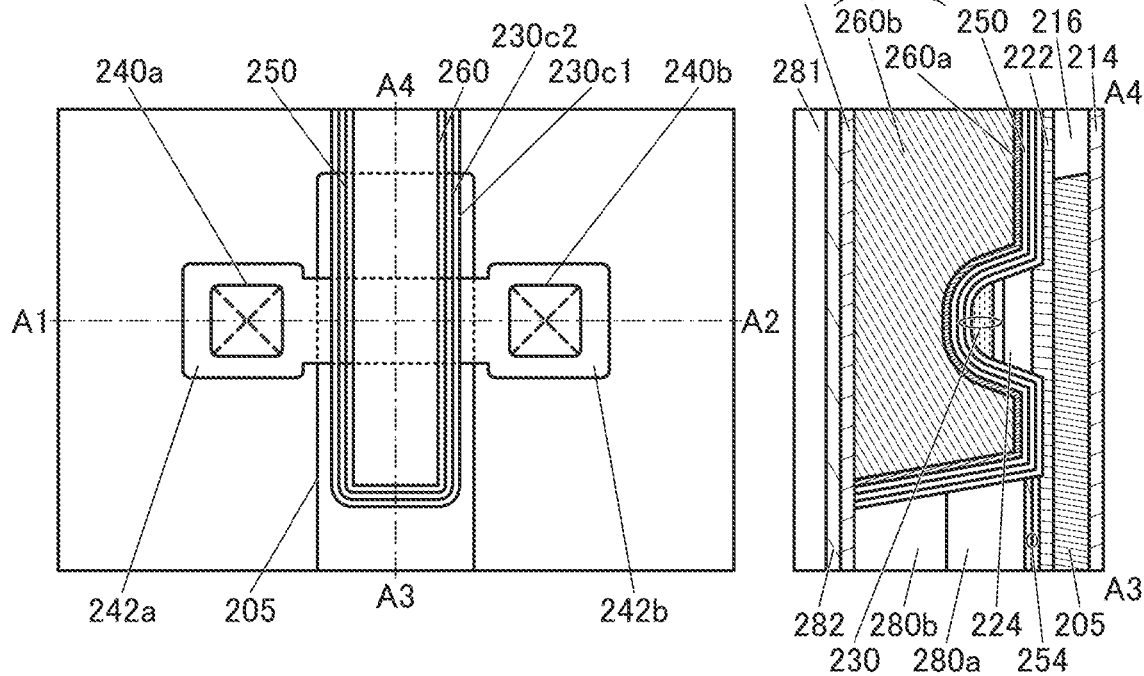
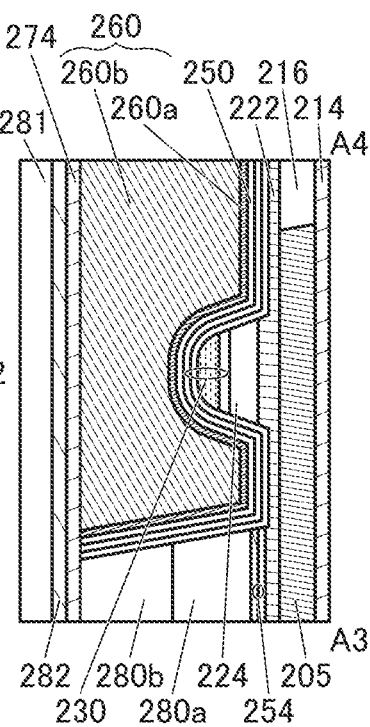
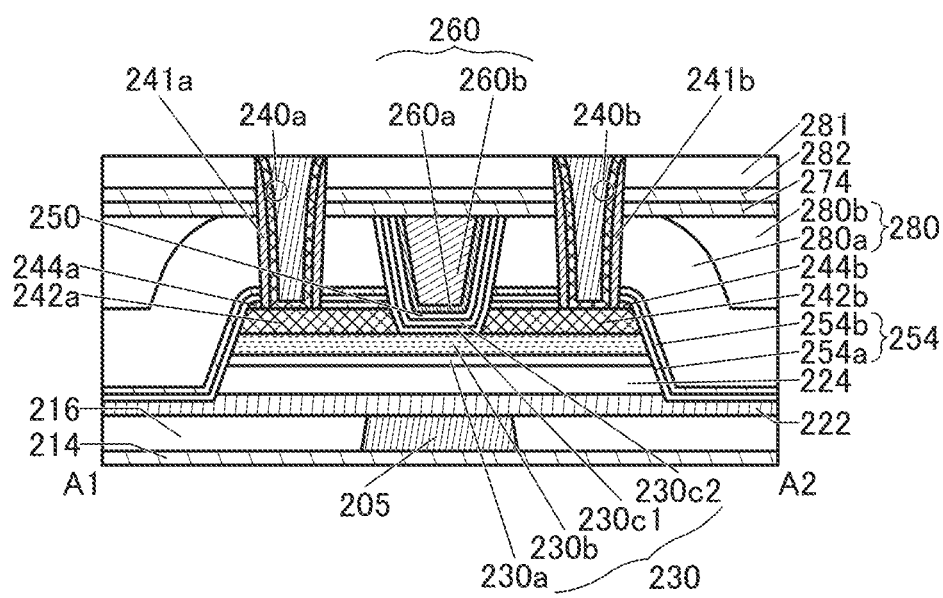

FIG. 23A
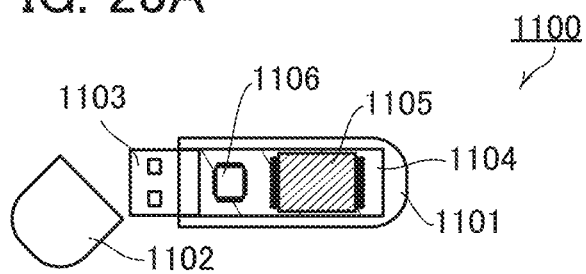
FIG. 23B
FIG. 23C
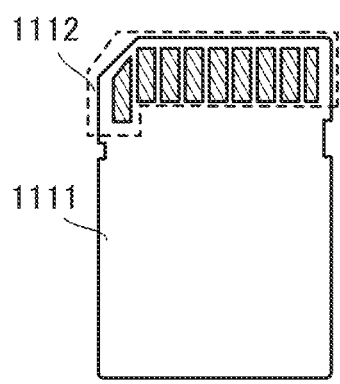
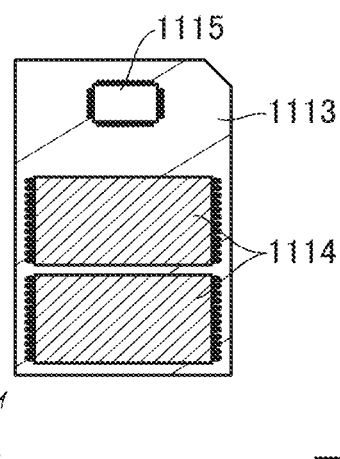
FIG. 23D
FIG. 23E
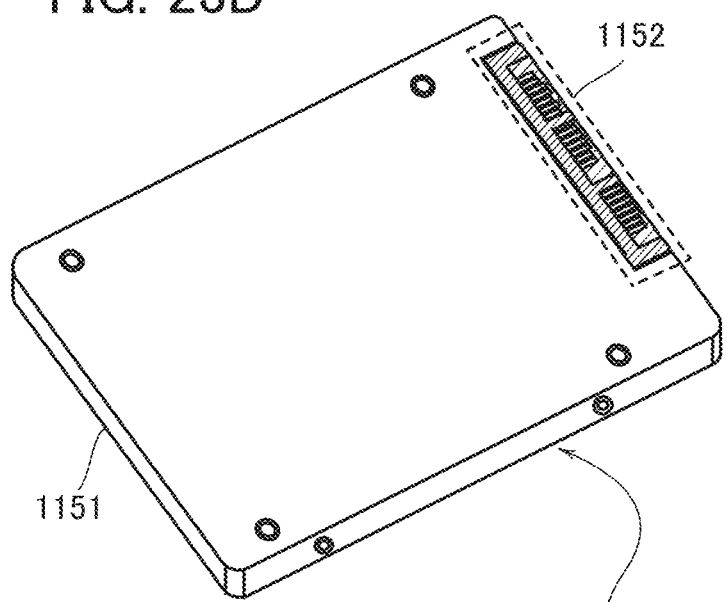
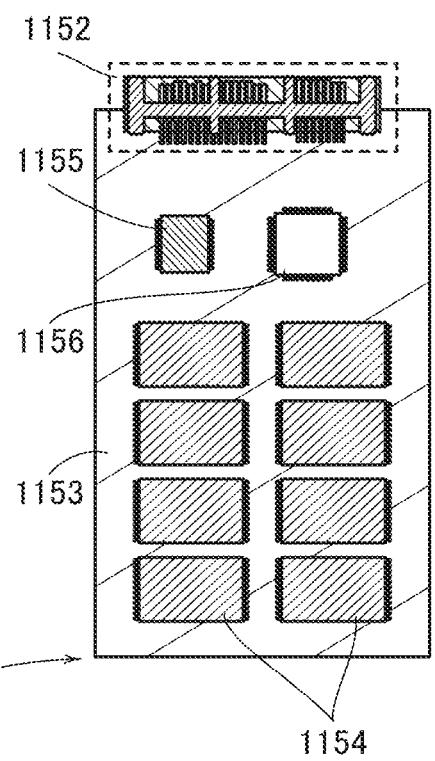

FIG. 24A
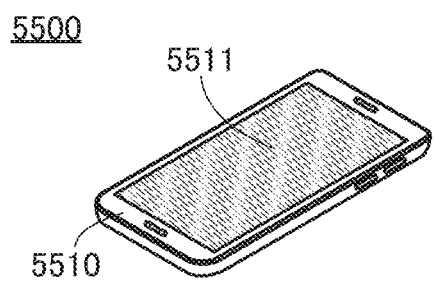
FIG. 24B
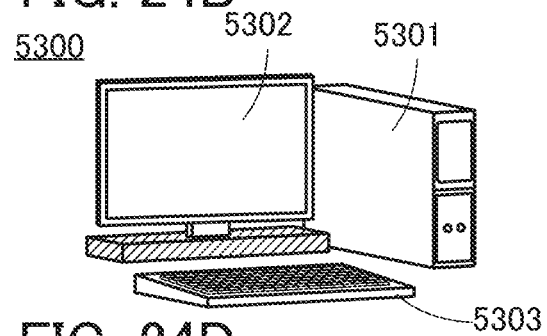
FIG. 24C
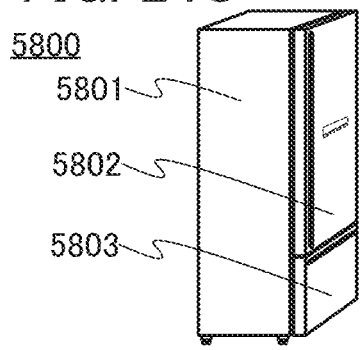
FIG. 24D
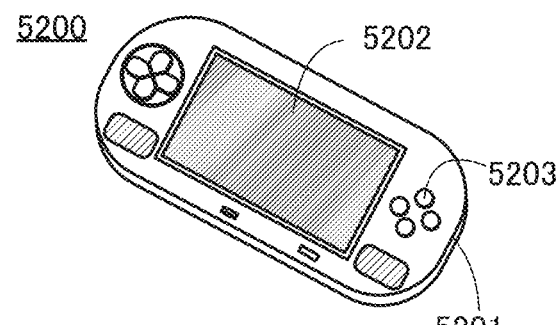
FIG. 24E1
FIG. 24E2
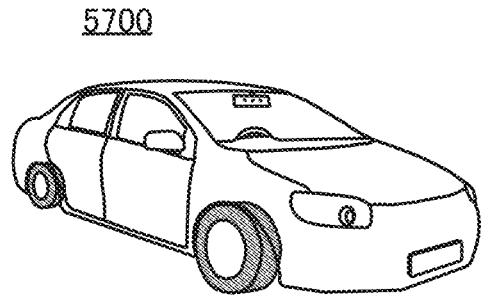
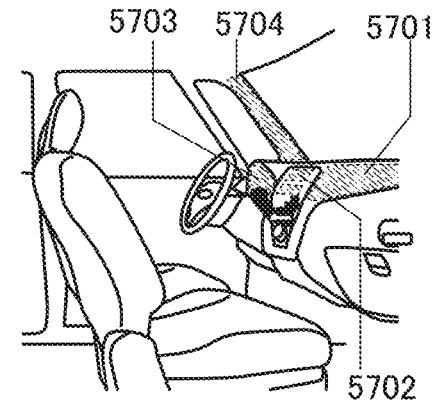
FIG. 24F
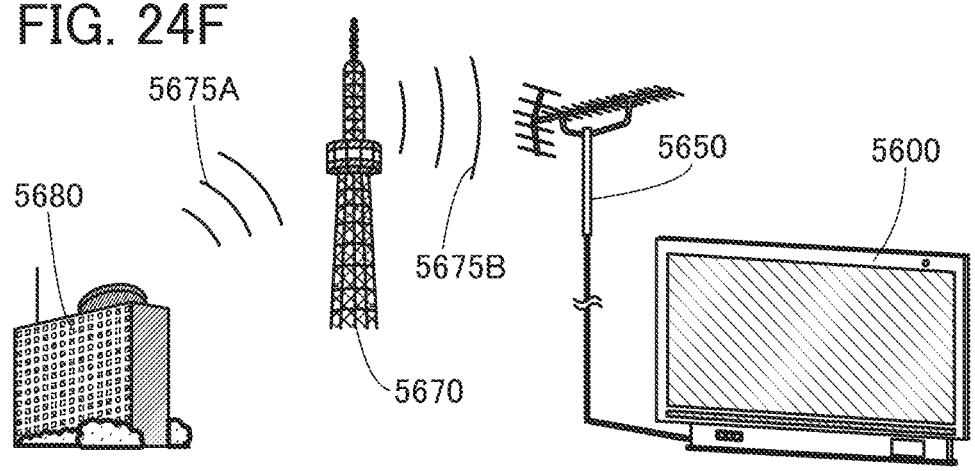

METAL OXIDE AND TRANSISTOR INCLUDING METAL OXIDE

TECHNICAL FIELD

One embodiment of the present invention relates to a metal oxide and a transistor including the metal oxide. Alternatively, one embodiment of the present invention relates to a semiconductor device, a semiconductor wafer, a module, and an electronic device.

Note that in this specification and the like, a semiconductor device refers to a device that can function by utilizing semiconductor characteristics in general. A semiconductor element such as a transistor, a semiconductor circuit, an arithmetic device, and a memory device are each one embodiment of a semiconductor device. In some cases, it can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition (composition of matter).

BACKGROUND ART

From the studies on IGZO, a CAAC (c-axis aligned crystalline) structure and an nc (nanocrystalline) structure, which are not single crystal nor amorphous, have been found in an oxide semiconductor (see Non-Patent Document 1 and Non-Patent Document 2).

Non-Patent Document 1 and Non-Patent Document 2 disclose a technique for fabricating a transistor using an oxide semiconductor having a CAAC structure.

In addition, in the late 1980s, a technique of a multi-layer structure is disclosed in which a layer with a wide energy band width and a semiconductor layer with a narrow energy band width interact with each other quantum-theoretically (see Patent Document 1).

In Patent Document 1, a channel formation region of a transistor has a super lattice structure with a multi-layer structure with repetition of semiconductor layer-insulating layer-semiconductor layer, and each of the layers is stacked so that the surface of the layer is along the carrier movement direction.

REFERENCE

Patent Document

[Patent Document 1] Japanese Published Patent Application No. S63-94680

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.

SUMMARY OF THE INVENTION

Problems to be Solved by the Invention

An object of one embodiment of the present invention is to provide a novel metal oxide. Another object of one embodiment of the present invention is to provide a novel transistor. Another object of one embodiment of the present invention is to provide a semiconductor device with high on-state current. Another object of one embodiment of the present invention is to provide a semiconductor device having high frequency characteristics. Another object of one embodiment of the present invention is to provide a semiconductor device with favorable reliability. Another object of one embodiment of the present invention is to provide a semiconductor device that can be miniaturized or highly integrated. Another object of one embodiment of the present invention is to provide a semiconductor device having favorable electrical characteristics.

Another object of one embodiment of the present invention is to provide a semiconductor device capable of retaining data for a long time. Another object of one embodiment of the present invention is to provide a semiconductor device with high-speed data writing. Another object of one embodiment of the present invention is to provide a semiconductor device capable of reducing power consumption.

Note that the descriptions of these objects do not disturb the existence of other objects. One embodiment of the present invention does not have to achieve all the objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention is a crystalline metal oxide. The crystalline metal oxide includes a first layer and a second layer. The first layer has a wider bandgap than the second layer. The first layer and the second layer form a crystal lattice. In the case where a carrier is excited in the crystalline metal oxide, the carrier is transferred through the second layer.

Another embodiment of the present invention is a crystalline metal oxide. The crystalline metal oxide includes a first layer and a second layer. The first layer has a wider bandgap than the second layer. The first layer and the second layer are each placed substantially parallel to a formation surface of the crystalline metal oxide. The first layer and the second layer form a crystal lattice. In the case where a carrier is excited in the crystalline metal oxide, the carrier is transferred through the second layer.

Another embodiment of the present invention is a crystalline metal oxide. The crystalline metal oxide includes a first layer and a second layer. The first layer has a wider bandgap than the second layer. The first layer contains an element M (M is one or more selected from Al, Ga, Y, and Sn) and Zn. The second layer contains In. The first layer and the second layer are each placed substantially parallel to a formation surface of the crystalline metal oxide. The first layer and the second layer form a crystal lattice. In the case where a carrier is excited in the crystalline metal oxide, the carrier is transferred through the second layer.

Another embodiment of the present invention is a crystalline metal oxide. The crystalline metal oxide includes a first layer and a second layer. The first layer has a wider band gap than the second layer. The first layer and the second layer are each placed substantially perpendicularly to a formation surface of the crystalline metal oxide. The first layer and the second layer form a crystal lattice. In the case where a carrier is excited in the crystal metal oxide, the carrier is transferred through the second layer.

Another embodiment of the present invention is a crystalline metal oxide. The crystalline metal oxide includes a first layer and a second layer. The first layer has a wider bandgap than the second layer. The first layer contains an element M(M is one or more selected from Al, Ga, Y, and Sn) and Zn. The second layer contains In. The first layer and the second layer are each placed substantially perpendicularly to a formation surface of the crystalline metal oxide. The first layer and the second layer form a crystal lattice. In the case where a carrier is excited in the crystalline metal oxide, the carrier is transferred through the second layer.

In the crystalline metal oxide, the distance between the first layer and the second layer is preferably less than or equal to 1 nm. In addition, the crystalline metal oxide preferably includes a hexagonal lattice point when the crystalline metal oxide is observed with TEM from the c-axis direction.

Another embodiment of the present invention is a transistor including a crystalline metal oxide, a gate, a source, and a drain. The crystalline metal oxide includes a first layer and a second layer. The first layer has a wider bandgap than the second layer. The first layer and the second layer are each placed substantially parallel to a channel length direction of the transistor. The first layer and the second layer form a crystal lattice. In the case where a voltage is applied to the gate to excite a carrier in the crystalline metal oxide, the carrier is transferred from the source to the drain through the second layer.

Another embodiment of the present invention is a transistor including a crystalline metal oxide, a gate, a source, and a drain. The crystalline metal oxide includes a first layer and a second layer. The first layer has a wider bandgap than the second layer. The first layer and the second layer are each placed substantially parallel to a formation surface of the crystalline metal oxide. The first layer and the second layer form a crystal lattice. In the case where a voltage is applied to the gate to excite a carrier in the crystalline metal oxide, the carrier is transferred from the source to the drain through the second layer.

Another embodiment of the present invention is a transistor including a crystalline metal oxide, a gate, a source, and a drain. The crystalline metal oxide includes a first layer and a second layer. The first layer has a wider bandgap than the second layer. The first layer and the second layer are each placed substantially perpendicularly to a formation surface of the crystalline metal oxide. The first layer and the second layer form a crystal lattice. In the case where a voltage is applied to the gate to excite a carrier in the crystalline metal oxide, the carrier is transferred from the source to the drain through the second layer.

Another embodiment of the present invention is a transistor including a crystalline metal oxide, agate, a source, and a drain. The crystalline metal oxide includes a first metal oxide, a second metal oxide over the first metal oxide, and a third metal oxide over the second metal oxide. The first metal oxide, the second metal oxide, and the third metal oxide each include a first layer and a second layer. The first layer has a wider bandgap than the second layer. The first layer and the second layer are each placed substantially parallel to a channel length direction of the transistor. The first layer and the second layer form a crystal lattice. In the case where a voltage is applied to the gate to excite a carrier in the crystalline metal oxide, the carrier is transferred from the source to the drain through the second layer.

Another embodiment of the present invention a transistor including a crystalline metal oxide, a gate, a source, and a drain. The crystalline metal oxide includes a first metal oxide, a second metal oxide over the first metal oxide, and a third metal oxide over the second metal oxide. The first metal oxide, the second metal oxide, and the third metal oxide each include a first layer and a second layer. The first layer has a wider bandgap than the second layer. The first layer included in the second metal oxide and the second layer included in the second metal oxide are each placed substantially parallel to a formation surface of the second metal oxide. The first layer and the second layer form a crystal lattice. In the case where a voltage is applied to the gate to excite a carrier in the crystalline metal oxide, the carrier is transferred from the source to the drain through the second layer.

In the above transistor, in a channel width direction of the transistor, it is preferable that the third metal oxide cover a top surface and a side surface of the second metal oxide; the gate cover the top surface and the side surface of the second metal oxide; and within the side surface of the second metal oxide, the c-axis direction of the third metal oxide is different from the c-axis direction of the second metal oxide.

Another embodiment of the present invention is a transistor including a crystalline metal oxide, agate, a source, and a drain. The crystalline metal oxide includes a first metal oxide, a second metal oxide over the first metal oxide, and a third metal oxide over the second metal oxide. The first metal oxide, the second metal oxide, and the third metal oxide each include a first layer and a second layer. The first layer has a wider bandgap than the second layer. The first layer included in the second metal oxide and the second layer included in the second metal oxide are each placed substantially perpendicularly to a formation surface of the second metal oxide. The first layer and the second layer form a crystal lattice. In the case where a voltage is applied to the gate to excite a carrier in the crystalline metal oxide, the carrier is transferred from the source to the drain through the second layer.

In the above transistor, it is preferable that a bottom surface of a first region not overlapping with the second metal oxide in the gate be at a lower position than a bottom surface of the second metal oxide; and a bottom surface of a second region positioned opposite to the first region with the second metal oxide sandwiched therebetween in the gate be at a lower position than the bottom surface of the second metal oxide.

The above transistor preferably includes a second gate below the first metal oxide to overlap with at least part of a region where the second metal oxide and the gate overlap with each other.

In the above transistor, one or both of a channel length and a channel width of the transistor preferably includes a region of less than or equal to 100 nm.

In the above transistor, it is preferable that the first layer contain an element M (M is one or more selected from Al, Ga, Y, and Sn) and Zn, and the second layer contain In.

Effect of the Invention

According to one embodiment of the present invention, a novel metal oxide can be provided. According to another embodiment of the present invention, a novel transistor can be provided. According to another embodiment of the present invention, a semiconductor device with high on-state current can be provided. According to another embodiment of the present invention, a semiconductor device having high frequency characteristics can be provided. According to another embodiment of the present invention, a semiconductor device with favorable reliability can be provided. According to another embodiment of the present invention, a semiconductor device that can be miniaturized or highly integrated can be provided. According to another embodiment of the present invention, a semiconductor device having favorable electrical characteristics can be provided.

According to another embodiment of the present invention, a semiconductor device capable of retaining data for a long time can be provided. According to another embodiment of the present invention, a semiconductor device with high-speed data writing can be provided. According to another embodiment of the present invention, a semiconductor device capable of reducing power consumption can be provided.

Note that the descriptions of the effects do not disturb the existence of other effects. Note that one embodiment of the present invention does not necessarily have all of these effects. Effects other than these will be apparent from the descriptions of the specification, the drawings, the claims, and the like and effects other than these can be derived from the descriptions of the specification, the drawings, the claims, and the like.

BRIEF DESCRIPTION OF THE DRAWINGS

FIGS. 15A-15C Atop view and cross-sectional views of a semiconductor device of one embodiment of the present invention.

FIGS. 23A-23E Schematic views of memory devices of one embodiment of the present invention.

FIGS. 24A-24F Diagrams illustrating electronic devices of one embodiment of the present invention.

MODE FOR CARRYING OUT THE INVENTION

Figure 1A:
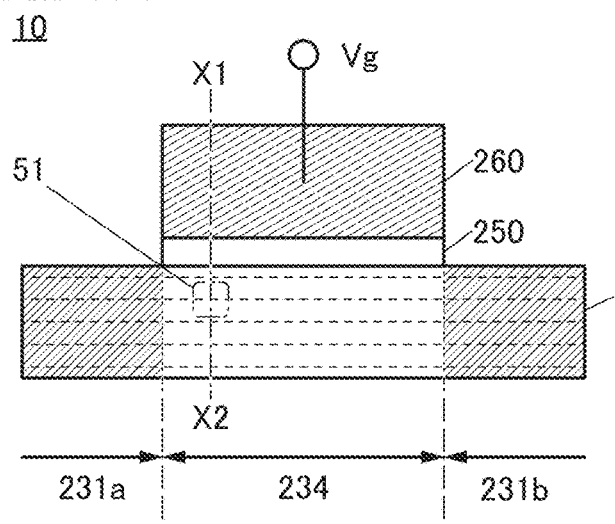
FIGS. 1A-1D A cross-sectional view of a transistor of one embodiment of the present invention, a diagram showing a band diagram, a diagram illustrating a crystal included in a metal oxide of one embodiment of the present invention, and a diagram showing the energy of the conduction band minimum of the crystal.

Hereinafter, embodiments will be described with reference to the drawings. Note that the embodiments can be implemented with many different modes, and it will be readily understood by those skilled in the art that modes and details thereof can be changed in various ways without departing from the spirit and scope thereof. Therefore, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

In a top view (also referred to as a plan view), a perspective view, or the like, particularly, some components might not be illustrated for easy understanding of the invention. Furthermore, some hidden lines and the like might be omitted.

In addition, in this specification and the like, ordinal numbers such as "first" and "second" are used for convenience and do not denote the order of steps or the stacking order of layers. Therefore, for example, description can be made by replacing "first" with "second," "third," or the like as appropriate. In addition, the ordinal numbers in this specification and the like do not correspond to the ordinal numbers which are used to specify one embodiment of the present invention in some cases.

In addition, in this specification and the like, terms for describing arrangement, such as "over" and "below," are used for convenience to describe the positional relationship between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel region refers to a region through which current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification and the like, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification and the like, the channel width is any one of the values, the maximum value, the minimum value, or the average value in a channel formation region.

Note that in this specification and the like, depending on the transistor structure, a channel width in a region where a channel is actually formed (hereinafter also referred to as an "effective channel width") is different from a channel width shown in a top view of a transistor (hereinafter also referred to as an "apparent channel width") in some cases. For example, when a gate electrode covers a side surface of a semiconductor, effective channel width is greater than apparent channel width, and its influence cannot be ignored in some cases. For example, in a miniaturized transistor having a gate electrode covering a side surface of a semiconductor, the proportion of a channel formation region formed in the side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification and the like, the simple term "channel width" refers to apparent channel width in some cases. Alternatively, in this specification and the like, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration of lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. In addition, in the case of an oxide semiconductor, oxygen vacancies are formed by entry of impurities, for example. Furthermore, in the case where the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle of greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle of greater than or equal to 80° and less than or equal to 100°. Accordingly, the case where the angle is greater than or equal to 850 and less than or equal to 950 is also included. Moreover, "substantially perpendicular" indicates a state where two straight lines are placed at an angle greater than or equal to 600 and less than or equal to 120°.

Note that in this specification and the like, a barrier film means a film having a function of inhibiting transmission of oxygen and impurities such as water and hydrogen, and the barrier film having conductivity is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, when OS transistor is mentioned, the OS transistor can also be called a transistor including an oxide or an oxide semiconductor.

In addition, in this specification and the like, "normally off" means that current per micrometer of channel width flowing through a transistor when a potential is not applied to a gate or a ground potential is applied to the gate is lower than or equal to $1 \times 10^{-20}$ A at room temperature, lower than or equal to $1 \times 10^{-18}$ A at 85° C., or lower than or equal to $1 \times 10^{-16}$ A at 125° C.

Embodiment 1

In this embodiment, a metal oxide that is one embodiment of the present invention and a transistor including the metal oxide will be described with reference to FIG. 1 to FIG. 10.

Structure Example of Transistor

FIG. 1(A) is a cross-sectional view of a transistor 10 of one embodiment of the present invention in the channel length direction.

As illustrated in FIG. 1(A), the transistor 10 includes an oxide 230 placed over a substrate (not illustrated), an insulator 250 placed over the oxide 230, and a conductor 260 placed over the insulator 250. The oxide 230 includes a region 234 functioning as a region where a channel is formed (hereinafter also referred to as a channel formation region) of the transistor 10 and a region 231 (a region 231a and a region 231b) functioning as a source region or a drain region. The insulator 250 functions as a gate insulating film. The conductor 260 functions as a gate electrode.

Figure 1B:
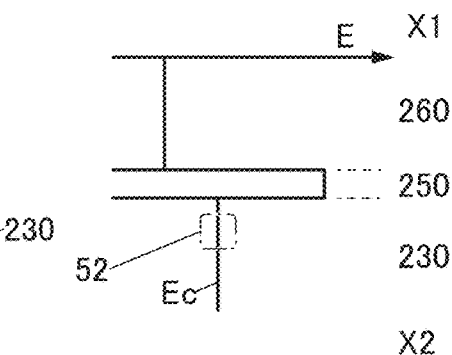

FIG. 1(B) is a model of a band diagram of the transistor illustrated in FIG. 1(A) taken along dashed-dotted line indicated by X1-X2. In FIG. 1(B), the k-space is ignored. Note that FIG. 1(B) shows a state in which voltage is not applied between the gate and the source. The solid line positioned in the conductor 260 represents the position of the Fermi level of the conductor 260. The solid line positioned in the insulator 250 represents the position of the conduction band minimum of the insulator 250. The solid line positioned in the oxide 230 represents the position of the conduction band minimum of the oxide 230.

The resistance of the channel portion of the transistor 10 can be controlled by a potential applied to the gate. That is, conduction (the on state of the transistor) or non-conduction (the off state of the transistor) between the source and the drain can be controlled by a potential applied to the gate.

In the transistor 10, a metal oxide functioning as a semiconductor is preferably used in the oxide 230 including the channel formation region. The oxide semiconductor is preferable because a transistor including the oxide semiconductor can have more favorable switching characteristics and extremely lower off-state current than a transistor including a semiconductor made of silicon or the like.

The transistor using an oxide semiconductor in a channel formation region has an extremely low leakage current (off-state current) in a non-conduction state; thus, a semiconductor device with low power consumption can be provided. An oxide semiconductor can be deposited by a sputtering method or the like, and thus can be used for a transistor included in a highly integrated semiconductor device.

A transistor using an oxide semiconductor is likely to have its electrical characteristics changed by impurities and oxygen vacancies exist in a channel formation region of the oxide semiconductor, which might affect the reliability. Moreover, when the channel formation region of the oxide semiconductor includes oxygen vacancies, the transistor tends to have normally-on characteristics. Thus, it is preferable that oxygen vacancies in the channel formation region be reduced as much as possible. For example, oxygen may be supplied to the oxide 230 through the insulator 250 or the like to supplement the oxygen vacancies. Accordingly, a transistor with reduced variation in electrical characteristics, stable electrical characteristics, and improved reliability can be provided.

Furthermore, a metal oxide with a low carrier density is preferably used as the oxide 230. A highly purified intrinsic or substantially highly purified intrinsic metal oxide has few carrier generation sources and thus can have a low carrier density. The highly purified intrinsic or substantially highly purified intrinsic metal oxide has a low density of defect states and accordingly has a low density of trap states in some cases.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum (Al), gallium (Ga), yttrium (Y), or tin (Sn) is preferably used for the element M. Furthermore, as the oxide 230, an In—Ga oxide or an In—Zn oxide may be used.

In addition, a conductive film functioning as a source electrode or a drain electrode may be provided to be over and in contact with the oxide 230. At this time, in the case where an element included in the conductive film has a function of absorbing oxygen in the oxide 230, a low-resistance region is partly formed between the oxide 230 and the conductive film or in the vicinity of the surface of the oxide 230 in some cases. In this case, in the low-resistance region, an impurity (hydrogen, nitrogen, a metal element, or the like) that has entered an oxygen vacancy serves as a donor, so that the carrier density increases in some cases. Furthermore, at least part of the low-resistance region is included in the region 231 functioning as the source region or the drain region.

Oxide semiconductors (metal oxides) can be classified into a single crystal oxide semiconductor and a non-single-crystal oxide semiconductor. Examples of a non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

For a channel formation region of a transistor, it is preferable to use a metal oxide that increases the on-state current of the transistor. To increase the on-state current of the transistor, the mobility of the metal oxide used for the transistor is preferably increased. To increase the mobility of the metal oxide, it is necessary to improve the carrier transfer or reduce scattering sources that affect the carrier transfer.

Thus, it is preferable to use a crystalline metal oxide for the oxide 230 including the channel formation region. It is also preferable that the crystal included in the metal oxide include a first layer and a second layer and have a crystal structure in which the first layer and the second layer are alternately stacked. It is also preferable that the first layer have a wider bandgap than the second layer. Note that in this specification and the like, the phrase "the first layer has a wide gap" is used in some cases to describe the first layer has a wider bandgap than the second layer. In addition, the phrase "the second layer has a narrow gap" is used in some cases to describe the second layer has a narrower bandgap than the first layer. That is, the crystalline metal oxide preferably has a crystal in which the second layer having a narrow gap is sandwiched between the first layers having a wide gap.

The first layer and the second layer included in the oxide 230 are each placed substantially parallel to the channel length direction of the transistor 10. In addition, it can be said that the extending directions of the first layer and the second layer included in the oxide 230 are each substantially parallel to the channel length direction of the transistor 10. Furthermore, it is preferable that the first layer and the second layer included in the oxide 230 be each placed substantially parallel to the formation surface of the oxide 230.

Examples of the crystalline metal oxide include a single crystal oxide semiconductor and a CAAC-OS. The crystalline metal oxide can improve the carrier transfer. Thus, the mobility of the metal oxide is increased, the on-state current of a transistor using the metal oxide is increased, and accordingly the electrical characteristics of the transistor can be increased.

[Carrier Transfer Model]

A carrier transfer model of the crystalline metal oxide is described below. Here, a CAAC-OS is used as an example of the crystalline metal oxide. The metal oxide is a metal oxide including indium, the element M, zinc, and oxygen (also referred to as an In-M-Zn oxide).

The CAAC-OS has c-axis alignment, a plurality of nanocrystals (crystal regions each of which has a maximum diameter of less than 10 nm) are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

In the case where the CAAC-OS is seen from the c-axis direction, the nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Note that the hexagonal shape in the crystalline metal oxide can be confirmed in an image observed with a transmission electron microscope (TEM) from the c-axis direction of the metal oxide.

Figure 1C:
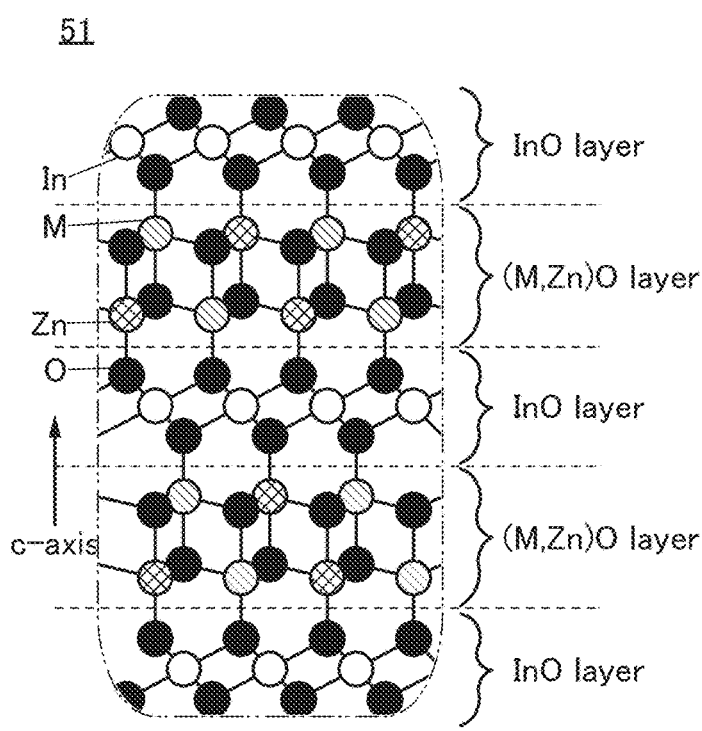

FIG. 1(C) illustrates an enlarged view of a region 51 of the oxide 230 illustrated in FIG. 1(A). Here, the oxide 230 is an In-M-Zn oxide having a CAAC structure. In addition, the element M is Ga and the oxide 230 has a composition of In:M:Zn=1:1:1 [atomic ratio]. In FIG. 1(C), the c-axis direction of the In-M-Zn oxide having the CAAC structure is the vertical direction of the sheet, and the a-b plane direction is the horizontal direction and the normal direction of the sheet. Although FIG. 1(C) illustrates the In-M-Zn oxide having a composition of In:M:Zn=1:1:1 [atomic ratio] as the oxide 230, the oxide 230 is not limited thereto. The oxide 230 may be any metal oxide having crystallinity, for example, an In-M-Zn oxide that is represented by a composition formula of $In_{(1+\alpha)}M_{(1-\alpha)}O_3(ZnO)_m$ ($\alpha$ is a real number of 0 or more and 1 or less and m is a real number of 0 or more) and has a CAAC-structure or a single crystal structure.

As illustrated in FIG. 1(C), the In-M-Zn oxide having the CAAC-OS structure tends to have a layered crystal structure (also referred to as a layered crystal or a layered structure) in which a layer containing indium and oxygen (hereinafter an InO layer) and a layer containing the element M, zinc, and oxygen (hereinafter an (M,Zn)O layer) are stacked. Note that in this specification and the like, the (M,Zn)O layer refers to a layer that contains the element M, zinc, and oxygen and is positioned between an InO layer and another InO layer adjacent to the InO layer in the c-axis direction. In addition, since indium, the element M, and zinc can be replaced with each other, part of indium is included in the (M,Zn)O layer in some cases. In addition, part of the element M or part of zinc is included in the InO layer in some cases.

Note that in this specification and the like, the structure in which the first layer and the second layer are alternately stacked is referred to as a crystal structure, and in the case where a unit cell of the crystal structure can be represented by a space group, the stacked-layer structure is referred to as a crystal lattice in some cases. For example, in the case of the In-M-Zn oxide having the CAAC structure, the first layer is the (M,Zn)O layer and the second layer is the InO layer. In addition, the crystal lattice is not necessarily formed of two layers, and may be formed of three or more layers.

As the distance between the first layer and the second layer becomes larger, interaction between the first layer and the second layer becomes weaker, leading to an unstable structure of the crystal lattice. Thus, the distance is preferably close to the distance between atoms included in the crystal lattice. For example, the distance between the first layer and the second layer is preferably less than or equal to 1 nm, further preferably less than or equal to 0.7 nm, still further preferably less than or equal to 0.5 nm. This enables the crystal lattice formed of the first layer and the second layer to have a stable structure.

As illustrated in FIG. 1(C), the c-axis of the crystal included in the CAAC-OS is aligned in the normal direction with respect to the formation surface or film surface of the oxide 230. Thus, in the cross-sectional view of the transistor 10, the c-axis direction of the crystal included in the CAAC-OS is the vertical direction of the sheet. In addition, the a-b plane of the crystal included in the CAAC-OS is substantially parallel to the formation surface or film surface of the oxide 230. In other words, the InO layer and the (M,Zn)O layer are each placed substantially parallel to the formation surface of the oxide 230. Thus, the a-b plane of the crystal included in the CAAC-OS is parallel to the horizontal direction of the sheet and the normal direction of the sheet.

Figure 1D:
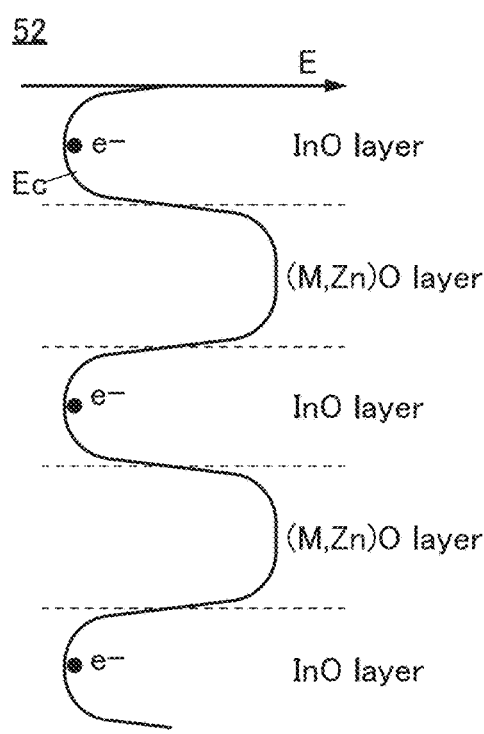

Here, FIG. 1(D) illustrates an enlarged view of a region 52 in the conduction band minimum of the oxide 230 in the band diagram model shown in FIG. 1(B). In FIG. 1(D), the k-space is ignored. Note that the region 52 corresponds to the region 51 in the real space.

The InO layer and the (M,Zn)O layer differ in the ratio of constituent elements included in the layers. Thus, the InO layer and the (M,Zn)O layer differ in the bandgap. Alternatively, the InO layer and the (M,Zn)O layer differ in the electron affinity. Alternatively, the InO layer and the (M,Zn)O layer differ in the difference between the energy of the vacuum level and energy Ec of the conduction band minimum.

It is known that an oxide of gallium has a wider bandgap than an oxide of indium. Thus, in the case where the element M is Ga, the bandgap of the (M,Zn)O layer is estimated to be wider than the bandgap of the InO layer. In addition, the electron affinity of the (M,Zn)O layer is estimated to be smaller than the electron affinity of the InO layer. In other words, it is estimated that the difference between the energy of the vacuum level and the energy of the conduction band minimum of the InO layer is larger than the difference between the energy of the vacuum level and the energy of the conduction band minimum of the (M,Zn)O layer. Therefore, the conduction band minimum of the InO layer is probably positioned at a lower position than the conduction band minimum of the (M,Zn)O layer. Note that the (M,Zn)O layer has a wider bandgap than the InO layer, and thus the expression "the (M,Zn)O layer has a wide gap" is used in some cases. In addition, the InO layer has a narrower bandgap than the (M,Zn)O layer, and thus the expression "the InO layer has a narrow gap" is used in some cases.

Furthermore, since the InO layer and the (M,Zn)O layer form a crystal lattice, it is probable that the conduction band minimum of the InO layer and the conduction band minimum of the (M,Zn)O layer are continuously changed at the boundary between the InO layer and the (M,Zn)O layer. Thus, as illustrated in FIG. 1(D), it is probable that the conduction band minimum of the oxide 230 is a level at which the conduction band minimum of the InO layer and the conduction band minimum of the (M,Zn)O layer repeatedly appear. Accordingly, in the band diagram shown in FIG. 1(D), the vicinity of the conduction band minimum of the (M,Zn)O layer is a projecting portion, and the vicinity of the conduction band minimum of the InO layer is a depressed portion. Note that since the InO layer and the (M,Zn)O layer are formed in the a-b plane direction, the conduction band minimum in the a-b plane direction is constant. Therefore, carriers are likely to be transferred along the a-b plane direction of the InO layer with lower conduction band minimum.

Carriers injected from the source concentrate in the InO layer that has a narrow gap and is sandwiched between the (M,Zn)O layers having a wide gap. Furthermore, the carrier transfer direction, that is, the direction from the source to the drain in FIG. 1(C) and FIG. 1(D) substantially corresponds to the a-b plane direction of the InO layer (the horizontal direction of the sheet and the normal direction of the sheet). From the above, the InO layer is a main carrier transfer path. That is, in the case where carriers are excited in the crystalline metal oxide, the carriers are transferred through the InO layer.

Note that carriers flow from the source to the drain through the channel formation region. To increase the carrier transfer speed, it is preferable to provide a channel formation region through which carriers are likely to flow in the channel length direction. Furthermore, as described above, in the crystal included in the In-M-Zn oxide, carriers are likely to flow in the a-b plane direction. Thus, the a-b plane of the crystal included in the In-M-Zn oxide is preferably aligned in the carrier flow direction.

It is also preferable that the layered structure extend to the region 231 included in the oxide 230. This can facilitate the carrier transfer between the region 231a and the region 231b through the channel formation region.

Electrons probably move toward the a-b plane direction through quantization. Electrons included in the InO layer are blocked by the (M,Zn)O layer, and the electrons are likely to move in the a-b plane direction of the InO layer due to no lattice scattering. That is, the mobility in the a-b plane direction is estimated to be higher than that in the c-axis direction.

The CAAC-OS is a metal oxide with high crystallinity. Meanwhile, in the CAAC-OS, a clear crystal grain boundary is difficult to observe; thus, the conduction band minimum with a low density of trap states due to the crystal grain boundary probably extends in the a-b plane direction (in this specification and the like, also referred to as level increase). Accordingly, it can be said that a decrease in electron mobility is less likely to occur. Furthermore, entry of impurities, formation of defects, or the like might decrease the crystallinity of a metal oxide, which means that the CAAC-OS is a metal oxide including few impurities and defects (e.g., oxygen vacancies). Thus, a metal oxide including a CAAC-OS is physically stable. Therefore, the metal oxide including a CAAC-OS is resistant to heat and has high reliability.

The mobility of the metal oxide tends to increase with increasing temperature. This is probably due to the lattice scattering. The lattice vibration of atoms due to heat and the carrier transfer are described with reference to FIG. 2 and FIG. 3.

Figure 2A:
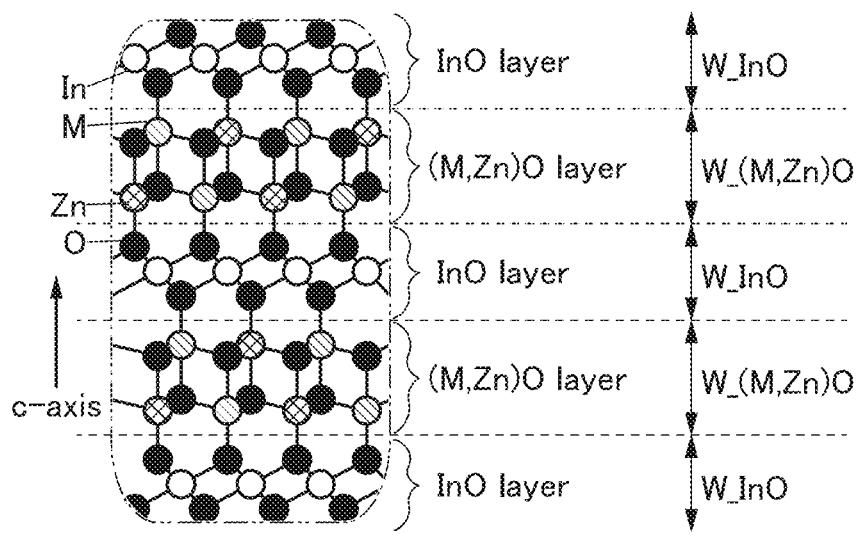
FIGS. 2A-2C A diagram illustrating a layer structure of a crystal of a metal oxide and diagrams showing the lattice vibration of atoms and carrier transfer in the metal oxide.

FIG. 2(A) is a crystal structure of an In-M-Zn oxide having a CAAC structure. In FIG. 2(A), W_(M,Zn)O represents the thickness of the (M,Zn)O layer in the c-axis direction. In addition, W_(M,Zn)O can be regarded as the width of the projecting portion of the conduction band minimum of the (M,Zn)O layer in the band diagram shown in FIG. 1(D). W_InO represents the thickness of the InO layer in the c-axis direction. In addition, W_InO can be regarded as a width of the depressed portion of the conduction band minimum of the InO layer in the band diagram shown in FIG. 1(D).

Figure 2B:
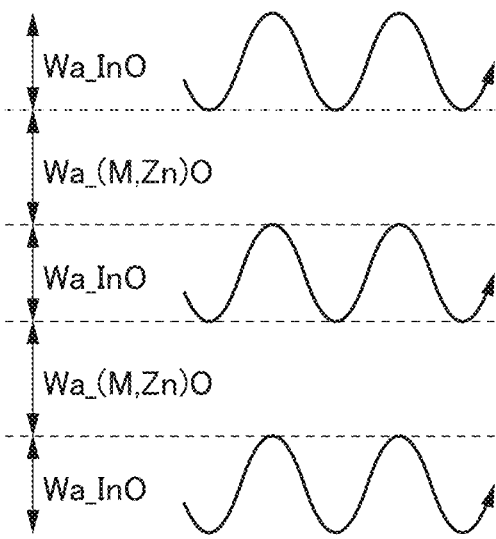
Figure 2C:
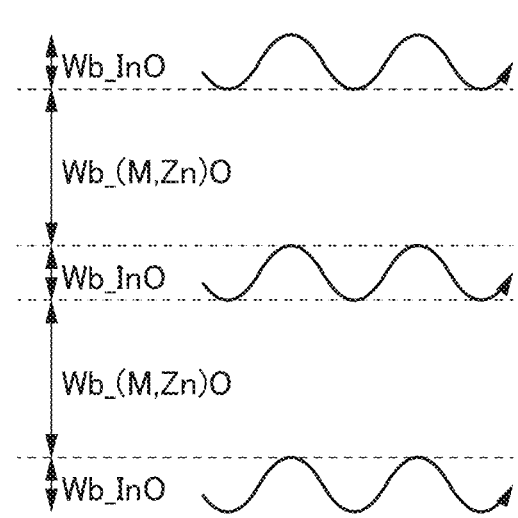

In addition, Wa_(M,Zn)O shown in FIG. 2(B) represents the thickness of the (M,Zn)O layer in the c-axis direction in the case where a temperature T is substantially the same as a reference temperature (e.g., room temperature (R.T.)), and Wa_InO shown in FIG. 2(B) represents the thickness of the InO layer in the c-axis direction in the case where the temperature T is substantially the same as the reference temperature (e.g., room temperature (R.T.)). In addition, Wb_(M,Zn)O shown in FIG. 2(C) represents the thickness of the (M,Zn)O layer in the c-axis direction in the case where the temperature T is higher than the reference temperature (e.g., room temperature (R.T.)), and Wb_InO shown in FIG. 2(C) represents the thickness of the InO layer in the c-axis direction in the case where the temperature T is higher than the reference temperature (e.g., room temperature (R.T.)). In FIG. 2(B) and FIG. 2(C), the wave lines shown in the right sides of the drawings show states of carrier transfer through the InO layer.

The lattice vibration of atoms due to heat is smaller as the mass number of the atoms is larger. In the case where the metal oxide is an In—Ga—Zn oxide, as for the mass number of atoms, In is the largest, Ga and Zn are the second largest, and O is the smallest. Thus, the lattice vibration of Ga and Zn due to heat is larger than that of In. Thus, as the temperature increases, atoms included in a (Ga,Zn)O layer vibrate more largely than in the InO layer. Furthermore, compared to the bond between atoms in the (Ga,Zn)O layer, the bond between an atom in the InO layer and that in the (Ga,Zn)O layer is weak; thus, the lattice vibration of Ga and Zn in the c-axis direction is larger than that in the a-b plane direction. Thus, Wb_(Ga,Zn) is larger than Wa_(Ga,Zn)O (see FIG. 2(C)). On the assumption that the lattice constant of the layered crystal in the c-axis direction does not change depending on temperature, when the Wb_(Ga,Zn)O layer becomes large, Wb_InO becomes relatively small (see FIG. 2(C)). That is, as the temperature increases, the thickness of the InO layer in the c-axis direction decreases.

Figure 3A:
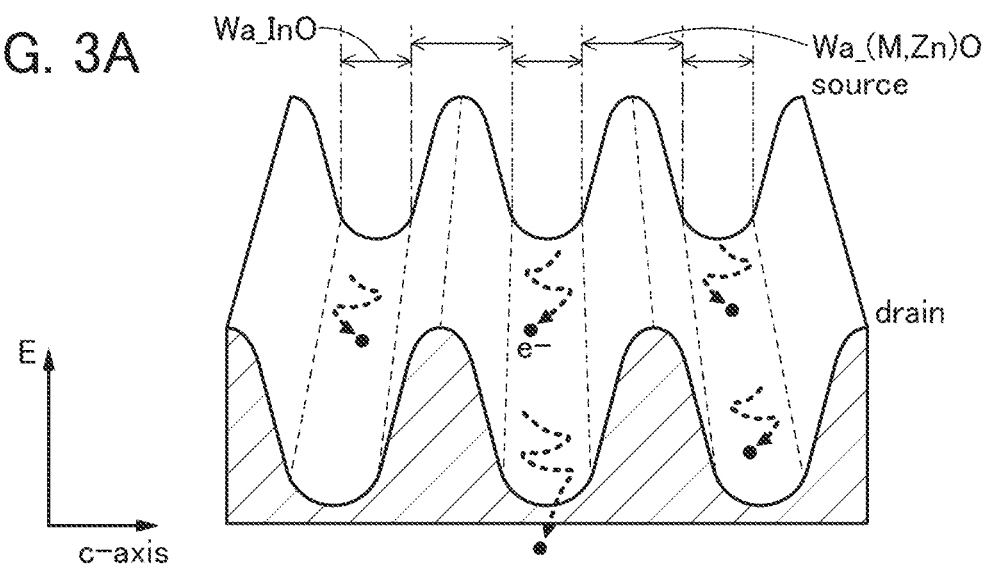
FIGS. 3A-3C Diagrams showing the lattice vibration of atoms and carrier transfer in a metal oxide.
Figure 3B:
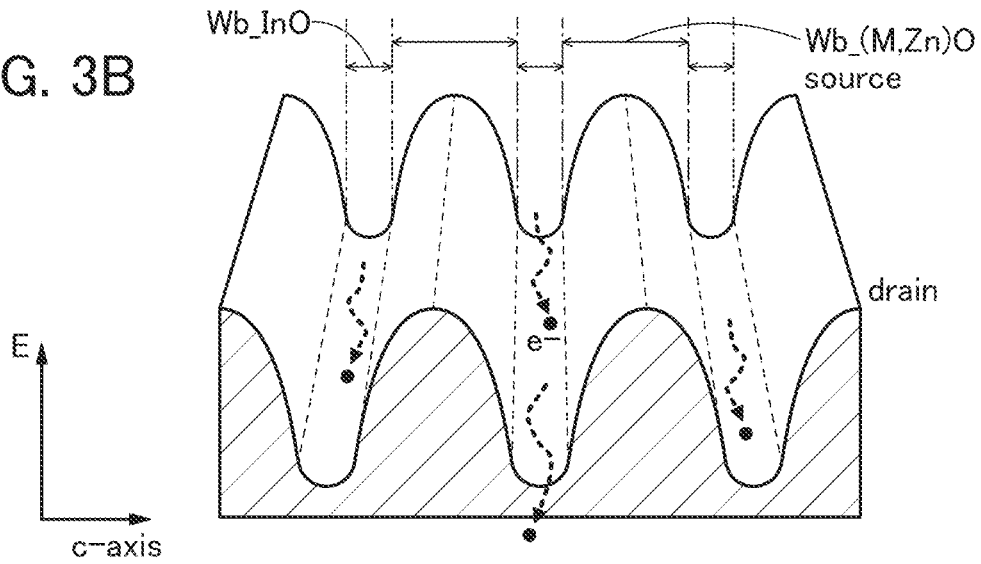
Figure 3C:
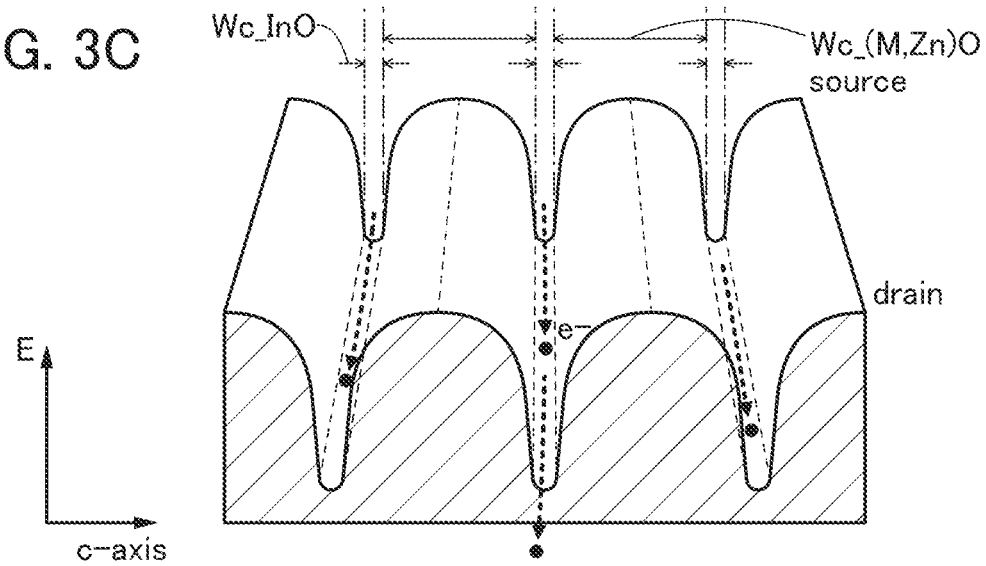

FIG. 3(A) to FIG. 3(C) are band diagrams and diagrams schematically illustrating states of carrier transfer through the InO layer in the crystal structure illustrated in FIG. 2(A). In FIG. 3(A) to FIG. 3(C), the upper side of the sheet corresponds to the source, the lower side of the sheet corresponds to the drain, the horizontal direction of the sheet corresponds to the c-axis direction of the CAAC-OS, and the wavy curved surfaces in the diagrams represent the conduction band minimums of the CAAC-OS. In addition, in FIG. 3(A) to FIG. 3(C), black circles represent carriers (e.g., electrons) and dotted lines represent schematic carrier paths.

FIG. 3(A) shows a model at a temperature Ta that is substantially the same as a reference temperature (e.g., room temperature (R.T.)), Wa_(M,Zn)O is the width of the projecting portion of the conduction band minimum of the (M,Zn)O layer, and Wa_InO is the width of the depressed portion of the conduction band minimum of the InO layer. FIG. 3(B) shows a model at a temperature Tb that is substantially the same as a reference temperature (e.g., room temperature (R.T.)), Wb_(M,Zn)O is the width of the projecting portion of the conduction band minimum of the (M,Zn)O layer, and Wb_InO is the width of the depressed portion of the conduction band minimum of the InO layer.

FIG. 3(C) shows a model at a temperature Tc that is higher than the temperature Tb, Wc_(M,Zn)O is the width of the projecting portion of the conduction band minimum of the (M,Zn)O layer, and Wc_InO is the width of the depressed portion of the conduction band minimum of the InO layer.

As described above, as the temperature increases, atoms included in the (Ga,Zn)O layer vibrate more largely than in the InO layer. Furthermore, compared to the bond between atoms in the (Ga,Zn)O layer, a bond between an atom in the InO layer and that in the (Ga,Zn)O layer is weak; thus, the lattice vibration of Ga and Zn in the c-axis direction is larger than that in the a-b plane direction. Thus, as shown in FIGS. 3(A) to 3(C), Wc_(Ga,Zn)O>Wb_(Ga,Zn)O>Wa_(Ga,Zn)O is satisfied. On the assumption that the lattice constant of the layered crystal in the c-axis direction does not change depending on temperature, when W_(Ga,Zn)O becomes large, W_InO becomes relatively small. Thus, as shown in FIGS. 3(A) to 3(C), Wa_InO>Wb_InO>Wc_InO is satisfied. That is, as the temperature increases, the thickness of the InO layer in the c-axis direction in the band diagram decreases.

As described above, the InO layer is a main carrier transfer path. As the temperature increases, the thickness of the InO layer in the c-axis direction in the band diagram decreases; thus, carriers are transferred along the a-b plane of the InO layer more planarly. Thus, carriers are transferred from the source to the drain more linearly, leading to higher mobility of the metal oxide. Thus, when a metal oxide is used for a channel formation region of a transistor, the frequency characteristics are improved as the temperature increases.

As described above, carriers are transferred along the a-b plane of the InO layer more planarly as the temperature increases. In other words, it is probable that carrier scattering (what is called a phonon scattering) due to lattice vibration is less likely to occur in the crystalline metal oxide. When the channel length direction of the transistor is reduced (also referred to as a channel shortening), a drain electric field is intensified and the drift velocity of carriers is increased. The improvement in the drift velocity due to the channel shortening is suppressed by the phonon scattering. However, since the phonon scattering is less likely to occur in the crystalline metal oxide, the improvement in the drift velocity due to the channel shortening is less likely to be suppressed. In other words, it is assumed that the short-channel effect is less likely to appear in the crystalline metal oxide. Thus, the transistor using the crystalline metal oxide in its channel formation region can be miniaturized. For example, one or both of the channel length and the channel width of the transistor can be a region of less than or equal to 100 nm.

In this specification and the like, the carrier transfer along the a-b plane of the second layer that has a narrow gap and is sandwiched between the first layers having a wide gap is referred to as a multi-atomic layers transport (MALT) in some cases. Note that the material in which MALT occurs is not limited to a semiconductor material in which the second layer having a narrow gap is sandwiched between the first layers having a wide gap. The first layer and the second layer may be formed of the same element, and carriers may be transferred through one of the first layer and the second layer selectively or preferentially. Examples of the material in which MALT occurs include a graphite that has a stacked-layer structure of graphene.

Modification Example 1 of Transistor

Figure 4:
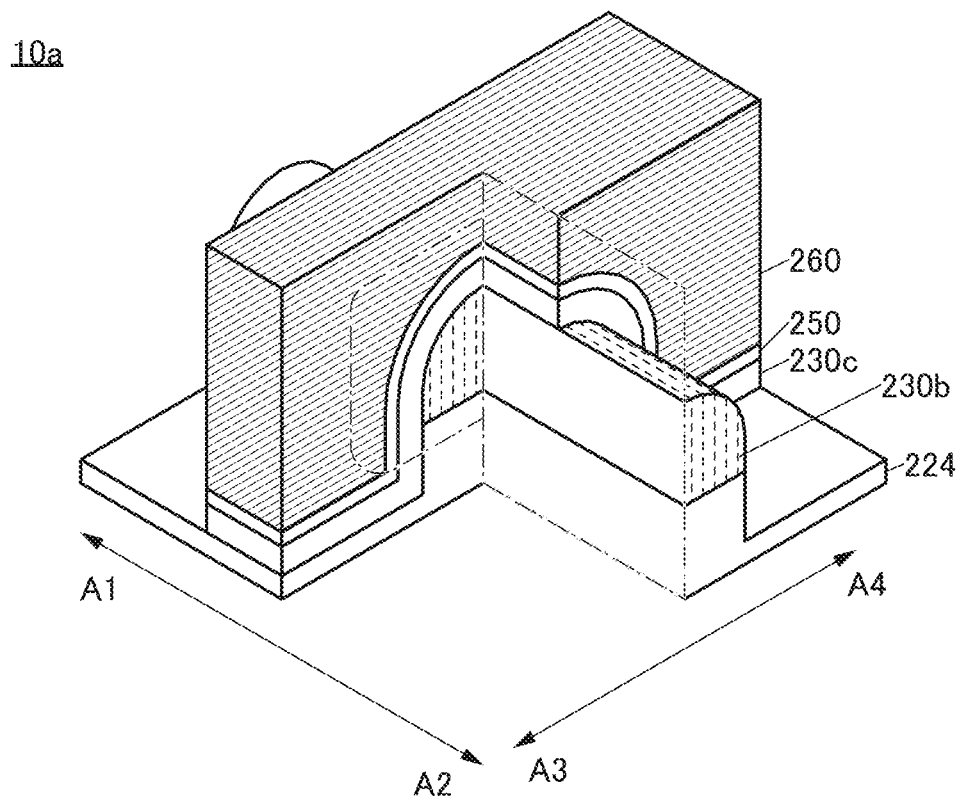
FIG. 4 A perspective view of a transistor of one embodiment of the present invention.
Figure 5A:
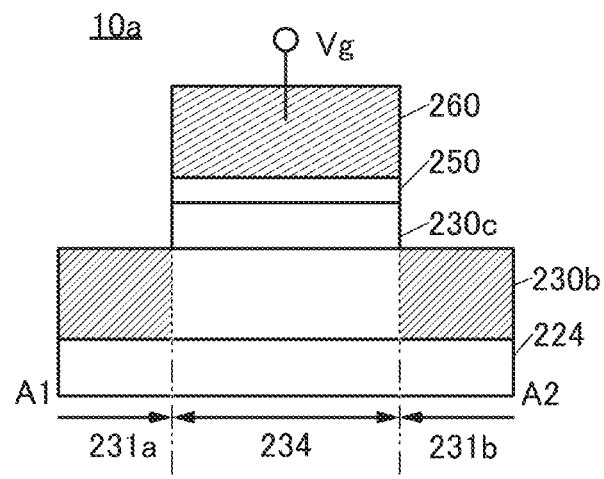
FIGS. 5A-5C Cross-sectional views of a transistor of one embodiment of the present invention and a diagram illustrating a crystal included in a metal oxide of one embodiment of the present invention.
Figure 5B:
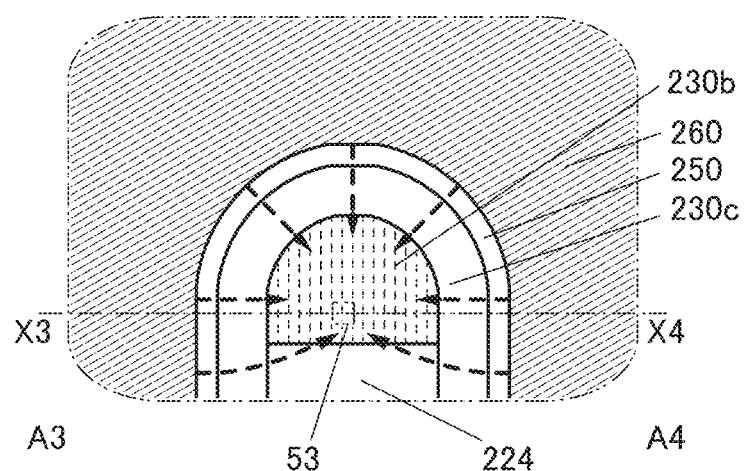

FIG. 4 is a perspective view of a transistor 10a of one embodiment of the present invention. Note that for simplification of the drawing, some components are not illustrated in the perspective view of FIG. 4. FIG. 5(A) and FIG. 5(B) are cross-sectional views of the transistor 10a of one embodiment of the present invention. FIG. 5(A) is a cross-sectional view of the transistor 10a in a direction indicated by A1-A2 in FIG. 4, and is also a cross-sectional view of the transistor 10a in the channel length direction. FIG. 5(B) is a cross-sectional view of the transistor 10a in a direction indicated by A3-A4 in FIG. 4, and is also a cross-sectional view of the transistor 10a in the channel width direction.

As illustrated in FIG. 5(A), the transistor 10a includes an insulator 224 placed over a substrate (not illustrated), an oxide 230b placed over the insulator 224, an oxide 230c placed over the oxide 230b, the insulator 250 placed over the oxide 230c, and the conductor 260 placed over the insulator 250.

As illustrated in FIG. 5(B), in the channel width direction of the transistor 10a, the oxide 230c is provided to cover a top surface and a side surface of the oxide 230b. The insulator 250 is provided to cover the top surface and the side surface of the oxide 230b with the oxide 230c therebetween. The conductor 260 is provided to cover the top surface and the side surface of the oxide 230b with the oxide 230c and the insulator 250 therebetween.

The insulator 250 functions as a gate insulating film. The conductor 260 functions as a gate electrode. The oxide 230b includes the region 234 functioning as a channel formation region of the transistor 10a and the region 231 (the region 231a and the region 231b) functioning as a source region or a drain region. The channel formation region may be formed in the oxide 230c.

As illustrated in FIG. 5(B), the transistor 10a is different from the transistor 10 in that the first layer and the second layer included in the oxide 230b are placed substantially perpendicularly to the formation surface of the oxide 230b (a top surface of the insulator 224). In addition, it can be said that the transistor 10a is different from the transistor 10 in that the arrangement direction of the first layer and the second layer included in the oxide 230b of the transistor 10a is parallel to the formation surface of the oxide 230b. Note that also in the transistor 10a, the first layer and the second layer included in the oxide 230b are substantially parallel to the channel length direction of the transistor 10. Note that the oxide 230b of the transistor 10a has a structure similar to that of the oxide 230 of the transistor 10 except that the first layer and the second layer are each placed substantially perpendicularly to the formation surface of the oxide 230b.

Figure 5C:
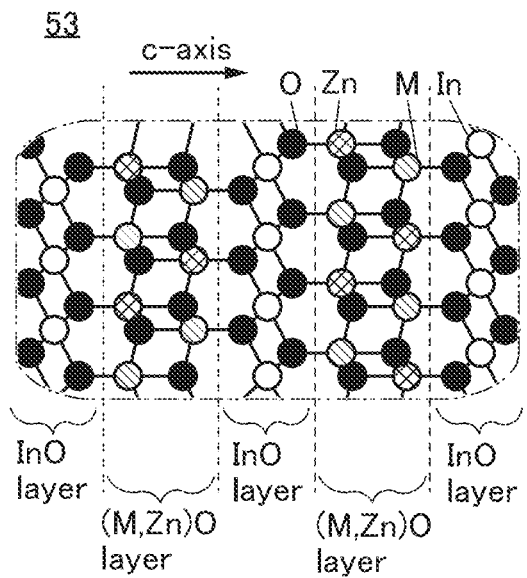

Here, FIG. 5(C) illustrates an enlarged view of a region 53 of the oxide 230b illustrated in FIG. 5(B). The oxide 230b illustrated in FIG. 5(C) is an In-M-Zn oxide having a CAAC structure.

As illustrated in FIG. 5(C), in the oxide 230b of the transistor 10a, the c-axis of the crystal included in the CAAC-OS is aligned in a direction substantially parallel to the formation surface or film surface of the oxide 230b. Thus, in FIG. 5(B), the c-axis direction of the crystal included in the CAAC-OS is the horizontal direction of the sheet. In addition, the a-b plane of the crystal included in the CAAC-OS is substantially parallel to the normal direction with respect to the formation surface or film surface of the oxide 230b. In other words, the InO layer and the (M,Zn)O layer are each placed substantially perpendicularly to the formation surface. Thus, in FIG. 5(B), the a-b plane of the crystal included in the CAAC-OS is parallel to the vertical direction of the sheet and the normal direction of the sheet.

Such an oxide 230b may be provided in such a manner that, for example, a structure body is formed over the insulator 224, the oxide 230b is formed using the side surface of the structure body as the formation surface, and then the structure body is removed. Here, it is preferable that the side surface of the structure body be substantially perpendicular to the top surface of the insulator 224.

In the channel width direction of the transistor 10a, with reference to the bottom surface of the insulator 224, the bottom surface of the conductor 260 in a region not overlapping with the oxide 230b is preferably lower than the bottom surface of the oxide 230b. It is particularly preferable that the bottom surface of a first region (also can be referred to as the bottom surface on the A3 side) of the conductor 260, which does not overlap with the oxide 230b, and the bottom surface of a second region (also can be referred to as the bottom surface on the A4 side) of the conductor 260, which is positioned opposite to the first region with the oxide 230b sandwiched therebetween, be at a lower position than the bottom surface of the oxide 230b. The difference between the level of the bottom surface of the oxide 230b and the level of the bottom surface of the conductor 260 in a region where the conductor 260 does not overlap with the oxide 230b is set to greater than or equal to 0 nm and less than or equal to 100 nm, preferably greater than or equal to 3 nm and less than or equal to 50 nm, further preferably greater than or equal to 5 nm and less than or equal to 20 nm.

With a structure in which the conductor 260 functioning as a gate electrode covers the side surface and the top surface of the oxide 230b in the channel formation region with the oxide 230c and the insulator 250 therebetween, the electrical field of the conductor 260 is likely to act on the entire region 234 of the oxide 230b, as illustrated in FIG. 5(B). In particular, when the bottom surface of the conductor 260 is lower than the bottom surface of the oxide 230b, the electric field of the conductor 260 can act also on the bottom surface of the oxide 230b.

In this manner, in a cross section of the transistor 10a in the channel width direction, gate electric field can be applied to the region 234 of the oxide 230b from almost all of the surroundings. Thus, a channel can be formed in the entire region 234 of the oxide 230b, leading to higher on-state current and higher frequency characteristics of the transistor 10a. Furthermore, forming a channel in the entire region 234 of the oxide 230b can reduce the off-state current of the transistor 10a.

Here, the oxide 230b preferably has a shape of a thin and long wire with a thickness and a length in the channel width direction of several nanometers to several tens of nanometers. Such an oxide 230b can be referred to as a nanowire. Furthermore, as illustrated in FIG. 4 and FIG. 5, the oxide 230b, the oxide 230c, the insulator 250, and the conductor 260 can be a collective structure body with a shape of a thin and long wire; thus, these can be collectively referred to as a nanowire. Furthermore, as described above, the electric field of the conductor 260 can act on the entire region 234 of the oxide 230b in the transistor 10a; thus, the transistor 10a can be referred to as a nanowire transistor.

In the oxide 230b of the transistor 10a, the metal oxide layer is rotated by 900 with the channel length direction as the axis, compared to that in the oxide 230 of the transistor 10. However, when the transistor 10a has a nanowire shape, that is, when the electric field of the conductor 260 acts on the entire region 234 of the oxide 230b, the electric field acts on equally regardless of the angle of the metal oxide layer with respect to the conductor 260. Thus, the transistor 10a and the transistor 10 can be regarded as having substantially the same characteristics even when having different angles of the metal oxide layer with respect to the formation surface of the oxide 230b.

Alternatively, a metal oxide having a wider bandgap than the oxide 230b may be used for the oxide 230c. Alternatively, a metal oxide with low electron affinity may be used. Alternatively, a metal oxide having a small difference between the energy of the vacuum level and the energy of the conduction band minimum may be used. In this manner, the probability of carrier movement to the gate electrode and the gate insulating film can be reduced.

In the case where the oxide 230c has a function of inhibiting diffusion of oxygen, oxygen in the oxide 230b can be inhibited from diffusing into the gate insulating film or the gate electrode. Moreover, in the case where the oxide 230c has a function of inhibiting diffusion of impurities, impurities can be inhibited from diffusing into the oxide 230b from the components formed above the oxide 230c.

Although the oxide 230c is illustrated as a single layer in FIG. 4 and FIG. 5, the oxide 230c may have a stacked-layer structure.

Modification Example 2 of Transistor

Figure 6A:
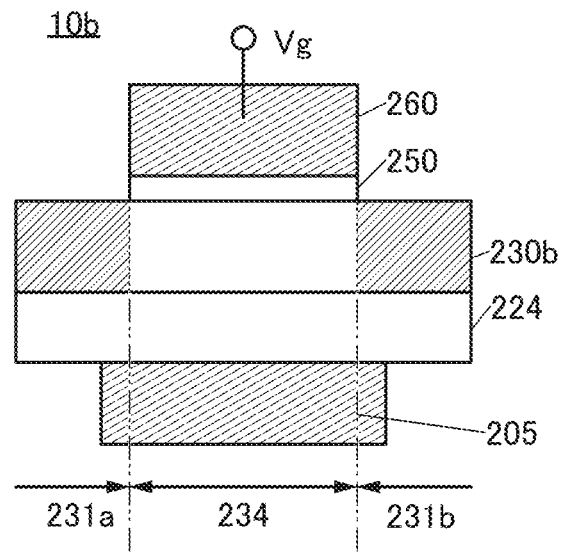
FIGS. 6A-6B Cross-sectional views of a transistor of one embodiment of the present invention.
Figure 6B:
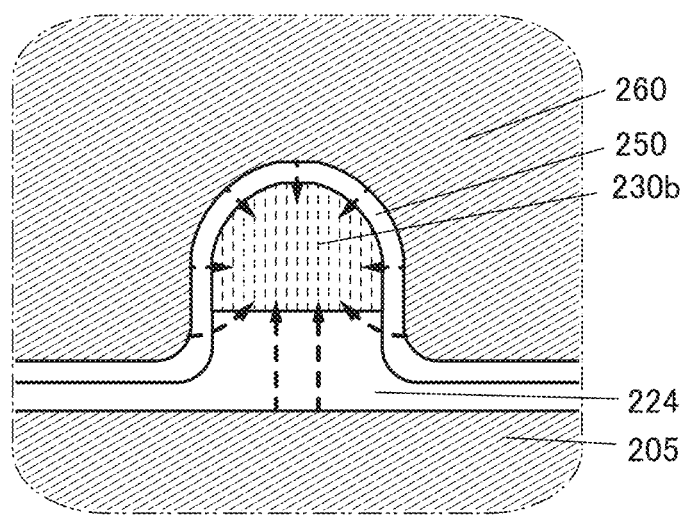

FIG. 6 illustrates a transistor 10b as a modification example of the transistor 10a. FIG. 6(A) and FIG. 6(B) are cross-sectional views of the transistor 10b of one embodiment of the present invention. FIG. 6(A) is a cross-sectional view of the transistor 10b in the channel length direction. FIG. 6(B) is a cross-sectional view of the transistor 10b in the channel width direction.

In the transistor 10b, components having the same functions as the components included in the transistor 10 and the transistor 10a are denoted by the same reference numerals. Note that in this section, the materials described in detail for the transistor 10 and the transistor 10a can be used as the materials for the transistor 10b.

The transistor 10b is different from the transistor 10a in including, below the insulator 224, a conductor 205 that overlaps with at least part of a region where the oxide 230b and the conductor 260 overlap with each other. Note that the oxide 230c provided in the transistor 10a is not provided in the transistor 10b.

Here, the conductor 260 sometimes functions as a first gate (also referred to as top gate) electrode. The conductor 205 functions as a second gate (also referred to as a back gate) electrode in some cases. In that case, by changing the potential applied to the conductor 205 not in conjunction with but independently of the potential applied to the conductor 260, the threshold voltage (Vth) of the transistor 10b can be controlled. In particular, by applying a negative potential to the conductor 205, Vth of the transistor 10b can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

Note that the conductor 205 is preferably provided larger than the channel formation region of the oxide 230b. As illustrated in FIG. 6(B), it is particularly preferable that the conductor 205 also extend to a region outside an end portion of the oxide 230b that intersects with the channel width direction. That is, the conductor 205 and the conductor 260 preferably overlap with each other with the insulator 224 therebetween on an outer side of the side surface of the oxide 230 in the channel width direction.

With the above structure, as illustrated in FIG. 6(B), the channel formation region of the oxide 230b can be electrically surrounded by the electric field of the conductor 260 functioning as a first gate electrode and the electric field of the conductor 205 functioning as a second gate electrode. In particular, the electric field that acts on the bottom surface of the oxide 230b can be intensified by the electric field of the conductor 205.

In this manner, in a cross section of the transistor 10b in the channel width direction, gate electric field can be applied to the region 234 of the oxide 230b from almost all of the surroundings. Thus, a channel can be formed in the entire region 234 of the oxide 230b, leading to higher on-state current and higher frequency characteristics of the transistor 10b. Furthermore, forming a channel in the entire region 234 of the oxide 230b can reduce the off-state current of the transistor 10b.

As in the transistor 10a, the electric fields of the conductor 260 and the conductor 205 can act on the entire region 234 of the oxide 230b in the transistor 10b; thus, the transistor 10b can be referred to as a nanowire or a nanowire transistor.

In this specification and the like, a transistor structure in which a channel formation region is electrically surrounded by electric fields of a first gate electrode and a second gate electrode can be referred to as a surrounded channel (S-channel) structure.

<Modification Example 3 of Transistor>

Figure 7:
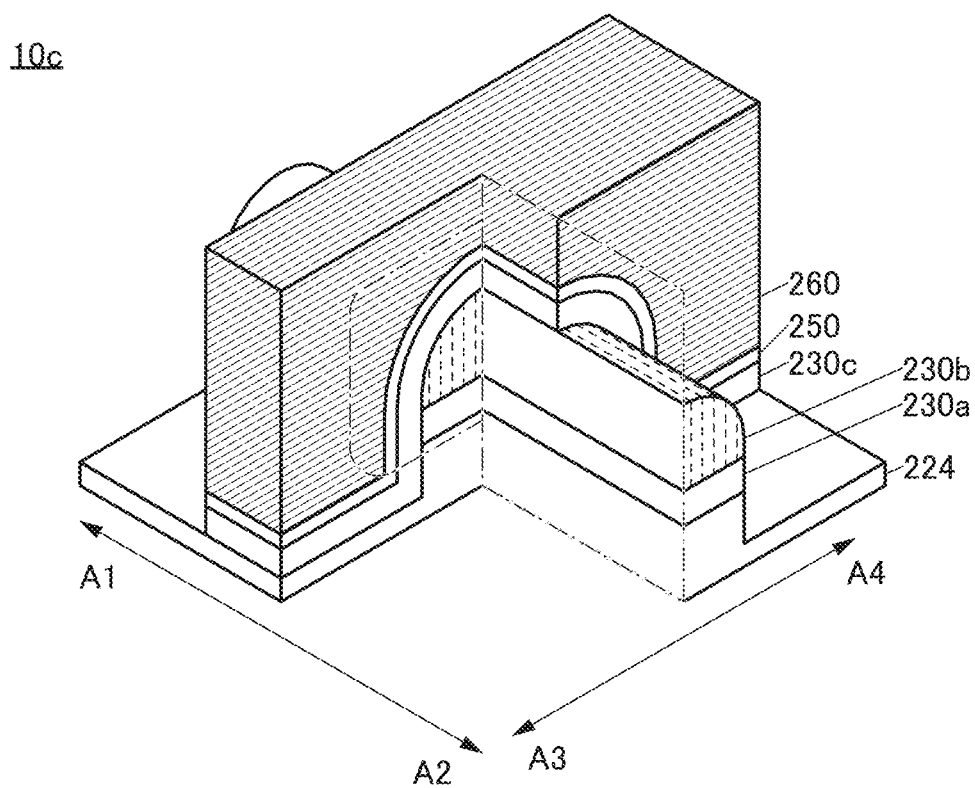
FIG. 7 A perspective view of a transistor of one embodiment of the present invention.
Figure 8A:
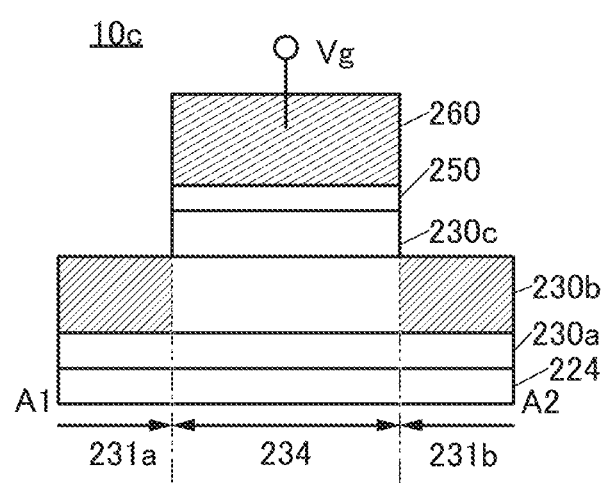
FIGS. 8A-8B Cross-sectional views of a transistor of one embodiment of the present invention.
Figure 8B:
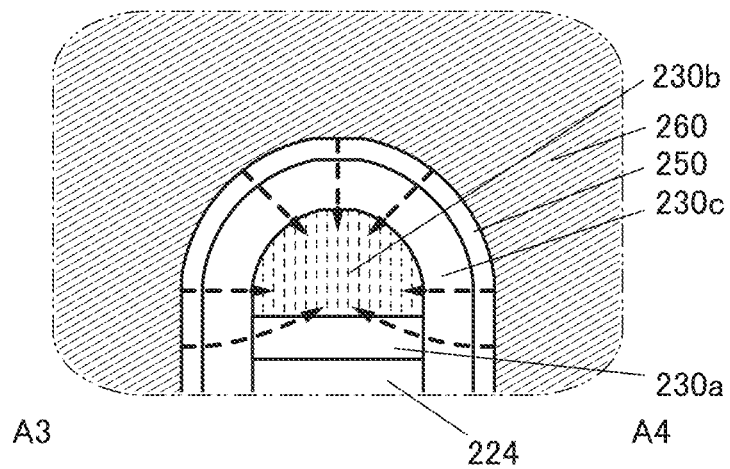

FIG. 7 and FIG. 8 illustrates a transistor 10c as a modification example of the transistor 10a. FIG. 7 is a perspective view of the transistor 10c of one embodiment of the present invention. Note that for clarification of the drawing, some components are omitted in the perspective view of FIG. 7. FIG. 8(A) and FIG. 8(B) are cross-sectional views of the transistors 10c of one embodiment of the present invention. FIG. 8(A) is a cross-sectional view of the transistor 10c in a direction indicated by A1-A2 in FIG. 7, and is also a cross-sectional view of the transistor 10c in the channel length direction. FIG. 8(B) is a cross-sectional view of the transistor 10c in a direction indicated by A3-A4 in FIG. 7, and is also a cross-sectional view of the transistor 10c in the channel width direction.

Note that in the transistor 10c, components having the same functions as the components included in the transistor 10, the transistor 10a, and the transistor 10b are denoted by the same reference numerals. Note that in this section, the materials described in detail for the transistor 10, the transistor 10a, and the transistor 10b can be used as the materials for the transistor 10c.

The transistor 10c is different from the transistor 10a in including an oxide 230a between the insulator 224 and the oxide 230b. That is, the oxide 230 includes the oxide 230a over the insulator 224, the oxide 230b over the oxide 230a, and the oxide 230c over the oxide 230b.

As the oxide 230a, an oxide similar to that for the oxide 230c is preferably used. For example, a metal oxide having a wider bandgap than the oxide 230b may be used for the oxide 230a. Alternatively, a metal oxide with low electron affinity may be used. Alternatively, a metal oxide having a small difference between the energy of the vacuum level and the energy of the conduction band minimum may be used. In this manner, the probability of carrier movement to the insulator 224 can be reduced.

It is preferable that, at least in the region 234, the top surface of the oxide 230a be in contact with the oxide 230b and the side surface of the oxide 230a be in contact with the oxide 230c as illustrated in FIG. 8(B). With such a structure, the oxide 230b can be covered with the oxide 230a and the oxide 230c in the region 234. Thus, the oxide 230b can be isolated from the insulator 224 and the insulator 250 in the region 234. Accordingly, the probability of carrier movement to the outside of the oxide 230b can be reduced, so that diffusion of oxygen to the outside and diffusion of impurities from the outside can be inhibited.

<Modification Example 4 of Transistor>

Figure 9:
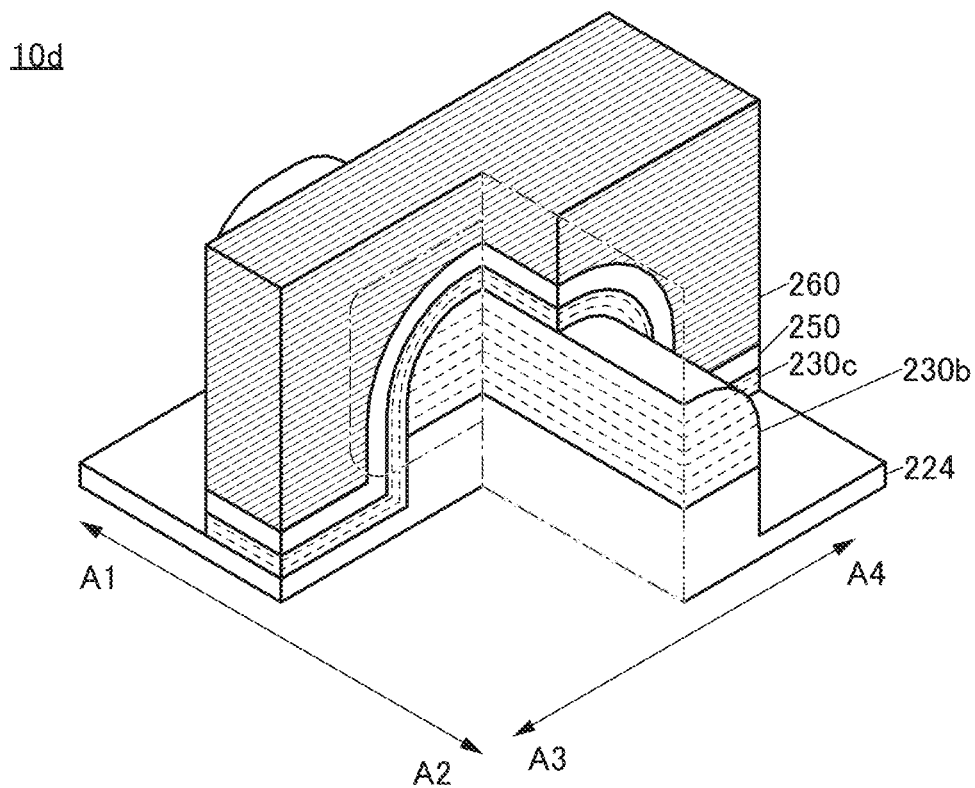
FIG. 9 A perspective view of a transistor of one embodiment of the present invention.
Figure 10A:
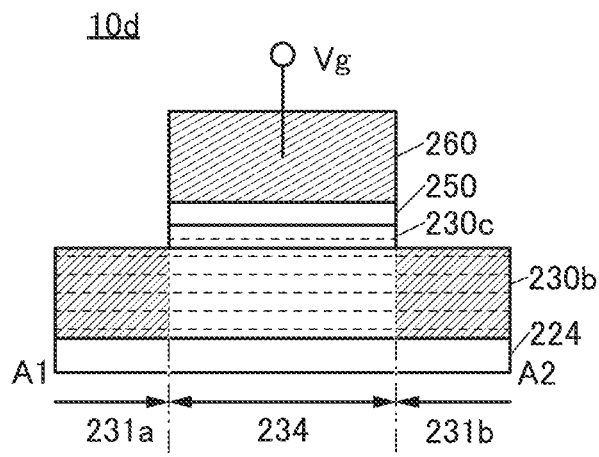
FIGS. 10A-10E Cross-sectional views of a transistor of one embodiment of the present invention, a diagram showing a band diagram, and diagrams illustrating crystals included in a metal oxide of one embodiment of the present invention.
Figure 10B:
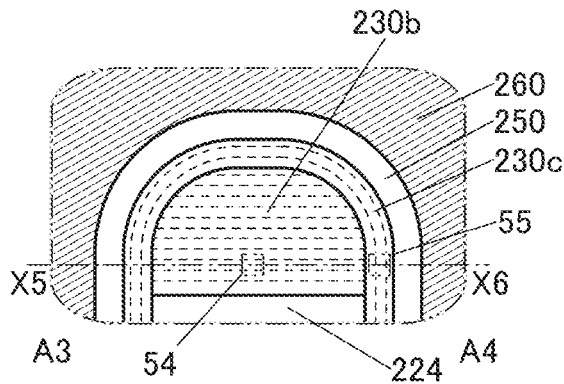

FIG. 9 is a perspective view of a transistor 10d of one embodiment of the present invention. Note that for clarification of the drawing, some components are omitted in the perspective view of FIG. 9. FIG. 10(A) and FIG. 10(B) are cross-sectional views of the transistor 10d of one embodiment of the present invention. FIG. 10(A) is a cross-sectional view of the transistor 10d in a direction indicated by A1-A2 in FIG. 9, and is also a cross-sectional view of the transistor 10d in the channel length direction. FIG. 10(B) is a cross-sectional view of the transistor 10d in a direction indicated by A3-A4 in FIG. 9, and is also a cross-sectional view of the transistor 10d in the channel width direction.

Note that in the transistor 10d, components having the same functions as the components included in the transistor 10, the transistor 10a, the transistor 10b, and the transistor 10c are denoted by the same reference numerals. Note that in this section, the materials described in detail for the transistor 10, the transistor 10a, the transistor 10b, and the transistor 10c can be used as the materials for the transistor 10d.

As illustrated in FIG. 10(A), the transistor 10d includes the insulator 224 placed over a substrate (not illustrated), the oxide 230b placed over the insulator 224, the oxide 230c placed over the oxide 230b, the insulator 250 placed over the oxide 230c, and the conductor 260 placed over the insulator 250.

As illustrated in FIG. 10(B), in the channel width direction of the transistor 10d, the oxide 230c is provided to cover the top surface and the side surface of the oxide 230b. The insulator 250 is provided to cover the top surface and the side surface of the oxide 230b with the oxide 230c therebetween. The conductor 260 is provided to cover the top surface and the side surface of the oxide 230b with the oxide 230c and the insulator 250 therebetween.

The insulator 250 functions as a gate insulating film. The conductor 260 functions as a gate electrode. The oxide 230b includes the region 234 functioning as the channel formation region of the transistor 10d and the region 231 (the region 231a and the region 231b) functioning as the source region or the drain region. The channel formation region may be formed in the oxide 230c.

In the channel width direction of the transistor 10d, with reference to the bottom surface of the insulator 224, the bottom surface of the conductor 260 in a region not overlapping with the oxide 230b is preferably lower than the bottom surface of the oxide 230b. With a structure in which the conductor 260 functioning as a gate electrode covers the side surface and the top surface of the oxide 230b in the channel formation region with the oxide 230c and the insulator 250 therebetween, the electrical field of the conductor 260 is likely to act on the entire region 234 of the oxide 230b. Thus, the on-state current of the transistor 10d can be increased and the frequency characteristics can be improved. The difference between the level of the bottom surface of the conductor 260 in a region where the conductor 260 does not overlap with the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

It is preferable to use a crystalline metal oxide for at least one of the oxide 230b and the oxide 230c. Specifically, at least one of the oxide 230b and the oxide 230c is preferably a single crystal oxide semiconductor or a CAAC-OS.

The oxide 230b is illustrated as a single layer, but may have a stacked-layer structure. For example, in the case where the oxide 230b has a stacked structure of two layers, a lower layer of the oxide 230b is in contact with the insulator 224 and an upper layer of the oxide 230b is in contact with the oxide 230c. With such a structure, impurities can be inhibited from diffusing into the oxide 230b from the components formed below the lower layer of the oxide 230b.

Figure 10C:
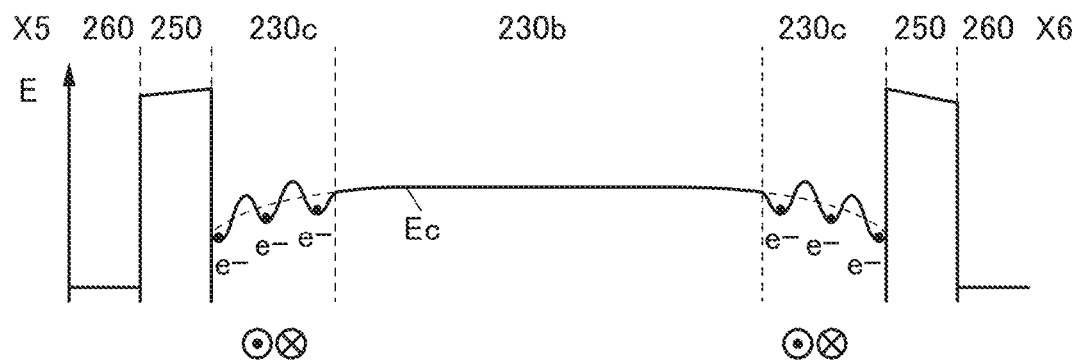
Figure 10D:
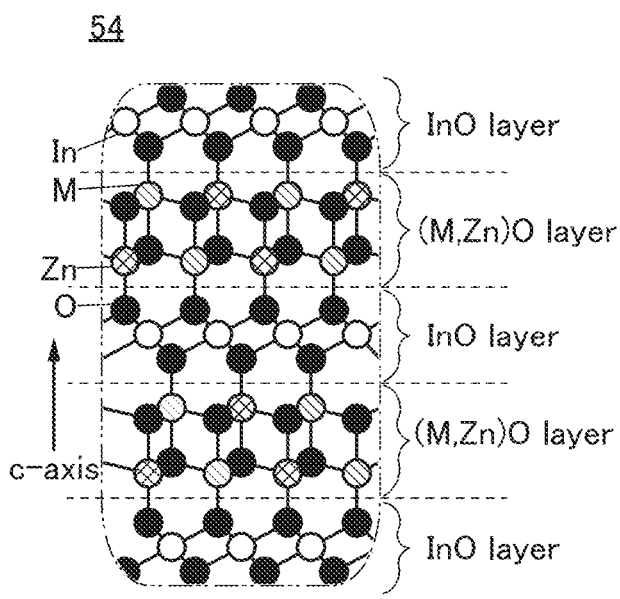
Figure 10E:
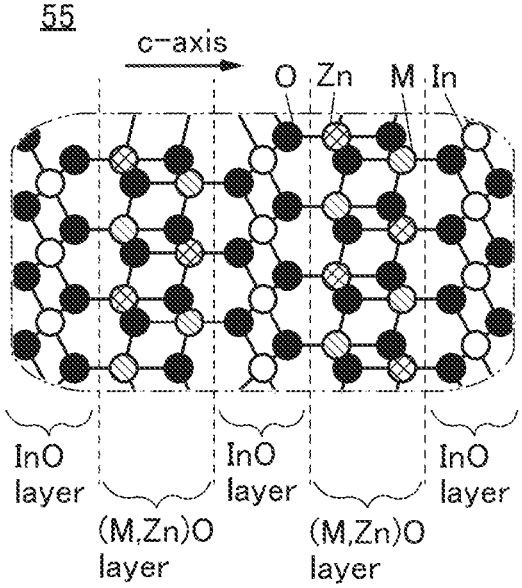

Here, FIG. 10(D) illustrates an enlarged view of a region 54 of the oxide 230b illustrated in FIG. 10(B). In addition, FIG. 10(E) illustrates a region 55 of the oxide 230c illustrated in FIG. 10(B). Note that the oxide 230b and the oxide 230c are each an In-M-Zn oxide having a CAAC structure.

As described above, in the case where the oxide 230b is a CAAC-OS, the c-axis of the crystal included in the oxide 230b is aligned in the normal direction with respect to the formation surface or film surface of the oxide 230b, and the a-b plane is substantially parallel to the formation surface or film surface of the oxide 230b. Thus, in the region 54 of the oxide 230b illustrated in FIG. 10(D), the c-axis direction of the crystal included in the oxide 230b is the vertical direction of the sheet. In addition, the a-b plane of the crystal included in the oxide 230b is parallel to the horizontal direction of the sheet and the normal direction of the sheet.

Furthermore, the c-axis of the crystal included in the CAAC-OS is aligned in a direction substantially perpendicular to the formation surface of the CAAC-OS, and the a-b plane is substantially parallel to the formation surface of the CAAC-OS. Thus, in the case where a crystalline metal oxide is used for the oxide 230c, in the region 55 of the oxide 230c illustrated in FIG. 10(E), the c-axis direction of the crystal included in the oxide 230c is the horizontal direction of the sheet. In addition, the a-b plane of the crystal included in the oxide 230c is parallel to the vertical direction of the sheet and the normal direction of the sheet.

From the above, on the dashed-dotted line indicated by X5-X6 in FIG. 10(B), the c-axis direction of the crystal included in the oxide 230b is different from the c-axis direction of the crystal included in the oxide 230c.

[Carrier Transfer Model 2]

Here, carrier transfer in a transistor in which the oxide 230b and the oxide 230c are stacked is described using the carrier transfer model described above.

FIG. 10(C) shows a model of a band diagram taken along the dashed-dotted line indicated by X5-X6 in the transistor 10d illustrated in FIG. 10(A) and FIG. 10(B). Note that FIG. 10(C) shows a state in which a positive potential is applied to the gate electrode. FIG. 10(C) also shows an example in which metal oxides with the same energy of the conduction band minimum are used for the oxide 230b and the oxide 230c.

On the dashed-dotted line X5-X6 shown in FIG. 10(B), in the oxide 230b, the a-b plane of the crystal included in the oxide 230b is substantially parallel to the substrate surface. Thus, the oxide 230b on the dashed-dotted line indicated by X5-X6 has constant energy of the conduction band minimum. In addition, in the oxide 230b, an electric field is generated in the a-b plane direction of the crystal included in the oxide 230b. Furthermore, a weaker electric field is applied to the inside of the oxide 230b than the surface of the oxide 230b. Thus, the conduction band minimum of the inside of the oxide 230b has a gentle curve.

Meanwhile, in the oxide 230c, an electric field is generated in the c-axis direction of the crystal included in the oxide 230c. Furthermore, an electric field generated in the oxide 230c is larger than the electric field applied to the inside of the oxide 230b. Thus, the oxide 230c has a steep band curve (see the dotted lines in FIG. 10(C)). Furthermore, on the dashed-dotted line indicated by X5-X6, the a-b plane of the crystal included in the oxide 230c is substantially perpendicular to the substrate surface. Thus, as shown in FIG. 10(C), on the dashed-dotted line indicated by X5-X6, the conduction band minimum derived from the InO layer and the conduction band minimum derived from the (M,Zn)O layer alternately appear in the conduction band minimum of the oxide 230c.

At this time, carriers injected from the source concentrate in the InO layer of the oxide 230c with a lower conduction band minimum. Furthermore, the carriers are transferred between the source and the drain, that is, transferred in the a-b plane direction. From the above, on the dashed-dotted line indicated by X5-X6, the InO layer of the oxide 230b or the InO layer of the oxide 230c is a main path of the carrier transfer.

When carriers are too concentrated, repulsion due to Coulomb force is generated between the carriers, thereby inhibiting the carrier transfer. As illustrated in FIG. 10(C), the metal oxide having a layered crystal includes a plurality of InO layers that are main paths of carrier transfer; thus, the carriers are dispersed in the plurality of InO layers. Therefore, carrier concentration is reduced and repulsion due to Coulomb force is less likely to occur among the carriers, and accordingly the carrier transfer is not inhibited.

Note that a metal oxide having a wider bandgap than the oxide 230b may be used for the oxide 230c. Alternatively, a metal oxide with low electron affinity may be used. Alternatively, a metal oxide having a small difference between the energy of the vacuum level and the energy of the conduction band minimum may be used. In this manner, the probability of carrier movement to the gate electrode and the gate insulating film can be reduced.

The oxide 230c is illustrated as a single layer in FIG. 9 and FIG. 10, but may have a stacked-layer structure. For example, in the case where the oxide 230c has a stacked structure of two layers, a lower layer of the oxide 230c is in contact with the oxide 230b and an upper layer of the oxide 230c is in contact with the insulator 250. In this case, it is preferable that a metal oxide having the same composition as the oxide 230b be used for the lower layer of the oxide 230c and a metal oxide having a wider bandgap than the oxide 230b be used for the upper layer of the oxide 230c. With such a structure, the probability of carrier movement to the gate electrode and the gate insulating film can be reduced. Alternatively, in the case where the upper layer of the oxide 230c has a function of inhibiting diffusion of oxygen, oxygen in the oxide 230b and the lower layer of the oxide 230c can be inhibited from diffusing into the gate insulating film or the gate electrode. Alternatively, in the case where the upper layer of the oxide 230c has a function of inhibiting diffusion of impurities, impurities can be inhibited from diffusing into the lower layer of the oxide 230c and the oxide 230b from the components formed above the upper layer of the oxide 230c.

Note that the components in the following structure examples and modification examples of the transistor can be used in appropriate combination with each other.

Accordingly, a semiconductor device including a transistor with high on-state current can be provided. A semiconductor device including a transistor having high frequency characteristics can be provided. A semiconductor device having reduced variation in electrical characteristics, stable electrical characteristics, and improved reliability can be provided. In addition, a semiconductor device including a transistor having a low off-state current can be provided.

The structure, method, and the like described above in this embodiment can be used in appropriate combination with structures, methods, and the like described in the other embodiments and the examples.

Embodiment 2

Specific structure examples of the semiconductor device described in the above embodiment are described below with reference to FIG. 11 to FIG. 17.

<Structure Example 1 of Semiconductor Device>

Figure 11A:
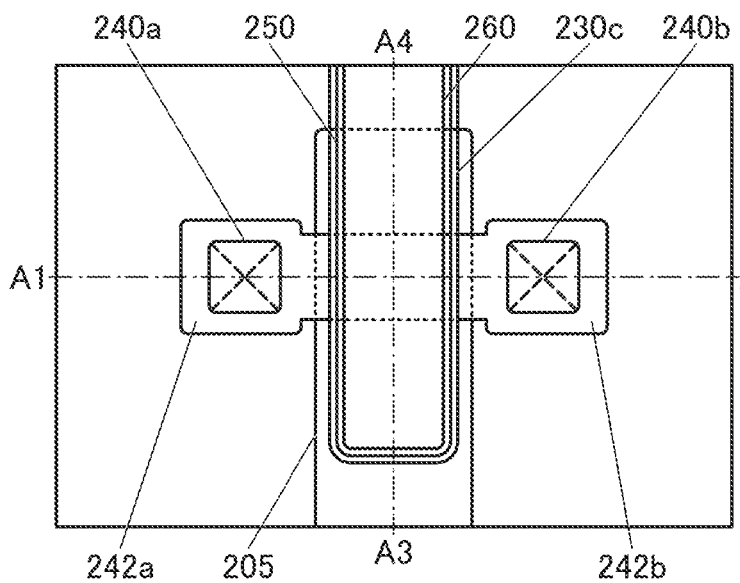
FIGS. 11A-11C Atop view and cross-sectional views of a semiconductor device of one embodiment of the present invention.
Figure 11C:
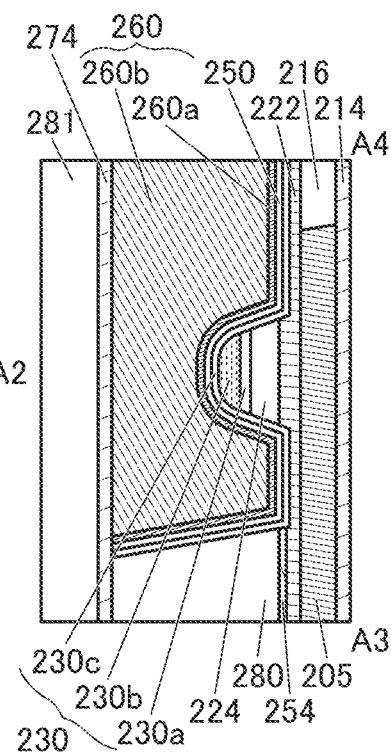
Figure 11B:
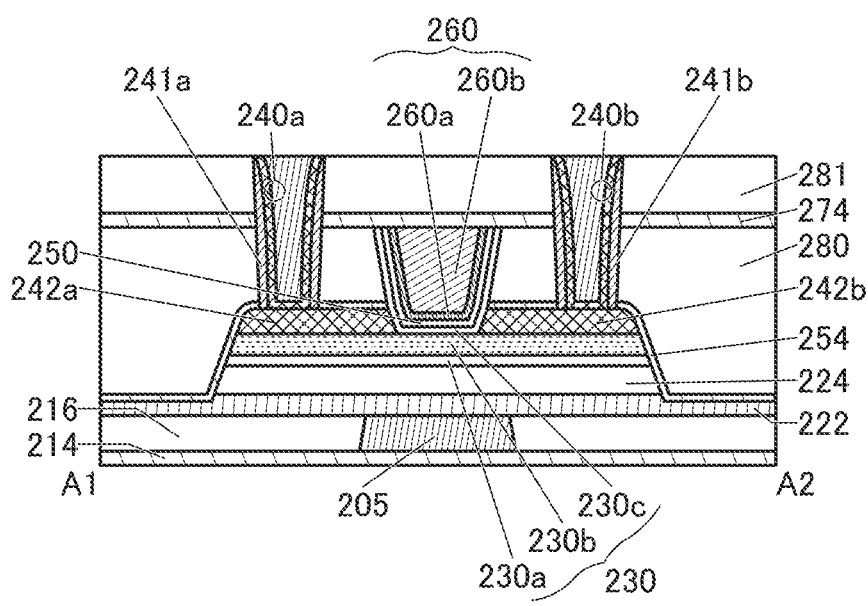

FIG. 11(A) to FIG. 11(C) are a top view and cross-sectional views of a transistor 200 of one embodiment of the present invention and the periphery of the transistor 200.

FIG. 11(A) is atop view of a semiconductor device including the transistor 200. In addition, FIG. 11(B) and FIG. 11(C) are cross-sectional views of the semiconductor device. Here, FIG. 11(B) is a cross-sectional view of a portion indicated by a dashed-dotted line A1-A2 in FIG. 11(A), and is a cross-sectional view of the transistor 200 in the channel length direction. In addition, FIG. 11(C) is a cross-sectional view of a portion indicated by a dashed-dotted line A3-A4 in FIG. 11(A), and is a cross-sectional view of the transistor 200 in the channel width direction. Note that for clarity of the drawing, some components are omitted in the top view of FIG. 11(A).

The semiconductor device of one embodiment of the present invention includes the transistor 200, and an insulator 214, an insulator 280, an insulator 274, and an insulator 281 that function as interlayer films. A conductor 240 (a conductor 240a and a conductor 240b) functioning as a plug and being electrically connected to the transistor 200 is also included. Note that an insulator 241 (an insulator 241a and an insulator 241b) is provided in contact with a side surface of the conductor 240 functioning as a plug.

In contact with the inner wall of an opening formed in an insulator 254, the insulator 280, the insulator 274, and the insulator 281, the insulator 241 is provided. In contact with its side surface, a first conductor of the conductor 240 is provided, and a second conductor of the conductor 240 is further provided on the inner side. Here, the level of a top surface of the conductor 240 and the level of a top surface of the insulator 281 can be substantially the same. Note that although the transistor 200 having a structure in which the first conductor of the conductor 240 and the second conductor of the conductor 240 are stacked is illustrated, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 11, the transistor 200 includes an insulator 216 placed over the a substrate (not illustrated); a conductor 205 placed to be embedded in the insulator 216; an insulator 222 placed over the insulator 216 and the conductor 205; an insulator 224 placed over the insulator 222; an oxide 230 (an oxide 230a, an oxide 230b, and an oxide 230c) placed over the insulator 224; an insulator 250 placed over the oxide 230; a conductor 260 (a conductor 260a and a conductor 260b) placed over the insulator 250; a conductor 242a and a conductor 242b in contact with part of a top surface of the oxide 230b; and the insulator 254 placed in contact with part of a top surface of the insulator 222, a side surface of the insulator 224, a side surface of the oxide 230a, a side surface of the oxide 230b, a side surface of the conductor 242a, a top surface of the conductor 242a, a side surface of the conductor 242b, and a top surface of the conductor 242b.

Here, the conductor 260 functions as a gate electrode of the transistor, and the conductor 242a and the conductor 242b function as a source electrode and a drain electrode. In the transistor 200, the conductor 260 functioning as a gate electrode is formed in a self-aligned manner to fill an opening formed in the insulator 280 and the like. The formation of the conductor 260 in this manner allows the conductor 260 to be positioned certainly in the region between the conductor 242a and the conductor 242b without alignment.

Note that the conductor 260 preferably includes the conductor 260a and the conductor 260b positioned over the conductor 260a. For example, the conductor 260a is preferably positioned so as to cover the bottom surface and side surface of the conductor 260b. As illustrated in FIG. 11(B), a top surface of the conductor 260 is substantially aligned with a top surface of the insulator 250 and a top surface of the oxide 230c. Although the conductor 260 having a stacked-layer structure of two layers is illustrated in the transistor 200, the present invention is not limited thereto. For example, the conductor 260 may have a single-layer structure or a stacked-layer structure of three or more layers.

The insulator 222, the insulator 254, and the insulator 274 preferably have a function of inhibiting the diffusion of hydrogen (for example, at least one of a hydrogen atom, a hydrogen molecule, or the like). In addition, the insulator 222, the insulator 254, and the insulator 274 preferably have a function of inhibiting diffusion of oxygen (for example, at least one of an oxygen atom, an oxygen molecule, or the like). For example, the insulator 222, the insulator 254, and the insulator 274 preferably have lower permeability of one or both of hydrogen and oxygen than the insulator 224. The insulator 222, the insulator 254, and the insulator 274 preferably have lower permeability of one or both of hydrogen and oxygen than the insulator 250. The insulator 222, the insulator 254, and the insulator 274 preferably have lower permeability of one or both of hydrogen and oxygen than the insulator 280.

The oxide 230 preferably includes the oxide 230a positioned over the insulator 224, the oxide 230b positioned over the oxide 230a, and the oxide 230c that is positioned over the oxide 230b and that is at least partly in contact with the top surface of the oxide 230b. It is also preferable that, as illustrated in FIG. 11(C), the oxide 230c be provided to cover the top surface and the side surface of the oxide 230b in the channel width direction of the transistor 200.

Here, the oxide 230, the insulator 250, the conductor 260, the insulator 224, and the conductor 205 each correspond to the structure included in the transistor 10 or the transistor 10a to the transistor 10d that are described in the above embodiment.

Note that although a structure of the transistor 200 in which three layers of the oxide 230a, the oxide 230b, and the oxide 230c are stacked in a region where a channel is formed (hereinafter also referred to as a channel formation region) and in its vicinity is illustrated, the present invention is not limited thereto. For example, a single layer of the oxide 230b, a two-layer structure of the oxide 230a and the oxide 230b, a two-layer structure of the oxide 230b and the oxide 230c, or a stacked-layer structure of four or more layers may be provided. Alternatively, each of the oxide 230a, the oxide 230b, and the oxide 230c may have a stacked-layer structure of two or more layers.

For example, in the case where the oxide 230c has a stacked-layer structure including a first oxide and a second oxide over the first oxide, the first oxide may have a composition similar to that of the oxide 230b and the second oxide may have a composition similar to that of the oxide 230a.

In the transistor 200, a metal oxide functioning as an oxide semiconductor (hereinafter also referred to as an oxide semiconductor) is preferably used as the oxide 230 (the oxide 230a, the oxide 230b, and the oxide 230c) including a channel formation region.

The transistor 200 using an oxide semiconductor in the channel formation region exhibits extremely low leakage current in a non-conduction state (off-state current); thus, a semiconductor device with low power consumption can be provided. An oxide semiconductor can be deposited by a sputtering method or the like, and can be used for the transistor 200 constituting a highly integrated semiconductor device.

For example, as the oxide 230, it is preferable to use a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). In particular, aluminum, gallium, yttrium, or tin is preferably used as the element M. Furthermore, an In—Ga oxide, an In—Zn oxide, a Ga—Zn oxide, or gallium oxide may be used as the oxide 230.

As described above, the oxide 230 corresponds to the oxide 230 described in the above embodiment. Thus, in the transistor 200, a crystalline metal oxide is preferably used as the oxide 230 including a channel formation region. In addition, it is preferable that the crystal included in the metal oxide include a first layer and a second layer and have a stacked-layer structure in which the first layer and the second layer are alternately stacked. Furthermore, the first layer preferably has a wider bandgap than the second layer. Examples of the crystalline metal oxide include a single crystal oxide semiconductor and a CAAC-OS. The crystalline metal oxide can improve the carrier transfer. Thus, the mobility of the metal oxide is increased, the on-state current of a transistor using the metal oxide is increased, and accordingly the electrical characteristics of the transistor can be improved.

It is preferable to use a crystalline metal oxide for at least one of the oxide 230b and the oxide 230c. Specifically, at least one of the oxide 230b and the oxide 230c is preferably a single crystal oxide semiconductor or a CAAC-OS. Here, FIG. 11(C) is, like FIG. 10(B), a cross-sectional view of the transistor 200 in the channel width direction. Thus, a region corresponding to the region 54 of the oxide 230b illustrated in FIG. 10(B) has a crystal structure illustrated in FIG. 10(D), and a region corresponding to the region 55 of the oxide 230c illustrated in FIG. 10(B) has a crystal structure illustrated in FIG. 10(E). Thus, transistor 200 roughly satisfies the band diagram model shown in FIG. 10(C), and thus can prevent the inhibition of carrier transfer.

As illustrated in FIG. 11(B), it is also preferable that a region positioned in the vicinity of an interface between the oxide 230c and the insulator 274 be physically apart from the channel formation region of the oxide 230. The density of trap states is high in the vicinity of the interface between the oxide 230c and the insulator 274 in some cases. Thus, when the region positioned in the vicinity of the interface between the oxide 230c and the insulator 274 is physically apart from the channel formation region of the oxide 230, the transistor 200 can have reduced variation in electrical characteristics and improved reliability.

A transistor using an oxide semiconductor is likely to have its electrical characteristics changed by impurities and oxygen vacancies in a channel formation region of the oxide semiconductor, which might affect the reliability. Moreover, when the channel formation region of the oxide semiconductor includes oxygen vacancies, the transistor tends to have normally-on characteristics. Thus, it is preferable that oxygen vacancies in the channel formation region be reduced as much as possible. For example, oxygen may be supplied to the oxide 230 through the oxide 230c, the insulator 250, or the like to supplement the oxygen vacancies. Accordingly, a transistor with reduced variation in electrical characteristics, stable electrical characteristics, and improved reliability can be provided.

In the case where an element included in the conductor 242 (the conductor 242a and the conductor 242b) functioning as a source electrode and a drain electrode and provided over and in contact with the oxide 230 has a function of absorbing oxygen in the oxide 230, a low-resistance region is sometimes partly formed between the oxide 230 and the conductor 242, or in the vicinity of the surface of the oxide 230. In that case, in the low-resistance region, an impurity (hydrogen, nitrogen, a metal element, or the like) that enters oxygen vacancies serves as a donor, and the carrier density increases in some cases.

Figure 12A:
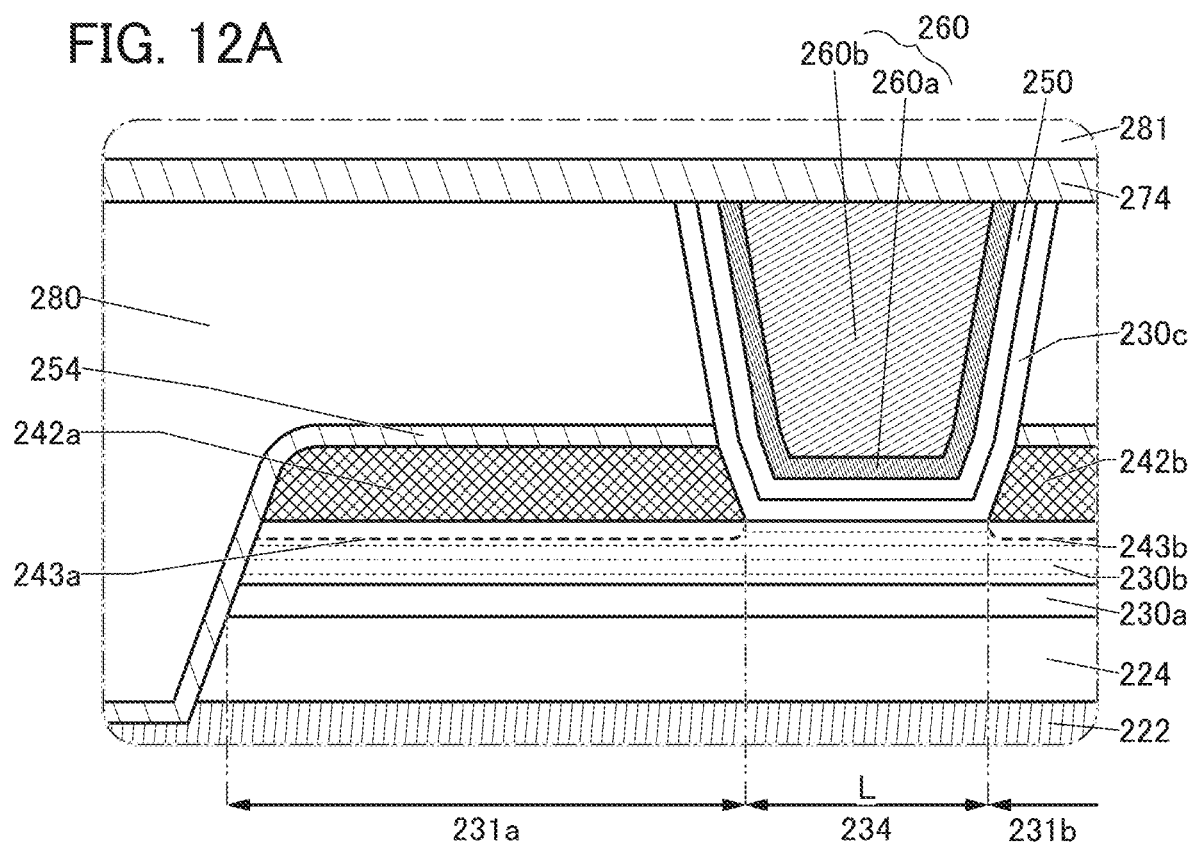
FIGS. 12A-12B Cross-sectional views of a semiconductor device of one embodiment of the present invention.

FIG. 12(A) shows an enlarged view of a region of part of the transistor 200 illustrated in FIG. 11(B). As illustrated in FIG. 12(A), the conductor 242 is provided over and in contact with the oxide 230, and a region 243 (a region 243a and a region 243b) is sometimes formed as a low-resistance region at an interface between the oxide 230 and the conductor 242 and the vicinity of the interface. The oxide 230 includes the region 234 functioning as a channel formation region of the transistor 200 and the region 231 (the region 231a and the region 231b) including at least part of the region 243 and functioning as a source region or a drain region. Note that in the following drawings, even when the region 243 is not illustrated in an enlarged view or the like, the same region 243 has been formed in some cases.

Note that although an example in which the region 243a and the region 243b are provided to spread in the depth direction of the oxide 230b near the conductor 242 is illustrated, the present invention is not limited thereto. The region 243a and the region 243b may be formed as appropriate in accordance with the required electrical characteristics of the transistor. In the oxide 230, the boundaries between the regions are difficult to detect clearly in some cases. The concentration of an element detected in each region may not only gradually change between the regions, but also continuously change (also referred to as a gradation) within each region.

As illustrated in FIG. 11(B), the insulator 254 is preferably in contact with the top surfaces of the conductor 242a and the conductor 242b; side surfaces of the conductor 242a and the conductor 242b other than the facing side surfaces thereof, side surfaces of the oxide 230a and the oxide 230b; side surfaces of the insulator 224, and part of the top surface of the insulator 222. Thus, the insulator 280 is isolated from the insulator 224, the oxide 230a, and the oxide 230b by the insulator 254. Thus, impurities such as hydrogen contained in the insulator 280 or the like can be inhibited from entering the insulator 224, the oxide 230a, and the oxide 230b.

The insulator 274 is in contact with top surfaces of the conductor 260, the insulator 250, and the oxide 230c. The transistor 200 which is one embodiment of the present invention has a structure in which the insulator 274 and the insulator 250 are in contact with each other as illustrated in FIG. 12(A). With such a structure, impurities such as hydrogen contained in the insulator 281 and the like can be inhibited from entering the insulator 250. Thus, adverse effects on the electric characteristics of the transistor and the reliability of the transistor can be suppressed.

As illustrated in FIG. 12(A), with reference to a bottom surface of the insulator 224, the level of the bottom surface of the conductor 260 in a region overlapping with the region 234 is lower than the level of the top surface of each of the conductor 242a and the conductor 242b in some cases. For example, the difference between the level of the bottom surface of the conductor 260 in the region overlapping with the region 234 and the level of the top surfaces of the conductor 242a and the conductor 242b is greater than or equal to 0 nm and less than or equal to 30 nm, or greater than or equal to 0 nm and less than or equal to 15 nm.

Figure 12B:
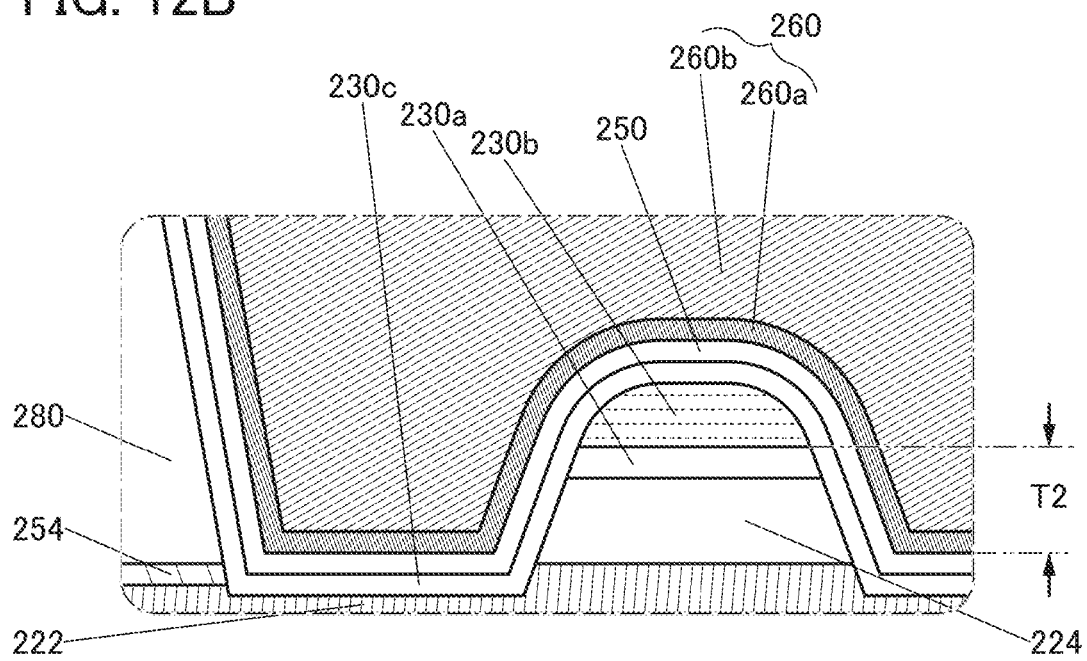

FIG. 12(B) shows an enlarged view of a region of part of the transistor 200 illustrated in FIG. 11(C). As in the above embodiment, with reference to the bottom surface of the insulator 222, the level of the bottom surface of the conductor 260 in a region where the conductor 260 does not overlap with the oxide 230b is preferably lower than the level of the bottom surface of the oxide 230b, in the channel width direction of the transistor 200. With a structure in which the conductor 260 functioning as a gate electrode covers the side surface and the top surface of the oxide 230b in the channel formation region with the oxide 230c and the insulator 250 therebetween, the electrical field of the conductor 260 is likely to act on the entire region 234 of the oxide 230b. Thus, the on-state current of the transistor 200 can be increased and the frequency characteristics of the transistor 200 can be improved. When the difference between the level of the bottom surface of the conductor 260 in a region where the conductor 260 does not overlap with the oxide 230a and the oxide 230b and the level of the bottom surface of the oxide 230b is T2, T2 is greater than or equal to 0 nm and less than or equal to 100 nm, preferably greater than or equal to 3 nm and less than or equal to 50 nm, further preferably greater than or equal to 5 nm and less than or equal to 20 nm.

As illustrated in FIG. 12(B), in the channel width direction of the transistor 200, the oxide 230c in a region not overlapping with the oxide 230b, the oxide 230a, and the insulator 224 is preferably in contact with the insulator 222 at least partly. With the structure, oxygen contained in the oxide 230c can be prevented from diffusing to the outside of the transistor 200 through the insulator 224. In addition, oxygen contained in the oxide 230b and the oxide 230a can be prevented from diffusing to the outside of the transistor 200 through the insulator 224. Furthermore, the area of the insulator 224 is reduced and the amount of oxygen taken into the insulator 224 is reduced, so that a reduction in the amount of oxygen supplied to the oxide 230 can be inhibited. Accordingly, oxygen contained in the oxide 230c can be efficiently supplied to the oxide 230b and the oxide 230a, so that a reduction in the resistance of the region 234 of the oxide 230 can be inhibited. Thus, a transistor having reduced variation in electrical characteristics, stable electrical characteristics, and improved reliability can be provided.

Furthermore, with the above structure, impurities such as hydrogen contained in the insulator 224 or the like can be inhibited from entering the oxide 230. That is, a reduction in the resistance of the oxide 230 can be inhibited. Thus, a transistor having reduced variation in electrical characteristics, stable electrical characteristics, and improved reliability can be provided. Note that the structure can be formed by the removal of the insulator 224 in a region not overlapping with the oxide 230b and the oxide 230a.

When the insulator 224 in the region not overlapping with the oxide 230b and the oxide 230a is removed, as illustrated in FIG. 12(B), in the channel width direction of the transistor 200, with reference to the bottom surface of the insulator 222, the level of the bottom surface of the conductor 260 in a region where the conductor 260 does not overlap with the oxide 230a and the oxide 230b is likely to be lower than the level of the bottom surface of the oxide 230b. Thus, the on-state current of the transistor 200 can be increased and the frequency characteristics can be improved.

Accordingly, a semiconductor device including a transistor with high on-state current can be provided. A semiconductor device including a transistor having high frequency characteristics can be provided. A semiconductor device having reduced variation in electrical characteristics, stable electrical characteristics, and improved reliability can be provided. In addition, a semiconductor device including a transistor having a low off-state current can be provided.

The detailed structure of the semiconductor device including the transistor 200 of one embodiment of the present invention is described below.

The conductor 205 is placed to overlap with the oxide 230 and the conductor 260. Furthermore, the conductor 205 is preferably provided to be embedded in the insulator 214 and the insulator 216. Preferably, the planarity of the top surface of the conductor 205 is made favorable. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and the increase in crystallinity of the oxide 230a, the oxide 230b, and the oxide 230c.

Here, the conductor 260 sometimes functions as a first gate (also referred to as top gate) electrode. The conductor 205 functions as a second gate (also referred to as a back gate) electrode in some cases. In that case, by changing the potential applied to the conductor 205 not in conjunction with but independently of the potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, drain current when a potential applied to the conductor 260 is 0 V can be lower in the case where a negative potential is applied to the conductor 205 than in the case where the negative potential is not applied to the conductor 205.

Note that as illustrated in FIG. 11(A), the conductor 205 is preferably provided larger than the channel formation region of the oxide 230. As illustrated in FIG. 11(C), it is particularly preferable that the conductor 205 also extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction.

Since the above-described structure is included, the channel formation region of the oxide 230 can be electrically surrounded by the electric field of the conductor 260 functioning as the first gate electrode and the electric field of the conductor 205 functioning as the second gate electrode.

Furthermore, as illustrated in FIG. 11(C), the conductor 205 is extended to function as a wiring as well. However, without limitation to this structure, a structure where a conductor functioning as a wiring is provided below the conductor 205 may be employed. In addition, the conductor 205 is not necessarily provided in each transistor. For example, the conductor 205 may be shared by a plurality of transistors.

Moreover, a conductive material containing tungsten, copper, or aluminum as its main component is preferably used for the conductor 205. Note that the conductor 205 is illustrated as a single layer but may have a stacked-layer structure, for example, stacked layers of the above conductive material, and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom (a conductor through which the above impurities are less likely to pass) may be provided below the conductor 205. Alternatively, it is preferable to provide a conductor having a function of inhibiting diffusion of oxygen (e.g., at least one of an oxygen atom, an oxygen molecule, and the like) (through which oxygen is less likely to pass). Note that in this specification and the like, a function of inhibiting diffusion of impurities or oxygen means a function of inhibiting diffusion of any one or all of the above impurities and oxygen.

When a conductor having a function of inhibiting oxygen diffusion is used below the conductor 205, the conductivity of the conductor 205 can be inhibited from being lowered because of oxidation. As the conductor having a function of inhibiting oxygen diffusion, for example, tantalum, tantalum nitride, ruthenium, ruthenium oxide, or the like is preferably used. Accordingly, a layer below the conductor 205 may be a single layer or a stacked layer of the above conductive materials.

Note that the conductor 205 can be deposited by a sputtering method, a chemical vapor deposition (CVD) method, a molecular beam epitaxy (MBE) method, a pulsed laser deposition (PLD) method, an atomic layer deposition (ALD) method, or the like.

In this embodiment, a stacked-layer film in which conductive films of tantalum nitride, titanium nitride, and tungsten are deposited in this order can be used as the conductor 205, for example.

The insulator 214 placed over a substrate (not illustrated) preferably functions as a barrier insulating film that inhibits impurities such as water and hydrogen from diffusing to the transistor 200 from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom (through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass).

For example, aluminum oxide, silicon nitride, or the like is preferably used for the insulator 214. Accordingly, impurities such as water and hydrogen can be inhibited from diffusing into the transistor 200 side from the side closer to the substrate than the insulator 214. Alternatively, oxygen contained in the insulator 224 and the like can be inhibited from diffusing into the substrate side through the insulator 214.

Note that the insulator 214 can be deposited by a sputtering method, a CVD method, an MBE method, a PLD method, an ALD method, or the like. In this embodiment, for the insulator 214, aluminum oxide deposited by a sputtering method can be used.

The insulator 216 placed over the insulator 214 functions as an interlayer film. Similarly, the insulator 280 and the insulator 281 that are placed over the insulator 254 function as interlayer films. The permittivity of the insulator 216, the insulator 280, and the insulator 281 each functioning as an interlayer film is preferably lower than that of the insulator 214. When a material with a low permittivity is used for an interlayer film, the parasitic capacitance generated between wirings can be reduced. For example, as the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 216 may have a stacked-layer structure. For example, the insulator 216 may have a structure where an insulator similar to the insulator 214 is provided at least in a portion that is in contact with a side surface of the conductor 205. With such a structure, oxidization of the conductor 205 due to oxygen contained in the insulator 216 can be inhibited. Alternatively, absorption of oxygen contained in the insulator 216 by the conductor 205 can be inhibited.

Note that the insulator 216 can be deposited by a sputtering method, a CVD method, an MBE method, a PLD method, an ALD method, or the like. In this embodiment, for example, silicon oxynitride deposited by a CVD method can be used for the insulator 216.

The insulator 222 and the insulator 224 each have a function of a gate insulator.

Here, it is preferable that the insulator 224 in contact with the oxide 230 release oxygen by heating. In this specification and the like, oxygen that is released by heating is referred to as excess oxygen in some cases. For example, silicon oxide, silicon oxynitride, or the like is used as appropriate for the insulator 224. When an insulator containing oxygen is provided in contact with the oxide 230, oxygen vacancies in the oxide 230 can be reduced and the reliability of the transistor 200 can be improved.

As the insulator 224, specifically, an oxide film from which part of oxygen is released by heating is preferably used. An oxide film that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

Note that the insulator 224 can be deposited by a sputtering method, a CVD method, an MBE method, a PLD method, an ALD method, or the like. In this embodiment, for example, silicon oxynitride deposited by a CVD method can be used for the insulator 224. Although the transistor 200 illustrated in FIG. 11 has a structure in which the insulator 224 has an island shape, this embodiment is not limited thereto. For example, a structure can be employed in which the insulator 224 covers the entire surface of the insulator 222.

The insulator 222 preferably functions as a barrier insulating film that inhibits impurities such as water and hydrogen from diffusing into the transistor 200 from the substrate side. For example, the insulator 222 preferably has lower hydrogen permeability than the insulator 224. By surrounding the insulator 224, the oxide 230, and the like with the insulator 222 and the insulator 254, the entry of impurities such as water and hydrogen from the outside into the insulator 224 and the oxide 230 can be inhibited.

It is preferable that the insulator 222 have a function of inhibiting diffusion of oxygen (e.g., at least one of an oxygen atom, an oxygen molecule, and the like) (through which oxygen is less likely to pass). For example, the insulator 222 preferably has lower oxygen permeability than the insulator 224. When the insulator 222 has a function of inhibiting diffusion of oxygen or impurities, oxygen contained in the oxide 230 can be inhibited from diffusing into the substrate side, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and diffusion of impurities such as hydrogen from the periphery of the transistor 200 into the oxide 230. Note that among the above-described materials, it is particularly preferable to use hafnium oxide for the insulator 222. For example, in the case where the insulator 222 is used as a gate insulating film, using hafnium oxide for the insulator 222 can reduce the density of interface states compared to the case of using aluminum oxide in some cases.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate (SrTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 can be deposited by a sputtering method, a CVD method, an MBE method, a PLD method, an ALD method, or the like. In this embodiment, for example, hafnium oxide deposited by an ALD method can be used for the insulator 222.

In addition, as illustrated in FIG. 11(C), the thickness of the insulator 222 in a region overlapping with the oxide 230$b$ is smaller than the thickness of the insulator 222 in the other regions in some cases. It is preferable that the thickness of the insulator 222 in a region not overlapping with the oxide 230$b$ be thick enough to function as an etching stopper film at the time of forming an opening provided in the insulator 280 or the like, or be thick enough to inhibit the surface of the insulator 216 or the conductor 205 from being exposed.

Note that the insulator 222 and the insulator 224 may each have a stacked-layer structure of two or more layers. In that case, without limitation to a stacked-layer structure formed of the same material, a stacked-layer structure formed of different materials may be employed. For example, an insulator similar to the insulator 224 may be provided below the insulator 222.

The oxide 230 includes the oxide 230$a$, the oxide 230$b$ over the oxide 230$a$, and the oxide 230$c$ over the oxide 230$b$. Including the oxide 230$a$ below the oxide 230$b$ makes it possible to inhibit diffusion of impurities into the oxide 230$b$ from the components formed below the oxide 230$a$. Moreover, including the oxide 230$c$ over the oxide 230$b$ makes it possible to inhibit diffusion of impurities into the oxide 230$b$ from the components formed above the oxide 230$c$.

Note that the oxide 230 preferably has a stacked-layer structure of oxides that differ in the atomic ratio of metal atoms. Specifically, the atomic ratio of the element M to the constituent elements in the metal oxide used for the oxide 230$a$ is preferably greater than the atomic ratio of the element M to the constituent elements in the metal oxide used for the oxide 230$b$. Moreover, the atomic ratio of the element M to In in the metal oxide used for the oxide 230$a$ is preferably greater than the atomic ratio of the element M to In in the metal oxide used for the oxide 230$b$. Furthermore, the atomic ratio of In to the element M in the metal oxide used for the oxide 230$b$ is preferably greater than the atomic ratio of In to the element M in the metal oxide used for the oxide 230$a$. A metal oxide that can be used for the oxide 230$a$ or the oxide 230$b$ can be used for the oxide 230$c$.

The oxide 230$b$ and the oxide 230$c$ preferably have crystallinity. For example, a CAAC-OS described later is preferably used. An oxide having crystallinity, such as a CAAC-OS, has a dense structure with small amounts of impurities and defects (oxygen vacancies or the like) and high crystallinity. This can inhibit oxygen extraction from the oxide 230$b$ by the source electrode or the drain electrode. This can reduce oxygen extraction from the oxide 230$b$ even when heat treatment is performed; thus, the transistor 200 is stable with respect to high temperatures in a manufacturing process (what is called thermal budget).

The conduction band minimum of each of the oxide 230$a$ and the oxide 230$c$ is preferably closer to the vacuum level than the conduction band minimum of the oxide 230$b$. In other words, the electron affinity of each of the oxide 230$a$ and the oxide 230$c$ is preferably smaller than the electron affinity of the oxide 230$b$. In that case, a metal oxide that can be used for the oxide 230$a$ is preferably used for the oxide 230$c$. Specifically, the atomic proportion of the element M in constituent elements in the metal oxide used for the oxide 230$c$ is preferably higher than the atomic proportion of the element M in constituent elements in the metal oxide used for the oxide 230$b$. Moreover, the atomic ratio of the element M to In in the metal oxide used for the oxide 230$c$ is preferably higher than the atomic ratio of the element M to In in the metal oxide used for the oxide 230$b$. Furthermore, the atomic ratio of In to the element M in the metal oxide used for the oxide 230$b$ is preferably higher than the atomic ratio of In to the element M in the metal oxide used for the oxide 230$c$.

In the case where the oxide 230$c$ has a stacked-layer structure including an oxide 230$c$1 and an oxide 230$c$2 over the oxide 230$c$1, the conduction band minimums of the oxide 230$a$ and the oxide 230$c$2 are preferably closer to the vacuum level than the conduction band minimums of the oxide 230$b$ and the oxide 230$c$1. In other words, the electron affinity of each of the oxide 230$a$ and the oxide 230$c$2 is preferably smaller than the electron affinity of each of the oxide 230$b$ and the oxide 230$c$1. In that case, it is preferable that a metal oxide that can be used as the oxide 230$a$ be used as the oxide 230$c$2, and a metal oxide that can be used as the oxide 230$b$ be used as the oxide 230$c$1.

The conduction band minimum gradually changes at a junction portion of the oxide 230$a$, the oxide 230$b$, and the oxide 230$c$. In other words, the conduction band minimum at a junction portion of the oxide 230$a$, the oxide 230$b$, and the oxide 230$c$ continuously changes or is continuously connected. To obtain this, the density of defect states in a mixed layer formed at an interface between the oxide 230$a$ and the oxide 230$b$ and an interface between the oxide 230$b$ and the oxide 230$c$ is preferably made low.

Specifically, when the oxide 230$a$ and the oxide 230$b$ or the oxide 230$b$ and the oxide 230$c$ contain the same element (as a main component) in addition to oxygen, a mixed layer with a low density of defect states can be formed. For example, in the case where the oxide 230$b$ is an In—Ga—Zn oxide, an In—Ga—Zn oxide, a Ga—Zn oxide, a gallium oxide, or the like may be used for the oxide 230$a$ and the oxide 230$c$. In the case where the oxide 230$c$ has a stacked-layer structure of the oxide 230$c$1 and the oxide 230$c$2, it is possible to employ, for example, a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, a stacked-layer structure of an In—Ga—Zn oxide and an oxide that does not contain In may be used for the oxide 230$c$.

Specifically, as the oxide 230$a$, a metal oxide with In:Ga:Zn=1:3:4 [atomic ratio] or In:Ga:Zn=1:1:0.5 [atomic ratio] is used. As the oxide 230$b$, a metal oxide with In:Ga:Zn=4:2:3 [atomic ratio] or In:Ga:Zn=3:1:2 [atomic ratio] is used. As the oxide 230$c$, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230$c$ having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230*b* or the oxide 230*c* serves as a main carrier path. Alternatively, in the case where the oxide 230*c* has a stacked-layer structure including the oxide 230*c*1 and the oxide 230*c*2, not only the oxide 230*b* but also the oxide 230*c*1 serves as a main carrier path in some cases. When the oxide 230*a* and the oxide 230*c* have the above structure, the density of defect states at the interface between the oxide 230*a* and the oxide 230*b* and the interface between the oxide 230*b* and the oxide 230*c* can be made low. Thus, the influence of interface scattering on carrier conduction is small, and the transistor 200 can have high on-state current and high frequency characteristics. Note that in the case where the oxide 230*c* has a stacked-layer structure, in addition to the reduction of density of defect states at the interface between the oxide 230*b* and the oxide 230*c*, the inhibition of diffusion of the constituent element of the oxide 230*c* to the insulator 250 side is expected. More specifically, since the oxide 230*c* has a stacked-layer structure in which an oxide that does not contain In is positioned in the upper layer, the diffusion of In into the insulator 250 side can be inhibited. Since the insulator 250 functions as a gate insulator, the transistor exhibits poor characteristics when In enters the insulator 250 and the like. Thus, when the oxide 230*c* has a stacked-layer structure, a highly reliable semiconductor device can be provided.

A metal oxide functioning as a semiconductor is preferably used as the oxide 230. For example, as the metal oxide to be the region 234, it is preferable to use a metal oxide having a bandgap of 2 eV or more, preferably 2.5 eV or more. With the use of a metal oxide having such a wide bandgap, the off-state current of the transistor can be reduced. With the use of such a transistor, a semiconductor device with low power consumption can be provided.

Note that the oxide 230*a*, the oxide 230*b*, and the oxide 230*c* can be deposited by a sputtering method, a CVD method, an MBE method, a PLD method, an ALD method, or the like. In the case of deposition by a sputtering method, oxygen or a mixed gas of oxygen and a rare gas is preferably used as a sputtering gas. Furthermore, when deposition is performed while the substrate is heated, the crystallinity of the oxide film can be improved.

In this embodiment, as the oxide 230*a*, a metal oxide deposited by a sputtering method using an In—Ga—Zn oxide target with In:Ga:Zn=1:3:4 [atomic ratio] can be used, for example. As the oxide 230*b*, a metal oxide deposited by a sputtering method using an In—Ga—Zn oxide target with In:Ga:Zn=4:2:4.1 [atomic ratio] can be used, for example. As the oxide 230*c*1, a metal oxide deposited by a sputtering method using an In—Ga—Zn oxide target with In:Ga:Zn=4:2:4.1 [atomic ratio] can be used, for example. As the oxide 230*c*2, a metal oxide deposited by a sputtering method using an In—Ga—Zn oxide target with In:Ga:Zn=1:3:4 [atomic ratio] can be used, for example.

The conductor 242 (the conductor 242*a* and the conductor 242*b*) functioning as the source electrode and the drain electrode is provided over the oxide 230*b*. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

Note that the conductor 242 can be deposited by a sputtering method, a CVD method, an MBE method, a PLD method, an ALD method, or the like. In this embodiment, for example, tantalum nitride deposited by a sputtering method can be used for the conductor 242.

Like the insulator 214 and the like, the insulator 254 preferably functions as a barrier insulating film that inhibits the diffusion of impurities such as water or hydrogen into the transistor 200 from the insulator 280 side. For example, the insulator 254 preferably has lower hydrogen permeability than the insulator 224. As illustrated in FIG. 11(B), insulator 254 is preferably in contact with the top surface and side surface of the conductor 242*a*, the top surface and side surface of the conductor 242*b*, the side surfaces of the oxide 230*a* and the oxide 230*b*, and the side surface of the insulator 224. In such a structure, the insulator 280 is isolated from the insulator 224 and the oxide 230 by the insulator 254. Accordingly, diffusion of hydrogen contained in the insulator 280 from the top surfaces or side surfaces of the conductor 242*a*, the conductor 242*b*, the oxide 230*a*, the oxide 230*b*, and the insulator 224 into the oxide 230 can be inhibited, so that the transistor 200 can have favorable electrical characteristics and reliability.

It is also preferable that the insulator 254 have a function of inhibiting diffusion of oxygen (e.g., at least one of an oxygen atom, an oxygen molecule, and the like) (through which oxygen is less likely to pass). For example, the insulator 254 preferably has lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Accordingly, oxygen can be supplied from the region to the oxide 230 through the insulator 224. Here, with the insulator 254 having a function of inhibiting upward oxygen diffusion, oxygen can be prevented from diffusing from the oxide 230 into the insulator 280. Moreover, with the insulator 222 having a function of inhibiting downward oxygen diffusion, oxygen can be prevented from diffusing from the oxide 230 into the substrate side. In this manner, oxygen is supplied to the channel formation region of the oxide 230. Accordingly, oxygen vacancies in the oxide 230 can be reduced, so that the transistor can be inhibited from becoming normally on.

An insulator containing an oxide of one or both of aluminum and hafnium is preferably deposited as the insulator 254, for example. Note that as the insulator containing an oxide of one or both of aluminum and hafnium, aluminum oxide, hafnium oxide, an oxide containing aluminum and hafnium (hafnium aluminate), or the like is preferably used. In this case, the insulator 254 is preferably deposited by an ALD method. An ALD method is a deposition method that provides good coverage, and thus can prevent formation of disconnection or the like due to unevenness of the insulator 254.

As described above, the insulator 224 and the metal oxide 230 are covered with the insulator 254 having a barrier property against hydrogen, whereby the insulator 280 is isolated from the insulator 224 and the metal oxide 230. Accordingly, the entry of impurities such as hydrogen from the outside of the transistor 200 can be inhibited, and the transistor 200 can have favorable electrical characteristics and reliability.

An insulator containing aluminum nitride may be used as the insulator 254, for example. It is preferable to use a nitride insulator that satisfies the composition formula AlNx (x is a real number greater than 0 and less than or equal to 2, preferably x is a real number greater than 0.5 and less than or equal to 1.5) as the insulator 254. Accordingly, a film having an excellent insulating property and high thermal conductivity can be obtained, and thus dissipation of heat generated in driving the transistor 200 can be increased. Alternatively, aluminum titanium nitride, titanium nitride, or the like can be used for the insulator 254. In that case, deposition by a sputtering method is preferable because deposition can be performed without using a highly-oxidizing gas such as oxygen or ozone as a deposition gas. Alternatively, silicon nitride, silicon nitride oxide, or the like can be used.

The insulator 254 can have a multilayer structure of two or more layers. For example, the insulator 254 may have a two-layer structure in which the first layer is deposited by a sputtering method in an oxygen-containing atmosphere, after which the second layer is deposited by an ALD method. An ALD method is a deposition method achieving excellent step coverage, and thus can prevent formation of disconnection or the like due to unevenness of the first layer. Note that in the case where the insulator 254 has a multi-layer structure of two or more layers, the multi-layer structure may be formed of different materials. For example, a stacked-layer structure of silicon oxide, silicon oxynitride, silicon nitride oxide, or silicon nitride and an insulator having a function of inhibiting permeation of oxygen and impurities such as hydrogen. As the insulator having a function of inhibiting permeation of oxygen and impurities such as hydrogen, an insulator containing an oxide of one or both of aluminum and hafnium can be used, for example.

The insulator 250 functions as a gate insulator. The insulator 250 is preferably provided in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulator 224, the insulator 250 is preferably formed using an insulator from which oxygen is released by heating. When an insulator from which oxygen is released by heating is provided as the insulator 250 in contact with the top surface of the oxide 230c, oxygen can be effectively supplied to the region 234 of the oxide 230b. Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Note that the insulator 250 can be deposited by a sputtering method, a CVD method, an MBE method, a PLD method, an ALD method, or the like. In this embodiment, for example, silicon oxynitride formed by a CVD method can be used for the insulator 250.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. Furthermore, oxidation of the conductor 260 due to oxygen from the insulator 250 can be inhibited.

Note that the metal oxide functions as part of the gate insulator in some cases. Therefore, when silicon oxide, silicon oxynitride, or the like is used for the insulator 250, a metal oxide that is a high-k material with a high dielectric constant is preferably used as the metal oxide. When the gate insulator has a stacked-layer structure of the insulator 250 and the metal oxide, the stacked-layer structure can have thermal stability and high dielectric constant. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

The metal oxide may function as part of the first gate electrode. For example, an oxide semiconductor that can be used for the oxide 230 can be used as the metal oxide. In that case, when the conductor 260 is deposited by a sputtering method, the metal oxide can have a reduced electric resistance to be a conductor. This can be referred to as an OC (Oxide Conductor) electrode.

With the metal oxide, the on-state current of the transistor 200 can be increased without a reduction in the influence of the electric field from the conductor 260. Since the distance between the conductor 260 and the oxide 230 is kept by the physical thicknesses of the insulator 250 and the metal oxide, a leakage current between the conductor 260 and the oxide 230 can be reduced. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

Specifically, a metal oxide containing one kind or two or more kinds selected from hafnium, aluminum, gallium, yttrium, zirconium, tungsten, titanium, tantalum, nickel, germanium, magnesium, and the like can be used. In particular, the insulator containing an oxide of one or both of aluminum and hafnium, such as aluminum oxide, hafnium oxide, or an oxide containing aluminum and hafnium (hafnium aluminate), is preferably used. Furthermore, the oxide semiconductor that can be used for the oxide 230 can also be used for the metal oxide when the resistance thereof is reduced.

Although FIG. 11 illustrates the conductor 260 having a two-layer structure, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure, for example, a stacked-layer structure of any of the above conductive materials and titanium or titanium nitride.

Note that the conductor 260 can be deposited by a sputtering method, a CVD method, an MBE method, a PLD method, an ALD method, or the like. In this embodiment, for example, titanium nitride deposited by a CVD method is used for the conductor 260a and titanium nitride deposited by a CVD method can be used for the conductor 260b.

The insulator 280 is provided over the insulator 222, the insulator 224, the oxide 230, and the conductor 242 with the insulator 254 therebetween. For example, as the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water and hydrogen in the insulator 280 is preferably reduced. In addition, the top surface of the insulator 280 may be planarized.

Note that the insulator 280 can be deposited by a sputtering method, a CVD method, an MBE method, a PLD method, an ALD method, or the like. In this embodiment, for example, silicon oxynitride deposited by a CVD method can be used for the insulator 280.

As in the insulator 214 or the like, the insulator 274 preferably functions as a barrier insulating film that inhibits impurities such as water and hydrogen from diffusing into the insulator 280 from above. As the insulator 274, for example, an insulator that can be used as the insulator 214, the insulator 254, or the like may be used.

Note that the insulator 274 can be deposited by a sputtering method, a CVD method, an MBE method, a PLD method, an ALD method, or the like. In this embodiment, for example, aluminum oxide deposited by a sputtering method can be used for the insulator 274.

An insulator 281 functioning as an interlayer film is preferably provided over the insulator 274. As in the insulator 224 or the like, the concentration of impurities such as water and hydrogen in the insulator 281 is preferably reduced.

Note that the insulator 281 can be deposited by a sputtering method, a CVD method, an MBE method, a PLD method, an ALD method, or the like. In this embodiment, for example, silicon nitride deposited by a CVD method can be used for the insulator 281.

The conductor 240a and the conductor 240b are placed in openings formed in the insulator 281, the insulator 274, the insulator 280, and the insulator 254. The conductor 240a and the conductor 240b are provided to face each other with the conductor 260 therebetween. Note that the level of the top surfaces of the conductor 240a and the conductor 240b may be on the same surface as the top surface of the insulator 281.

Note that the insulator 241a is provided in contact with the sidewall of the opening of the insulator 281, the insulator 274, the insulator 280, and the insulator 254 and the first conductor of the conductor 240a is formed on the side surface. The conductor 242a is positioned on at least part of the bottom portion of the opening, and thus the conductor 240a is in contact with the conductor 242a. Similarly, the insulator 241b is provided in contact with the sidewall of the opening of the insulator 281, the insulator 274, the insulator 280, and the insulator 254, and the first conductor of the conductor 240b is formed on the side surface. The conductor 242b is positioned on at least part of the bottom portion of the opening, and thus the conductor 240b is in contact with the conductor 242b.

For the conductor 240a and the conductor 240b, a conductive material containing tungsten, copper, or aluminum as its main component is preferably used. In addition, the conductor 240a and the conductor 240b may have a stacked-layer structure.

In the case where the conductor 240 has a stacked-layer structure, a conductive material having a function of inhibiting permeation of an impurity such as water or hydrogen is preferably used for a conductor in contact with the oxide 230a, the oxide 230b, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting the permeation of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 281 can be inhibited from entering the oxide 230 through the conductor 240a and the conductor 240b.

For the insulator 241a and the insulator 241b, an insulator that can be used for the insulator 254 is used, for example. Since the insulator 241a and the insulator 241b are provided in contact with the insulator 254, impurities such as water and hydrogen contained in the insulator 280 or the like can be inhibited from diffusing into the oxide 230 through the conductor 240a and the conductor 240b. In addition, oxygen contained in the insulator 280 can be prevented from being absorbed by the conductor 240a and the conductor 240b. Note that the insulator 241a and the insulator 241b can be formed by an ALD method or a CVD method.

In addition, although not illustrated, a conductor functioning as a wiring may be provided in contact with the top surface of the conductor 240a and the top surface of the conductor 240b. For the conductor functioning as a wiring, a conductive material containing tungsten, copper, or aluminum as its main component is preferably used. Furthermore, the conductor may have a stacked-layer structure; for example, stacked layers of the above conductive material, and titanium or titanium nitride. Note that the conductor may be formed to be embedded in an opening provided in an insulator.

In addition, although not illustrated, an insulator having resistivity higher than or equal to $1.0\times10^{13}\Omega\text{cm}$ and lower than or equal to $1.0\times10^{15}\Omega\text{cm}$, preferably higher than or equal to $5.0\times10^{13}\Omega\text{cm}$ and lower than or equal to $5.0\times10^{14}\Omega\text{cm}$ is preferably provided to cover the conductor. It is preferable that an insulator having resistivity in the above range be provided over the conductor, in which case the insulator can disperse electric charge accumulated in the transistor 200 or between wirings of the conductor or the like and can inhibit defects in characteristics and electrostatic breakdown of the transistor and an electronic device including the transistor due to the electric charge, while maintaining the insulating property.

As described above, according to one embodiment of the present invention, a semiconductor device with high on-state current can be provided. According to another embodiment of the present invention, a semiconductor device having high frequency characteristics can be provided. According to another embodiment of the present invention, a semiconductor device having favorable reliability can be provided. According to another embodiment of the present invention, a semiconductor device that can be miniaturized or highly integrated can be provided. According to another embodiment of the present invention, a semiconductor device having favorable electrical characteristics can be provided. According to another embodiment of the present invention, a semiconductor device with low off-state current can be provided. According to another embodiment of the present invention, a semiconductor device with reduced power consumption can be provided. According to another embodiment of the present invention, a semiconductor device with high productivity can be provided.

<Constituent Material of Semiconductor Device>

Constituent materials that can be used for the semiconductor device are described below.

The constituent materials described below can be deposited by a sputtering method, a CVD method, an MBE method, a PLD method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method does not use plasma and thus is a deposition method that enables less plasma damage to an object. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

An ALD method is also a deposition method that enables less plasma damage to an object. Thus, a film with few defects can be obtained. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening with a high aspect ratio, for example. On the other hand, an ALD method has a relatively low deposition rate, and thus is preferably used in combination with another deposition method with a high deposition rate, such as a CVD method, in some cases.

When a CVD method or an ALD method is used, the composition of a film to be obtained can be controlled with a flow rate ratio of source gases. For example, by a CVD method or an ALD method, a film with a certain composition can be formed depending on the flow rate ratio of the source gases. Moreover, with a CVD method or an ALD method, by changing the flow rate ratio of the source gases during deposition, a film whose composition is continuously changed can be formed. In the case of deposition while changing the flow rate ratio of source gases, as compared with the case of deposition with the use of a plurality of deposition chambers, time taken for the deposition can be shortened because time taken for transfer and pressure adjustment is not required. Thus, the productivity of the semiconductor device can be increased in some cases.

For the processing of the constituent material, a lithography method can be employed. For the processing, a dry etching method or a wet etching method can be employed. Processing by a dry etching method is suitable for microfabrication.

In the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that the above mask for the exposure of the resist to light is unnecessary in the case of using an electron beam or an ion beam because direct writing is performed on the resist. Note that the resist mask can be removed by, for example, dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed in the following manner: an insulating film or a conductive film that is the hard mask material is formed over the constituent material, a resist mask is formed thereover, and then the hard mask material is etched. The constituent material may be etched after removal of the resist mask or while the resist mask remains. In the latter case, the resist mask sometimes disappears during the etching. The hard mask may be removed by etching after the constituent material is etched. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

<<Substrate>>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate of silicon, germanium, or the like and a compound semiconductor substrate containing silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as a gate insulator, the voltage when the transistor operates can be reduced while the physical thickness of the gate insulator is kept. In contrast, when a material with low dielectric constant is used for the insulator functioning as an interlayer film, parasitic capacitance generated between wirings can be reduced. Thus, a material is preferably selected depending on the function of an insulator.

In addition, examples of the insulator with high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting the permeation of oxygen and impurities such as hydrogen (e.g., the insulator 214, the insulator 222, the insulator 254, the insulator 274, and the like), the electrical characteristics of the transistor can be stable. For the insulator having a function of inhibiting the permeation of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<<Conductor>>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

As the oxide 230, a metal oxide functioning as an oxide semiconductor is preferably used. A metal oxide that can be applied to the oxide 230 of the present invention is described below.

The metal oxide preferably includes at least indium or zinc. In particular, indium and zinc are preferably included. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

<Structure of Metal Oxide>

Oxide semiconductors (metal oxides) can be classified into a single crystal oxide semiconductor and a non-single-crystal oxide semiconductor. Examples of the non-single-crystal oxide semiconductor include a CAAC-OS, a polycrystalline oxide semiconductor, an nc-OS, an a-like OS, and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

Figure 13A:
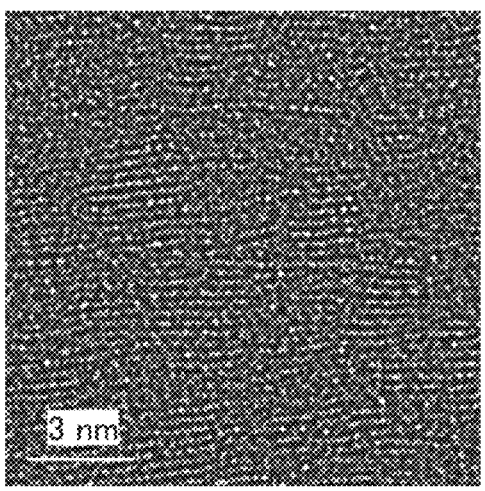
FIGS. 13A-13E A cross-sectional TEM image and plan-view TEM images of a CAAC-OS and images obtained through analysis thereof.

FIG. 13(A) shows a high-resolution TEM image of a cross section of the CAAC-OS that is observed with TEM from the direction substantially parallel to the sample surface. The high-resolution TEM image is obtained with a spherical aberration corrector (Spherical Aberration Corrector) function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 13(A) shows nanocrystals in which metal atoms are arranged in a layered manner. It is found that the size of a nanocrystal is greater than or equal to 1 nm or greater than or equal to 3 nm. A nanocrystal reflects unevenness of a formation surface or a top surface of the CAAC-OS and is parallel to the formation surface or the top surface of the CAAC-OS.

Figure 13B:
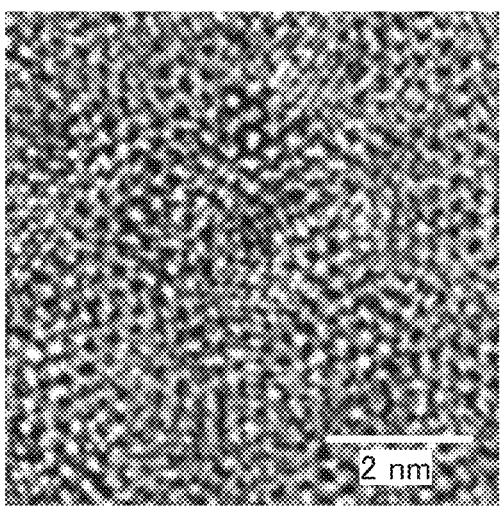
Figure 13C:
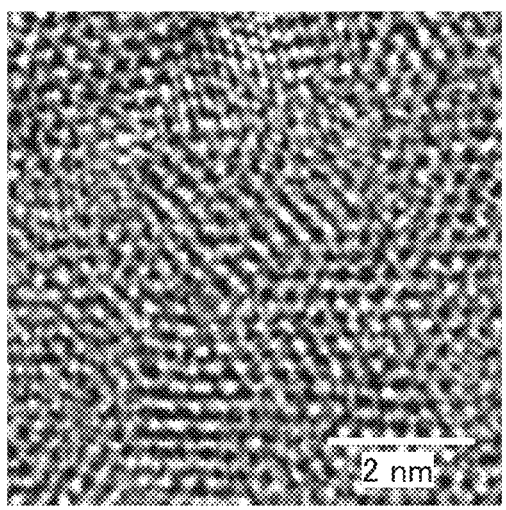
Figure 13D:
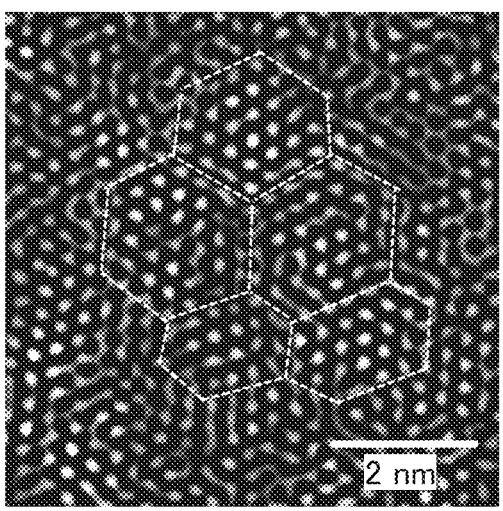
Figure 13E:
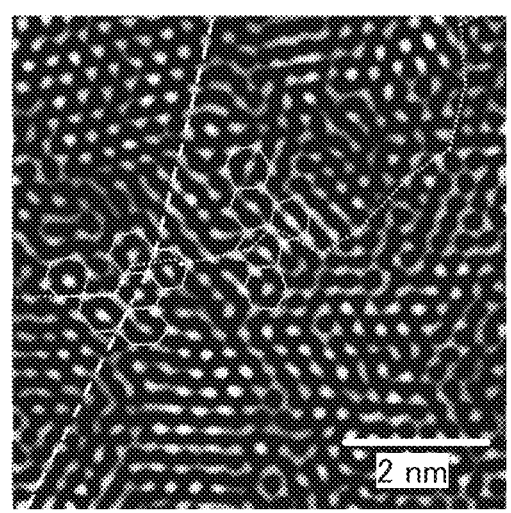

Furthermore, FIG. 13(B) and FIG. 13(C) show Cs-corrected high-resolution TEM images of a plane of the CAAC-OS observed from the direction substantially perpendicular to the sample surface. FIG. 13(D) and FIG. 13(E) are images obtained by image processing of FIG. 13(B) and FIG. 13(C). The method of image processing is described below. First, FIG. 13(B) is subjected to fast Fourier transform (FFT) to obtain an FFT image. Then, mask processing is performed such that a range of from 2.8 $nm^{-1}$ to 5.0 $nm^{-1}$ from the origin in the obtained FFT image remains. Next, the FFT image subjected to the mask processing is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted, and shows a lattice arrangement.

In FIG. 13(D), a portion where the lattice arrangement is broken is shown by dashed lines. A region surrounded by dashed lines corresponds to one nanocrystal. The portion denoted by the dashed line is a junction between nanocrystals. The dashed lines draw a hexagon, which means that the nanocrystal has a hexagonal shape. Thus, the CAAC-OS has a hexagonal lattice point when observed with TEM from the c-axis direction. Thus, it can be said that the CAAC-OS has a layered crystal structure illustrated in FIG. 1(C) in the above embodiment. Note that the shape of the nanocrystal is not always a regular hexagonal shape but is a non-regular hexagonal shape in some cases.

In FIG. 13(E), a dotted line denotes a portion where the direction of a lattice arrangement changes between a region with a regular lattice arrangement and another region with a regular lattice arrangement, and a dashed line denotes the change in the direction of the lattice arrangement. A clear grain boundary cannot be observed even in the vicinity of the dotted line. When a lattice point in the vicinity of the dotted line is regarded as a center and surrounding lattice points are joined, a distorted hexagon, a distorted pentagon, and/or a distorted heptagon can be formed, for example. That is, a lattice arrangement is distorted so that formation of a grain boundary is inhibited. This is probably because the CAAC-OS can tolerate distortion owing to the low density of oxygen atom arrangement in the a-b plane direction, a change in interatomic bond distance by replacement of a metal element, and the like.

Figure 14A:
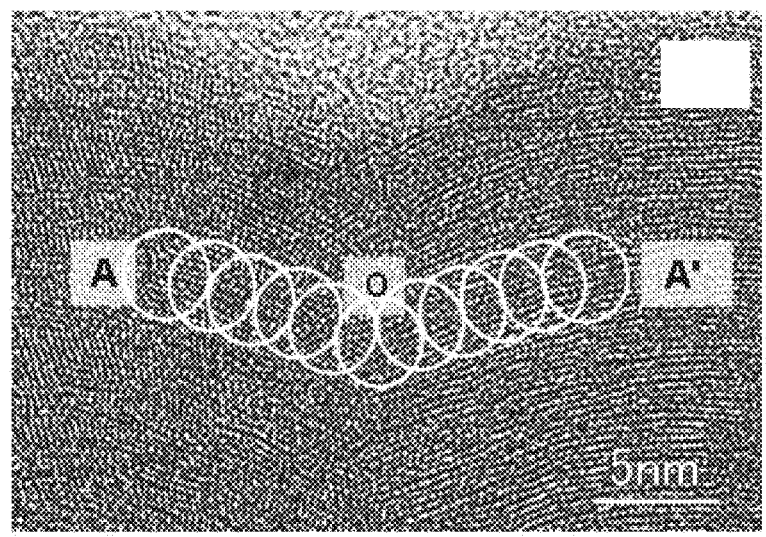
FIGS. 14A-14C Cross-sectional TEM images and a local Fourier transform image of an oxide semiconductor.
Figure 14B:

FIG. 14(A) shows a high-resolution TEM image of a cross section of a CAAC-OS different from that in FIG. 13. FIG. 14(B) is a high-resolution cross-sectional TEM image obtained by enlarging the image of FIG. 14(A), and atomic arrangement is highlighted for easy understanding in FIG. 14(B).

Figure 14C:
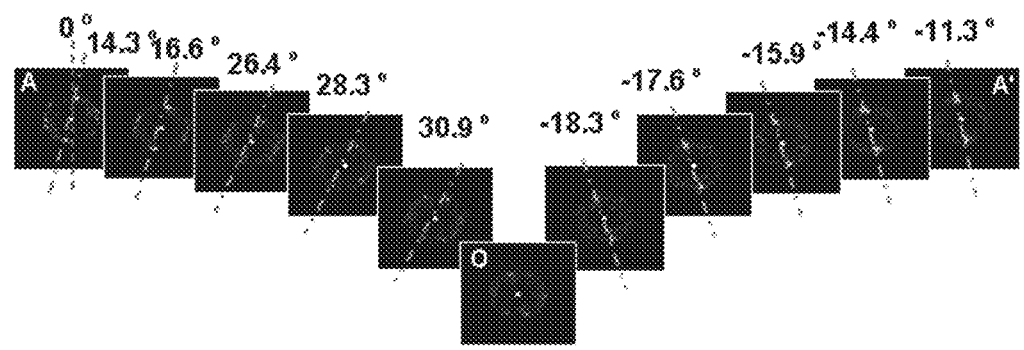

FIG. 14(C) is local Fourier transform images of regions each surrounded by a circle (the diameter is about 4 nm) in A-O-A' in FIG. 14(A). C-axis alignment can be observed in each region in FIG. 14(C). The c-axis direction in A-O is different from that in O-A', which indicates that these regions have different grains. In addition, in A-O, the angle of the c-axis changes gradually and continuously from 14.3° to 16.6° to 26.4°. Similarly, in O-A', the angle of the c-axis changes gradually and continuously from −18.3° to −17.6° to −15.9°.

From the results of the high-resolution cross-sectional TEM image and the high-resolution plan-view TEM image, alignment is found in the nanocrystals in the CAAC-OS.

Thus, as described in the above embodiment, it is found that the CAAC-OS has the c-axis alignment and the c-axis is aligned in a direction parallel to the normal vector of the formation surface of the CAAC-OS or the film surface of the CAAC-OS. Thus, each metal atom layer arranged in a layered manner observed in the high-resolution cross-sectional TEM image corresponds to a plane parallel to the a-b plane of the nanocrystal.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Impurities]

Here, the influence of each impurity in the metal oxide will be described.

When the metal oxide contains an alkali metal or an alkaline earth metal, defect states are formed and carriers are generated, in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by secondary ion mass spectrometry (SIMS) (the concentration obtained by SIMS) is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases.

Thus, a transistor using a metal oxide that contains hydrogen is likely to have normally on characteristics.

Accordingly, hydrogen in the metal oxide is preferably reduced as much as possible. Specifically, the hydrogen concentration of the metal oxide obtained by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide in which impurities are sufficiently reduced is used in a channel formation region of a transistor, stable electrical characteristics can be imparted.

Structure Example 2 of Semiconductor Device

FIG. 15 includes a top view and cross-sectional views of the transistor 200A of one embodiment of the present invention and the periphery of the transistor 200A.

FIG. 15(A) is a top view of the semiconductor device including the transistor 200A. FIG. 15(B) and FIG. 15(C) are cross-sectional views of the semiconductor device. Here, FIG. 15(B) is a cross-sectional view of a portion indicated by a dashed-dotted line A1-A2 in FIG. 15(A), and is a cross-sectional view of the transistor 200A in the channel length direction. FIG. 15(C) is a cross-sectional view of a portion indicated by a dashed-dotted line A3-A4 in FIG. 15(A), and is a cross-sectional view of the transistor 200A in the channel width direction. Note that for clarification of the drawing, some components are omitted in the top view of FIG. 15(A).

Note that in the semiconductor device illustrated in FIG. 15, structures having the same functions as the structures configuring the semiconductor device described in <Structure example 1 of semiconductor device> are denoted by the same reference numerals.

The structure of the semiconductor device is described below using FIG. 15. Note that the materials described in detail in <Structure example 1 of semiconductor device> can also be used as constituent materials of the semiconductor devices in this section.

[Transistor 200A]

As illustrated in FIG. 15, the transistor 200A includes the insulator 216 over a substrate (not illustrated); the conductor 205 placed to be embedded in the insulator 216; the insulator 222 placed over the insulator 216 and the conductor 205; the insulator 224 placed over the insulator 222; the oxide 230 (the oxide 230a, the oxide 230b, the oxide 230c1, and the oxide 230c2) placed over the insulator 224; the insulator 250 placed over the oxide 230; the conductor 260 (the conductor 260a and the conductor 260b) placed over the insulator 250; the conductor 242a and the conductor 242b in contact with part of a top surface of the oxide 230b; a barrier film 244a placed over the conductor 242a; a barrier film 244b placed over the conductor 242b; and the insulator 254 (an insulator 254a and an insulator 254b) placed in contact with part of a top surface of the insulator 222, a side surface of the insulator 224, a side surface of the oxide 230a, a side surface of the oxide 230b, a side surface of the conductor 242a, a top surface of the barrier film 244a, a side surface of the conductor 242b, and a top surface of the barrier film 244b.

The transistor 200A is different from the above-described transistor 200 in that the insulator 254 has a structure in which two layers of the insulator 254a and the insulator 254b are stacked, and the oxide 230c has a structure in which two layers of the oxide 230c1 and the oxide 230c2 are stacked. The portions different from those in the transistor 200 are described below.

As illustrated in FIG. 15, the insulator 254 includes the insulator 254a and the insulator 254b placed over the insulator 254a. For example, the insulator 254a preferably functions as a barrier film that inhibits diffusion of impurities such as water and hydrogen into the transistor 200A from the insulator 280 side. Furthermore, for example, the insulator 254b preferably inhibits diffusion of oxygen in the oxide 230 to the insulator 280 side. Such a structure in which two layers are stacked can prevent entry of hydrogen into the channel formation region of the oxide 230. In addition, release of oxygen from the channel formation region of the oxide 230 can be prevented. Specifically, silicon nitride deposited by a sputtering method may be used for the insulator 254a and aluminum oxide deposited by an ALD method may be used for the insulator 254b.

As another example, it is preferable that an insulating material including an excess-oxygen region or an insulating material in which an excess-oxygen region is likely to be formed be used for the insulator 254a, and an insulating material that is likely to form an excess-oxygen region in the film on which the material is formed be used for the insulator 254b. Specifically, silicon oxide deposited by a sputtering method is used as the insulator 254a, and aluminum oxide deposited by a sputtering method is used as the insulator 254b. The structure in which such two layers are stacked can efficiently supply excess oxygen contained in the insulator 254a to the oxide 230.

Note that in the case where the insulator 254a contains excess oxygen, it is preferable that the barrier film 244a be provided in contact with the top surface of the conductor 242a and the barrier film 244b be provided in contact with the top surface of the conductor 242b. The barrier film 244a and the barrier film 244b have a function of inhibiting permeation of oxygen and impurities such as water and hydrogen. Accordingly, excess oxygen in the oxide 230c and the insulator 250 can be prevented from diffusing into the conductor 242a and the conductor 242b. That is, surrounding excess oxygen can be prevented from being used for oxidation of the conductor 242a and the conductor 242b. Furthermore, an increase in electric resistance of the conductor 242a and the conductor 242b due to oxidation of the conductor 242a and the conductor 242b can be prevented. Note that the electric resistance values of the conductors can be measured by a two-terminal method or the like.

For the barrier film 244a and the barrier film 244b, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride may be used, for example.

For the barrier film 244a and the barrier film 244b, the above-described conductive material through which impurities are less likely to pass may be used. In the case where a conductive material is used for the barrier film 244a and the barrier film 244b, a conductive material from which oxygen is less likely to be released or by which oxygen is less likely to be absorbed is preferably used. Note that a structure may be employed in which the barrier film 244a and the barrier film 244b are not provided.

Note that the insulator 254 is not limited to having the structure in which the insulator 254a and the insulator 254b are stacked, and may be a single layer or have a structure in which three layers of the insulator 254a, the insulator 254b, and an insulator 254c are stacked. In the case of employing the structure in which the three layers are stacked, it is preferable, for example, that an insulating material having a function of inhibiting diffusion of oxygen and impurities such as water and hydrogen be used for the insulator 254a, an insulating material including an excess-oxygen region be used for the insulator 254b, and an insulating material having a function of inhibiting diffusion of oxygen be used for the insulator 254c. The structure in which such three layers are stacked can inhibit diffusion of excess oxygen contained in the insulator 254b to the outside of the insulator 254a and the insulator 254c. Thus, excess oxygen contained in the insulator 254b can be efficiently supplied to the oxide 230.

In the case where the insulator 254 has a structure in which two or more layers are stacked, a combination and the stacking order of insulating materials used for the insulator 254 are designed as appropriate for required transistor characteristics.

As illustrated in FIG. 15, the oxide 230c includes the oxide 230c1 and the oxide 230c2 placed over the oxide 230c1. The oxide 230c1 preferably contains at least one of the metal elements contained in the metal oxide used as the oxide 230b, and further preferably contains all of these metal elements. Accordingly, the density of defect states at the interface between the oxide 230b and the oxide 230c1 can be decreased. The oxide 230c2 is preferably a metal oxide that inhibits diffusion or permeation of oxygen more than the oxide 230c1. Providing the oxide 230c2 between the insulator 250 and the oxide 230c1 can inhibit diffusion of oxygen contained in the insulator 280 into the insulator 250. Therefore, the oxygen is more likely to be supplied to the oxide 230 through the oxide 230c1.

It is preferable that the oxide 230c1 and the oxide 230c2 have crystallinity, and it is more preferable that the crystallinity of the oxide 230c2 be higher than that of the oxide 230c1. In particular, a CAAC-OS is preferably used as the oxide 230c1 and the oxide 230c2; the c-axes of crystals included in the oxide 230c1 and the oxide 230c2 are preferably aligned in a direction substantially perpendicular to the formation surfaces or the top surfaces of the oxide 230c1 and the oxide 230c2. The CAAC-OS has a property such that oxygen is less likely to be moved in the c-axis direction. Therefore, providing the oxide 230c2 between the oxide 230c1 and the insulator 250 can inhibit diffusion of oxygen contained in the oxide 230c1 into the insulator 250 and efficiently supply the oxygen to the oxide 230.

Specifically, a metal oxide with In:Ga:Zn=4:2:3 [atomic ratio] is used as the oxide 230c1, and a metal oxide with In:Ga:Zn=1:3:4 [atomic ratio] is used as the oxide 230c2. When the atomic proportion of In in the constituent elements in the metal oxide used as the oxide 230c2 is made lower than the atomic proportion of In in the constituent elements in the metal oxide used as the oxide 230c1, diffusion of In to the insulator 250 side can be inhibited. Since the insulator 250 functions as a gate insulator, the transistor exhibits poor characteristics when In enters the insulator 250 and the like. Thus, when the oxide 230c has a stacked-layer structure, a highly reliable semiconductor device can be provided.

The insulator 280 may be provided to have a stacked-layer structure of two layers. In the case where the insulator 280 includes an insulator 280a and an insulator 280b placed over the insulator 280a as illustrated in FIG. 15, the insulator 280a preferably includes an excess-oxygen region. Since the insulator 280a has a shorter physical distance to the channel formation region of the oxide 230 than the insulator 280b, oxygen contained in the insulator 280 can be efficiently supplied to the channel formation region of the oxide 230.

Specifically, silicon oxide deposited by a sputtering method is used as the insulator 280a, and silicon oxynitride deposited by a CVD method is used as the insulator 280b. Although the insulator 280 having a stacked-layer structure is illustrated in the transistor 200A, the present invention is not limited thereto. For example, the insulator 280 may be provided as a single layer or to have a stacked-layer structure of three or more layers.

As illustrated in FIG. 15, an insulator 282 may be provided between the insulator 274 and the insulator 281. As the insulator 282, an insulating film having a function of inhibiting diffusion of oxygen and impurities such as hydrogen is preferably used. For example, silicon nitride, aluminum oxide, or the like is preferably deposited by a sputtering method, an ALD method, or the like. Providing the insulator 282 can inhibit diffusion of oxygen contained in the insulator 280, the insulator 250, and the like to the insulator 281 side.

Structure Example 3 of Semiconductor Device

FIG. 16 is a top view and cross-sectional views of a transistor 200B of one embodiment of the present invention and the periphery of the transistor 200B.

Figure 16A:
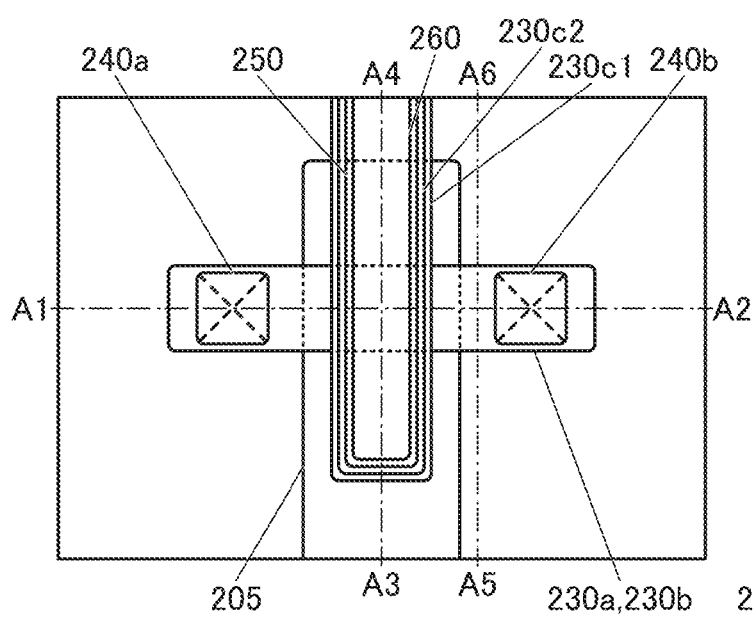
FIGS. 16A-16D Atop view and cross-sectional views of a semiconductor device of one embodiment of the present invention.
Figure 16C:
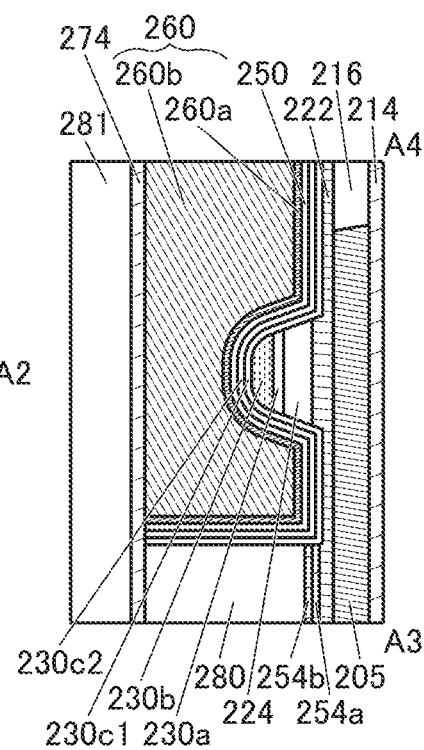
Figure 16B:
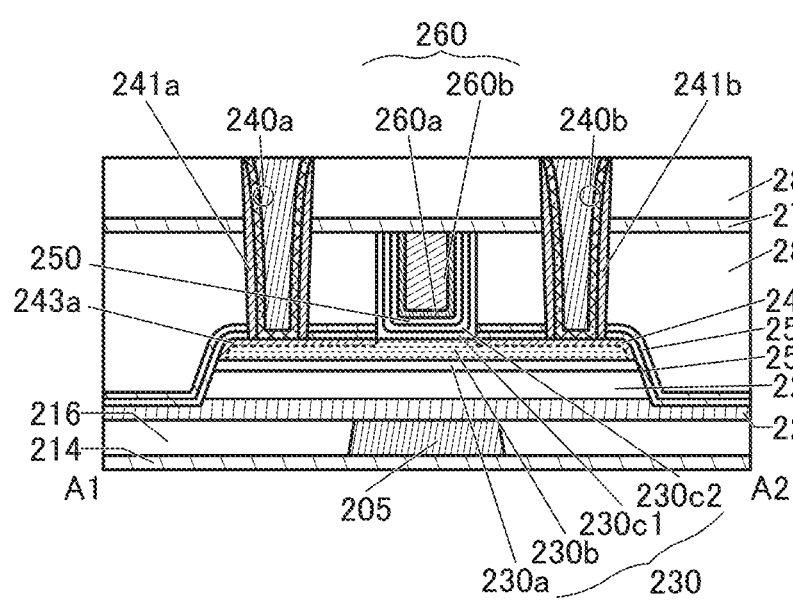
Figure 16D:
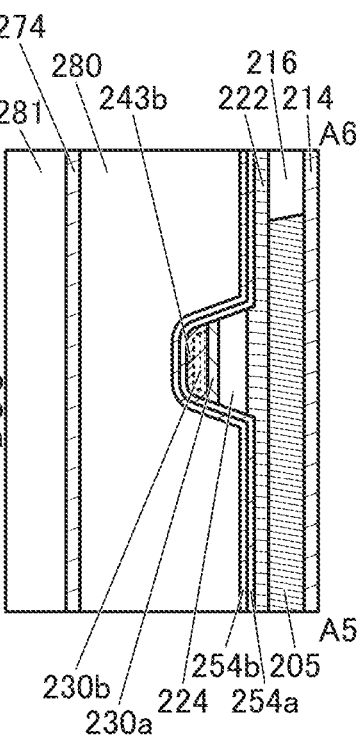

FIG. 16(A) is a top view of a semiconductor device including the transistor 200B. FIG. 16(B) to FIG. 16(D) are cross-sectional views of the semiconductor device. Here, FIG. 16(B) is a cross-sectional view of a portion indicated by a dashed-dotted line A1-A2 in FIG. 16(A), and is a cross-sectional view of the transistor 200B in the channel length direction. In addition, FIG. 16(C) is a cross-sectional view of a portion indicated by a dashed-dotted line A3-A4 in FIG. 16(A), and is a cross-sectional view of the transistor 200B in the channel width direction. FIG. 16(D) is a cross-sectional view of a portion indicated by a dashed-dotted line A5-A6 in FIG. 16(A), and is also a cross-sectional view of the vicinity of the region 243b functioning as a low-resistance region of the transistor 200B. Note that for clarification of the drawing, some components are omitted in the top view of FIG. 16(A).

Note that in the semiconductor device illustrated in FIG. 16, structures having the same functions as the structures configuring the semiconductor device described in <Structure example 1 of semiconductor device> or <Structure example 2 of semiconductor device> are denoted by the same reference numerals.

The structure of the semiconductor device is described below with reference to FIG. 16. Note that the materials described in detail in <Structure example 1 of semiconductor device> or <Structure example 2 of semiconductor device> can also be used as constituent materials of the semiconductor devices in this section.

[Transistor 200B]

As illustrated in FIG. 16, the transistor 200B includes the insulator 216 over a substrate (not illustrated); the conductor 205 placed to be embedded in the insulator 216; the insulator 222 placed over the insulator 216 and the conductor 205; the insulator 224 placed over the insulator 222; the oxide 230 (the oxide 230a, the oxide 230b, the oxide 230c1, and the oxide 230c2) placed over the insulator 224; the insulator 250 placed over the oxide 230; the conductor 260 (the conductor 260a and the conductor 260b) placed over the insulator 250; and the insulator 254 (the insulator 254a and the insulator 254b) placed in contact with part of the top surface of the insulator 222, the side surface of the insulator 224, the side surface of the oxide 230a, the side surface of the oxide 230b, and the top surface of the oxide 230b. Here, the region 243a and the region 243b are formed separately from each other on the top surface of the oxide 230b.

The transistor 200B is different from the aforementioned transistor 200 in that the conductor 242 is not provided. The portions different from those in the aforementioned transistor 200 are described below.

As illustrated in FIG. 16(B), the region 243a and the region 243b face each other with the conductor 260 sandwiched therebetween, and top surfaces of the regions are preferably in contact with the insulator 254. In a top view, it is preferable that side surfaces of the region 243a and the region 243b on the conductor 260 side be aligned with respective side surfaces of the conductor 260 or that the region 243a and the region 243b partly overlap with the conductor 260.

In the transistor 200B illustrated in FIG. 16, the region 243 (the region 243a and the region 243b) may be formed by adding as a dopant an element that can increase the carrier density of the oxide 230 and reduce the resistance thereof.

As the dopant, an element that forms an oxygen vacancy, an element that is bonded to an oxygen vacancy, or the like is used. Typical examples of the element include boron and phosphorus. Hydrogen, carbon, nitrogen, fluorine, sulfur, chlorine, titanium, a rare gas element, or the like can also be used. Typical examples of the rare gas include helium, neon, argon, krypton, and xenon. Furthermore, any one or more metal elements selected from metal elements such as aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum may be added. Among the above, boron and phosphorus are preferable as a dopant. In the case where boron or phosphorus is used as a dopant, manufacturing line apparatuses for amorphous silicon or low-temperature polysilicon can be used; thus, capital investment can be reduced. The concentration of the element is measured by SIMS or the like.

In particular, an element that easily forms an oxide is preferably used as an element to be added to the region 243. Typical examples of the element include boron, phosphorus, aluminum, and magnesium. The element added to the region 243 can deprive the oxide 230 of oxygen to form an oxide. As a result, many oxygen vacancies are generated in the region 243. When the oxygen vacancies and hydrogen in the oxide 230 are bonded to each other, carriers are generated, and accordingly, a region with extremely low resistance is formed. The element added to the region 243 exists in the state of a stable oxide in the region 243; thus, even when treatment that requires a high temperature is performed in a later step, the element is not easily released from the region 243. That is, the use of an element that easily forms an oxide as an element to be added to the region 243 enables formation of a region whose resistance is not easily increased even through a high-temperature process, in the oxide 230.

Here, it is preferable that the concentration of the above element in the region 243 be equal to or higher than the concentration of the above element in a portion in the oxide 230 where the region 243 is not formed. In addition, it is preferable that the number of oxygen vacancies included in the region 243 be equal to or larger than the number of oxygen vacancies in the portion of the oxide 230 where the region 243 is not formed. Accordingly, the region 243 has higher carrier density and lower resistance than the portion of the oxide 230 where the region 243 is not formed.

The formation of the region 243 functioning as the source region or the drain region in the oxide 230 enables the conductor 240 functioning as a plug to be connected to the region 243 without providing a source electrode and a drain electrode that are formed of metal.

When the dopant is added in this manner to form the region 243, the dopant is added also to the insulator 254a and the insulator 254b. That is, the oxide 230b, the insulator 254a, and the insulator 254b each include an element contained in the dopant. In the case where the insulator 254a and the insulator 254b contain excess oxygen, the dopant can inhibit diffusion of excess oxygen to the outside in some cases. By the formation of the region 243, the on-state current of the transistor 200B can be increased, Svalue (also referred to as Subthreshold Swing or SS) can be made favorable, and the frequency characteristics can be improved.

In the case where the region 243 is formed by addition of a dopant, for example, a dummy gate is formed in a position where the oxide 230c1, the oxide 230c2, the insulator 250, and the conductor 260 are provided and addition of a dopant is performed with the use of the dummy gate as a mask. In that case, the region 243 containing the element can be formed in a region of the oxide 230 that does not overlap with the dummy gate.

As a method for adding a dopant, an ion implantation method in which an ionized source gas is subjected to mass separation and then added, an ion doping method in which an ionized source gas is added without mass separation, a plasma immersion ion implantation method, or the like can be used. In the case of performing mass separation, an ion species to be added and its concentration can be adjusted precisely. On the other hand, in the case of not performing mass separation, ions at a high concentration can be added in a short time. Alternatively, an ion doping method in which atomic or molecular clusters are generated and ionized may be used. Note that a dopant may be referred to as an ion, a donor, an acceptor, an impurity, an element, or the like.

By adding an element that forms an oxygen vacancy to the region 243 and performing heat treatment, hydrogen contained in the region 234 functioning as a channel formation region can be trapped by an oxygen vacancy included in the region 243, in some cases. Thus, the transistor 200B can have stable electrical characteristics and improved reliability.

In FIG. 16, the oxide 230c is illustrated as a stacked layer of the oxide 230c1 and the oxide 230c2 and the insulator 254 is illustrated as a stacked layer of the insulator 254a and the insulator 254b as in the transistor 200A; however, the present invention is not limited thereto. The oxide 230c and the insulator 254 may be a single layer or may have a stacked-layer structure of three or more layers.

Structure Example 4 of Semiconductor Device

FIG. 17 includes a top view and cross-sectional views of a transistor 200C of one embodiment of the present invention and the periphery of the transistor 200C.

Figure 17A:
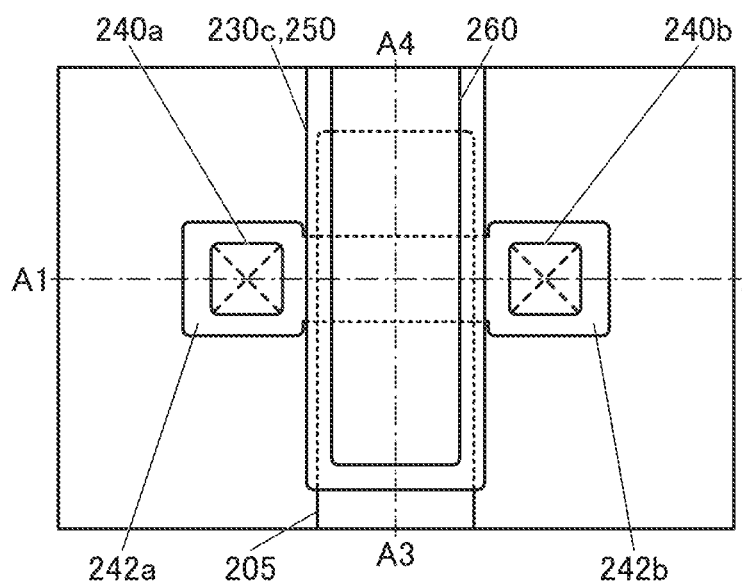
FIGS. 17A-17C Atop view and cross-sectional views of a semiconductor device of one embodiment of the present invention.
Figure 17C:
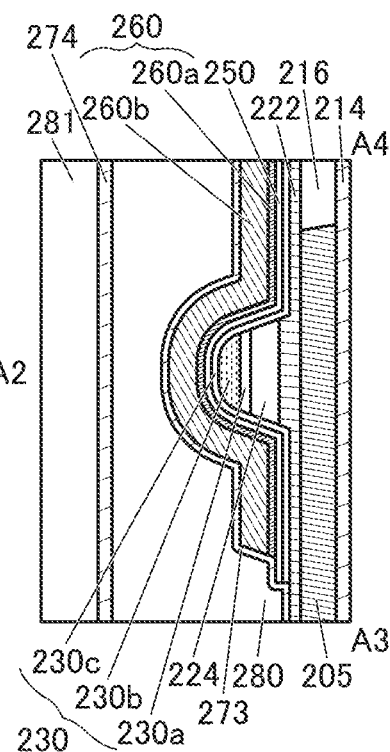
Figure 17B:
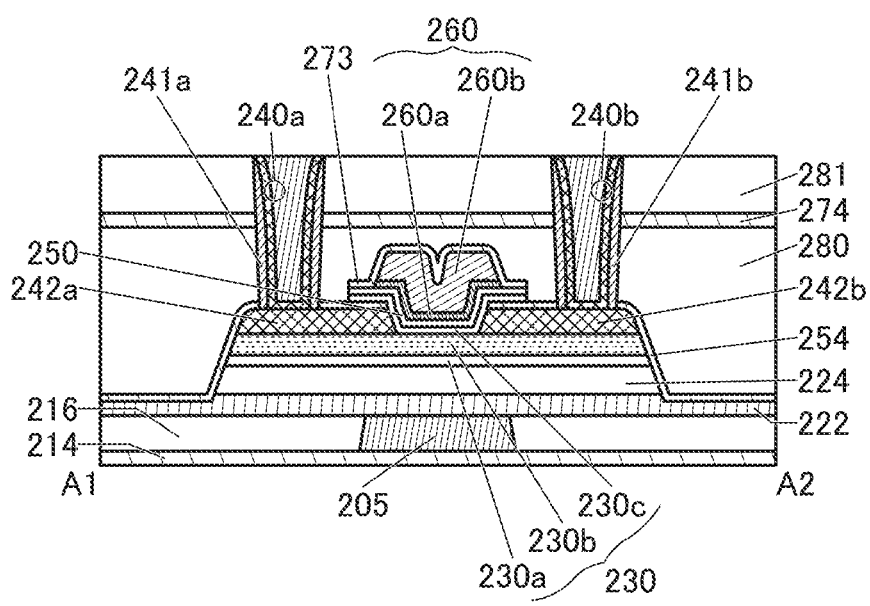

FIG. 17(A) is a top view of a semiconductor device including the transistor 200C. FIG. 17(B) and FIG. 17(C) are cross-sectional views of the semiconductor device. Here, FIG. 17(B) is a cross-sectional view of a portion indicated by a dashed-dotted line A1-A2 in FIG. 17(A), and is a cross-sectional view of the transistor 200C in the channel length direction. FIG. 17(C) is a cross-sectional view of a portion indicated by a dashed-dotted line A3-A4 in FIG. 17(A), and is a cross-sectional view of the transistor 200C in the channel width direction. Note that for clarification of the drawing, some components are omitted in the top view of FIG. 17(A).

Note that in the semiconductor device illustrated in FIG. 17, structures having the same functions as the structures configuring the semiconductor device described in <Structure 1 example of semiconductor device> are denoted by the same reference numerals.

The structure of the semiconductor device is described below with reference to FIG. 17. Note that the materials described in detail in <Structure example 1 of semiconductor device> can also be used as constituent materials of the semiconductor devices in this section.

[Transistor 200C]

As illustrated in FIG. 17, the transistor 200C includes the insulator 216 placed over a substrate (not illustrated); the conductor 205 placed to be embedded in the insulator 216; the insulator 222 placed over the insulator 216 and the conductor 205; the insulator 224 placed over the insulator 222; the oxide 230 (the oxide 230a, the oxide 230b, and the oxide 230c) placed over the insulator 224; the insulator 250 placed over the oxide 230; the conductor 260 (the conductor 260a and the conductor 260b) placed over the insulator 250; the conductor 242a and the conductor 242b in contact with part of the top surface of the oxide 230b; the insulator 254 placed in contact with part of the top surface of the insulator 222, the side surface of the insulator 224, the side surface of the oxide 230a, the side surface of the oxide 230b, the side surface of the conductor 242a, the top surface of the conductor 242a, the side surface of the conductor 242b, the top surface of the conductor 242b, and part of the oxide 230c; and an insulator 273 placed to cover the conductor 260.

The transistor 200C is different from the above-described transistor 200 in that the insulator 273 is included, parts of the oxide 230c, the insulator 250, and the conductor 260 overlap with the conductor 242, and the insulator 280 is provided over the oxide 230c, the insulator 250, and the conductor 260. The portions different from those in the transistor 200 are described below.

In the transistor 200C, the conductor 260 includes a region overlapping with the conductor 242a with the insulator 250 therebetween and a region overlapping with the conductor 242b with the insulator 250 therebetween. When the conductor 260 has such a shape, the conductor 260 can have a margin for alignment; thus, the conductor 260 can surely overlap with the region of the oxide 230 between the conductor 242a and the conductor 242b, so that formation of an offset region can be prevented.

It is preferable that, like the insulator 254 or the like, the insulator 273 have a function of inhibiting diffusion of oxygen (e.g., at least one of oxygen atoms, oxygen molecules, and the like) (or that the above oxygen be less likely to pass through the insulator). For example, the insulator 273 preferably has lower oxygen permeability than the insulator 280 or the insulator 224. Covering the conductor 260 with such an insulator 273 can inhibit the oxidation of the conductor 260.

As in the insulator 254 or the like, the insulator 273 preferably functions as a barrier insulating film that inhibits impurities such as water and hydrogen from diffusing into the conductor 260 from the insulator 280 side. For example, the insulator 273 preferably has lower hydrogen permeability than the insulator 224.

Although FIG. 17 employs a structure in which the insulator 273 covers the conductor 260 and is in contact with the top surface of the insulator 250, the present invention is not limited thereto. For example, a structure may be employed in which the insulator 273 covers the conductor 260, the insulator 250, and the oxide 230c and is in contact with the insulator 254.

The structure, method, and the like described above in this embodiment can be used in appropriate combination with structures, methods, and the like described in the other embodiments and the examples.

Embodiment 3

In this embodiment, one embodiment of a semiconductor device will be described with reference to FIG. 18 and FIG. 19.

[Memory Device 1]

Figure 18:
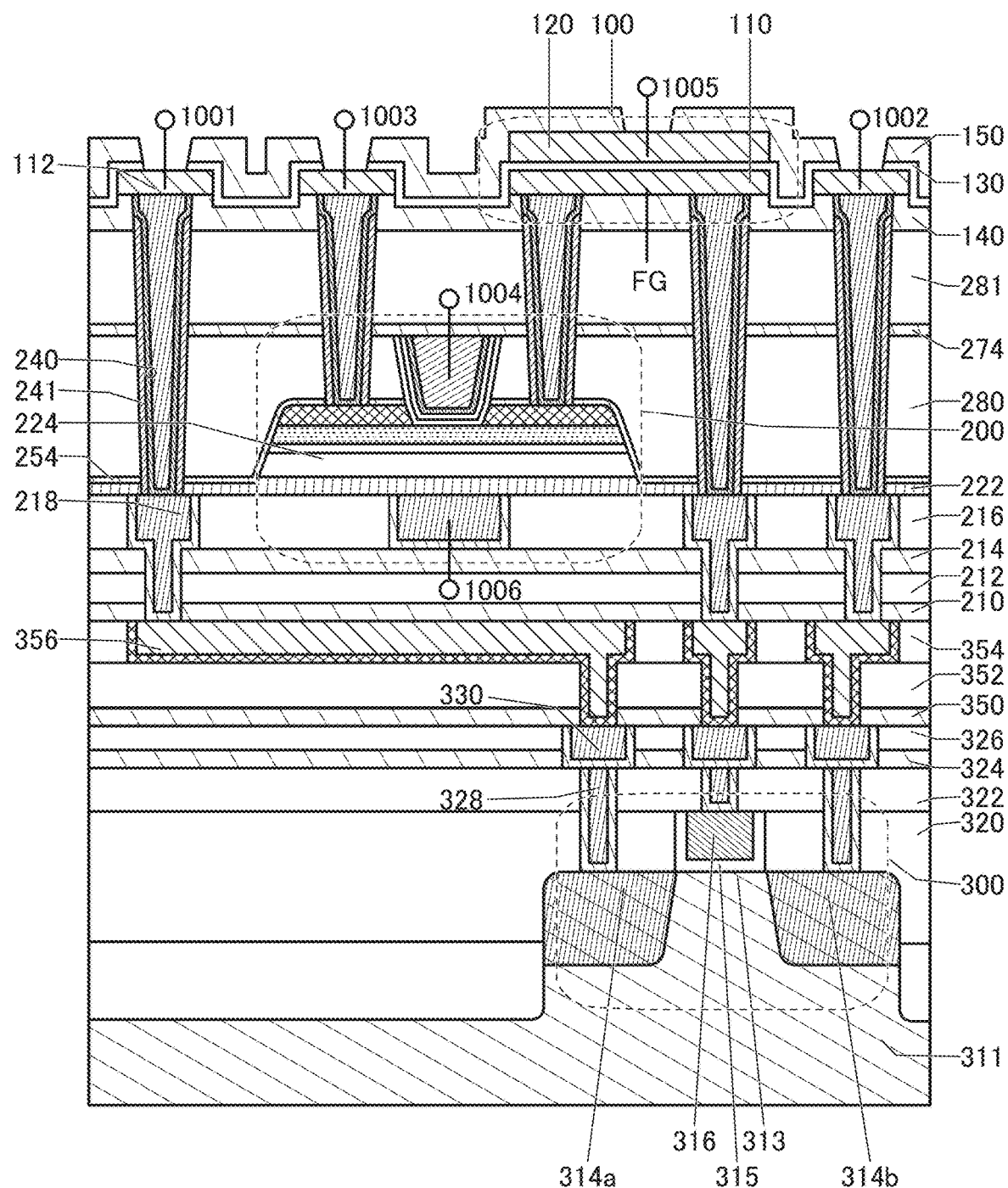
FIG. 18 A cross-sectional view illustrating a structure of a memory device of one embodiment of the present invention.

FIG. 18 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Note that the transistor 200 described in the above embodiment can be used as the transistor 200, for example.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the semiconductor device illustrated in FIG. 18, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100.

By arranging the memory devices illustrated in FIG. 18 in a matrix, a memory cell array can be formed.

<Transistor 300>

The transistor 300 is provided over a substrate 311 and includes a conductor 316 functioning as a gate electrode, an insulator 315 functioning as a gate insulator, a semiconductor region 313 that is a part of the substrate 311, and a low-resistance region 314a and a low-resistance region 314b functioning as the source region and the drain region. The transistor 300 is of either a p-channel type or an n-channel type.

In the transistor 300 illustrated in FIG. 18, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Note that a material for adjusting the work function may be used for the conductor 316. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 18 is an example and the structure is not limited thereto; an appropriate transistor is used in accordance with a circuit configuration or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric.

For example, a conductor 112 and the conductor 110 provided over the conductor 240 can be formed at the same time. Note that the conductor 112 has a function of a plug or a wiring that is electrically connected to the capacitor 100, the transistor 200, or the transistor 300.

Although the conductor 112 and the conductor 110 having a single-layer structure are illustrated in FIG. 18, the structure is not limited thereto; a stacked-layer structure of two or more layers may be employed. For example, between a conductor having a barrier property and a conductor having high conductivity, a conductor which is highly adhesive to the conductor having a barrier property and the conductor having high conductivity may be formed.

The insulator 130 can be provided to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, the insulator 130 preferably has a stacked-layer structure using a material with high dielectric strength such as silicon oxynitride and a high dielectric constant (high-k) material. In the capacitor 100 having such a structure, a sufficient capacitance can be provided owing to the high dielectric constant (high-k) insulator, and the dielectric strength can be increased owing to the insulator with high dielectric strength, so that the electrostatic breakdown of the capacitor 100 can be prevented.

Examples of the insulator with a high dielectric constant (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the material having a high dielectric strength (a material having a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layers>

Wiring layers provided with an interlayer film, a wiring, a plug, and the like may be provided between the structure bodies. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are stacked over the substrate 311 in this order as interlayer films. Note that the insulator 315 and the conductor 316 are provided to be embedded in the insulator 320. In addition, A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 18, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

An insulator 210, an insulator 212, an insulator 214, and an insulator 216 are stacked over the insulator 354 and the conductor 356 in this order. In addition, a conductor 218, a conductor (the conductor 205) included in the transistor 200, and the like are embedded in the insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low dielectric constant is used for the insulator functioning as an interlayer film, the parasitic capacitance generated between wirings can be reduced. Thus, a material is preferably selected depending on the function of an insulator.

For example, as the insulator 212, the insulator 352, the insulator 354, and the like, an insulator having a low dielectric constant is preferably used. For example, the insulators each preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

It is preferable that one or both of the insulator 130 and the insulator 150 provided over the conductor 112 or the conductor 120 be an insulator having a resistivity higher than or equal to $1.0 \times 10^{12} \Omega \text{cm}$ and lower than or equal to $1.0 \times 10^{15} \Omega \text{cm}$, preferably higher than or equal to $5.0 \times 10^{12} \Omega \text{cm}$ and lower than or equal to $1.0 \times 10^{14} \Omega \text{cm}$, further preferably higher than or equal to $1.0 \times 10^{1} \Omega \text{cm}$ and lower than or equal to $5.0 \times 10^{13} \Omega \text{cm}$. One or both of the insulator 130 and the insulator 150 are preferably an insulator having resistivity in the above range because the insulator(s) can disperse electric charge accumulated between the transistor 200, the transistor 300, the capacitor 100, and wirings such as the conductor 112 and the conductor 120 and can inhibit poor characteristics and electrostatic breakdown of the transistor and a memory device including the transistor due to the electric charge, while maintaining the insulating property. For such an insulator, silicon nitride or silicon nitride oxide can be used.

In addition, as the insulator having resistivity in the above range, an insulator 140 may be provided below the conductor 112. In that case, the insulator 140 is formed over the insulator 281; an opening portion is formed in the insulator 140, the insulator 281, the insulator 274, the insulator 280, the insulator 254, and the like; and the insulator 241 is formed or the conductor 240 that is electrically connected to the transistor 200, the conductor 218, and the like is formed in the opening portion. For the insulator 140, a material similar to that of the insulator 130 or the insulator 150 can be used.

When the transistor using an oxide semiconductor is surrounded by an insulator that has a function of inhibiting the transmission of oxygen and impurities such as hydrogen, the electrical characteristics of the transistor can be stable. Thus, an insulator having a function of inhibiting the transmission of oxygen and impurities such as hydrogen is preferably used for the insulator 210, the insulator 350, and the like.

As an insulator having a function of inhibiting the transmission of oxygen and impurities such as hydrogen, a single layer or a stacked layer of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, for the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Furthermore, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 110, the conductor 112, the conductor 120, and the like, a single layer or a stacked layer of a conductive material such as a metal material, an alloy material, a metal nitride material, or a metal oxide material which is formed using the above materials can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<<Wirings or Plugs in a Layer Provided with an Oxide Semiconductor>>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, in FIG. 18, the insulator 241 is preferably provided between the conductor 240 and each of the insulator 280 and the insulator 281. When the insulator 241 exists between the conductor 240 and each of the insulator 280 and the insulator 281, it is possible to inhibit absorption of oxygen contained in the insulator 280 and the insulator 281 by the conductor 240, that is, oxidation of the conductor 240.

That is, when the insulator 241 is provided, absorption of excess oxygen contained in the insulator 280 by the conductor 240 can be inhibited. In addition, when the insulator 241 is included, diffusion of hydrogen, which is an impurity, into the transistor 200 through the conductor 240 can be inhibited.

For the insulator 241, an insulating material having a function of inhibiting diffusion of oxygen and impurities such as water and hydrogen is preferably used. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The above is the description of the structure example. With the use of the structure, a change in electrical characteristics can be reduced and reliability can be improved in a semiconductor device using a transistor including an oxide semiconductor. Alternatively, a transistor including an oxide semiconductor with a high on-state current can be provided. Alternatively, a transistor including an oxide semiconductor with low off-state current can be provided. Alternatively, a semiconductor device with low power consumption can be provided.

[Memory Device 2]

Figure 19:
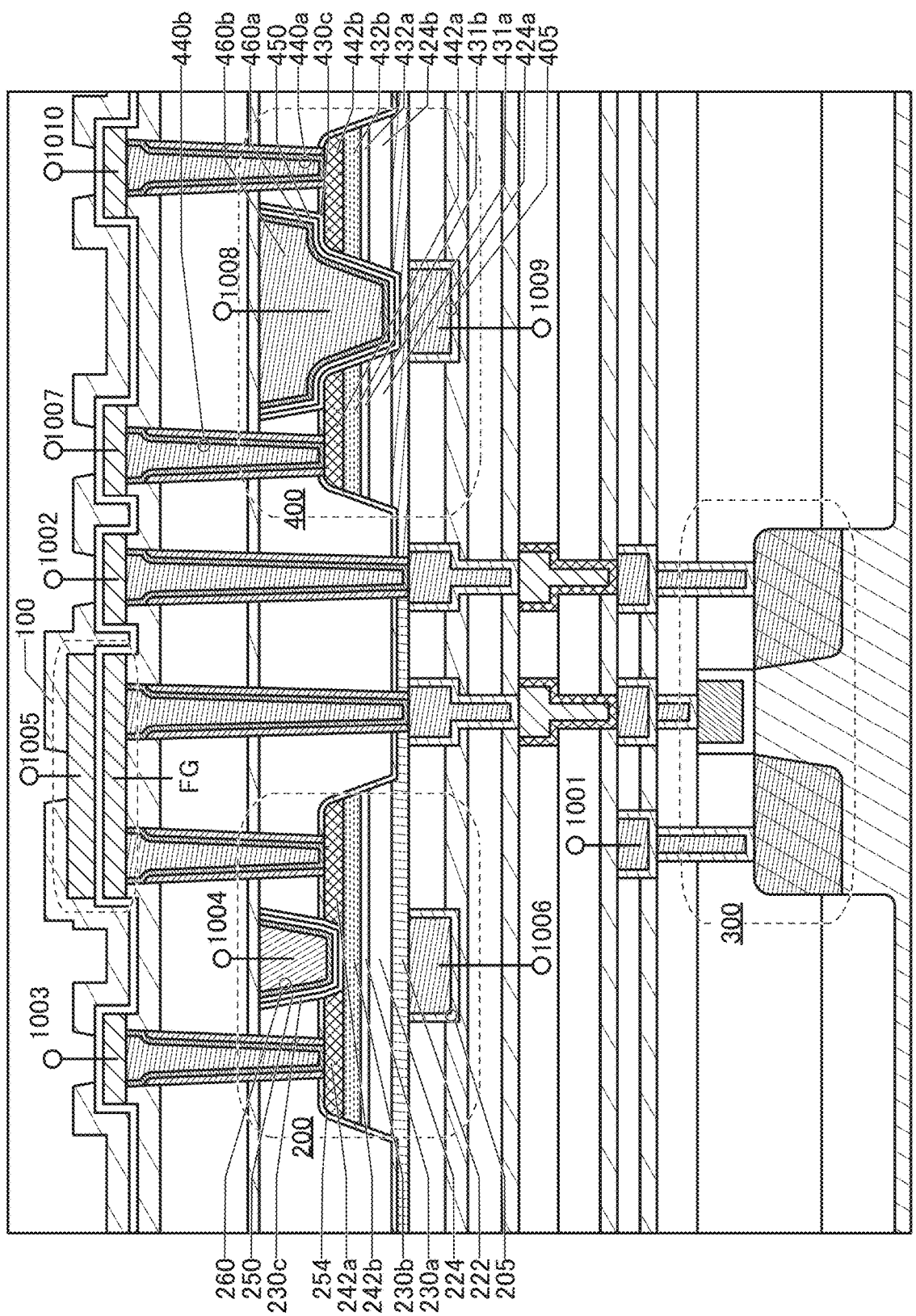
FIG. 19 A cross-sectional view illustrating a structure of a memory device of one embodiment of the present invention.

FIG. 19 illustrates an example of a memory device using the semiconductor device of one embodiment of the present invention. The memory device illustrated in FIG. 19 includes a transistor 400 in addition to the semiconductor device including the transistor 200, the transistor 300, and the capacitor 100 illustrated in FIG. 18.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, a first gate-source voltage and a second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

In FIG. 19, the wiring 1001 is electrically connected to the source of the transistor 300. The wiring 1002 is electrically connected to the drain of the transistor 300. The wiring 1003 is electrically connected to one of the source and the drain of the transistor 200. The wiring 1004 is electrically connected to the first gate of the transistor 200. The wiring 1006 is electrically connected to the second gate of the transistor 200. The gate of the transistor 300 and the other of the source and the drain of the transistor 200 are electrically connected to one electrode of the capacitor 100. The wiring 1005 is electrically connected to the other electrode of the capacitor 100. A wiring 1007 is electrically connected to the source of the transistor 400. A wiring 1008 is electrically connected to a first gate of the transistor 400. A wiring 1009 is electrically connected to a second gate of the transistor 400. A wiring 1010 is electrically connected to the drain of the transistor 400. The wiring 1006, the wiring 1007, the wiring 1008, and the wiring 1009 are electrically connected to each other.

When the memory devices illustrated in FIG. 19 are arranged in a matrix like the memory devices illustrated in FIG. 18, a memory cell array can be formed. Note that one transistor 400 can control second gate voltages of the transistors 200. For this reason, the number of provided transistors 400 is preferably smaller than the number of transistors 200.

[Transistor 400]

The transistor 400 and the transistors 200 are formed in the same layer and thus can be fabricated in parallel. The transistor 400 includes a conductor 460 (a conductor 460*a* and a conductor 460*b*) functioning as a first gate electrode;

a conductor 405 functioning as a second gate electrode; the insulator 222, an insulator 424a, an insulator 424b, and an insulator 450 each functioning as a gate insulator; an oxide 430c including a region where a channel is formed; a conductor 442a functioning as one of a source and a drain; an oxide 431a and an oxide 431b; a conductor 442b functioning as the other of the source and the drain; an oxide 432a and an oxide 432b; and a conductor 440 (a conductor 440a and a conductor 440b).

In the transistor 400, the conductor 405 is formed in the same layer as the conductor 205. The insulator 424a and the insulator 424b are formed in the same layer as the insulator 224. The oxide 431a and the oxide 432a are formed in the same layer as the oxide 230a, and the oxide 431b and the oxide 432b are formed in the same layer as the oxide 230b. The conductor 442 is formed in the same layer as the conductor 242. The oxide 430c is formed in the same layer as the oxide 230c. The insulator 450 is formed in the same layer as the insulator 250. The conductor 460 is formed in the same layer as the conductor 260.

Note that the structure bodies formed in the same layer can be formed at the same time. For example, the oxide 430c can be formed by processing an oxide film to be the oxide 230c.

In the oxide 430c functioning as an active layer of the transistor 400, oxygen vacancies and impurities such as water and hydrogen are reduced, as in the oxide 230 or the like. Accordingly, the threshold voltage of the transistor 400 can be higher, an off-state current can be reduced, and the drain current when the second gate voltage and the first gate voltage are 0 V can be extremely low.

Dicing Line

A dicing line (also referred to as a scribe line, a dividing line, or a cutting line in some cases) that is provided when a large-sized substrate is divided into semiconductor elements so that a plurality of semiconductor devices are each formed in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

At the periphery of the transistor 200 described in the above embodiment and the transistor 400 described in this embodiment, the insulator 254 and the insulator 222 are in contact with each other as illustrated in FIG. 19. For this reason, when design is made such that the region where the insulator 254 and the insulator 222 are in contact with each other serves as the dicing line, the design flexibility of the dicing line can be high. At this time, the insulator 222 and the insulator 254 may be formed using the same material and the same method. When the insulator 222 and the insulator 254 are formed using the same material and the same method, the adhesion therebetween can be increased. For example, aluminum oxide is preferably used.

With such a structure, the insulator 224, the transistor 200 and the transistor 400 can be enclosed with the insulator 222 and the insulator 254. Since the insulator 222 and the insulator 254 have a function of inhibiting diffusion of oxygen, hydrogen, and water even when the substrate is divided into circuit regions each of which is provided with the semiconductor elements in this embodiment to form a plurality of chips, the entry and diffusion of impurities such as water and hydrogen from the direction of a side surface of the divided substrate to the transistor 200 and the transistor 400 can be inhibited.

Furthermore, in the structure, excess oxygen in the insulator 224 can be inhibited from diffusing into the outside of the insulator 254 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in an appropriate combination with the structures described in the other embodiments, the examples, and the like.

Embodiment 4

In this embodiment, a memory device of one embodiment of the present invention including a transistor in which an oxide is used for a semiconductor (hereinafter referred to as an OS transistor in some cases) and a capacitor (hereinafter, such a memory device is also referred to as an OS memory device in some cases), will be described with reference to FIG. 20 and FIG. 21. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

Structure Example of Memory Device

Figure 20A:
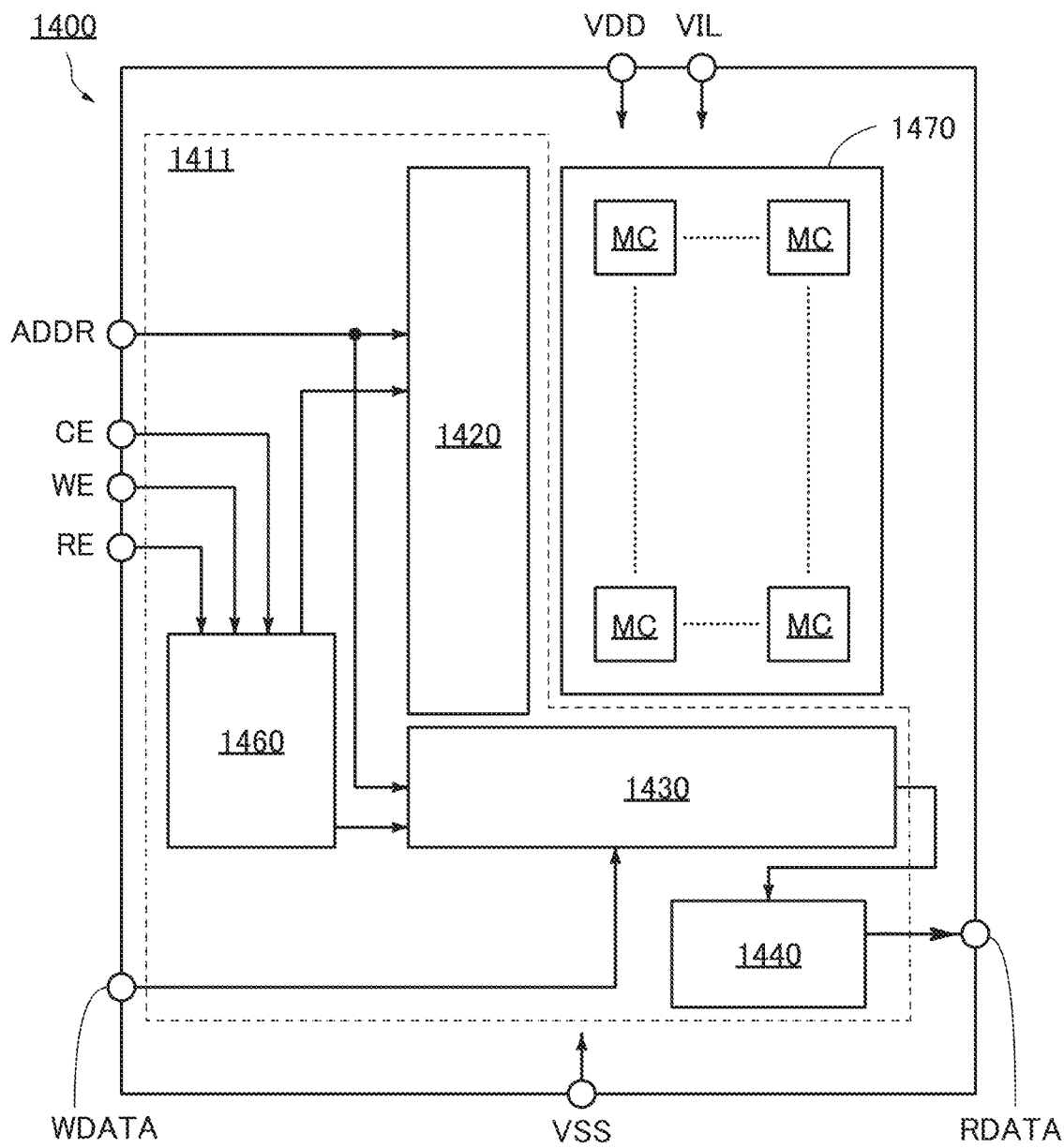
FIGS. 20A-20B A block diagram and a schematic view illustrating a structure example of a memory device of one embodiment of the present invention.

FIG. 20(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 20B:
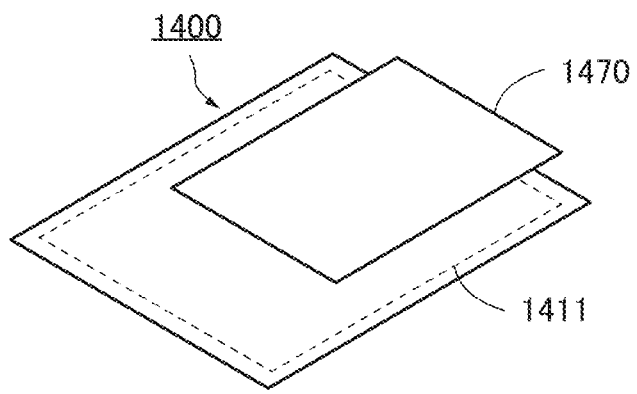

Note that FIG. 20(A) illustrates an example in which the peripheral circuit 1411 and the memory cell array 1470 are formed on the same plane; however, this embodiment is not limited thereto. For example, as illustrated in FIG. 20(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 21 illustrate configuration examples of a memory cell applicable to the memory cell MC.

[DOSRAM]

Figure 21A:
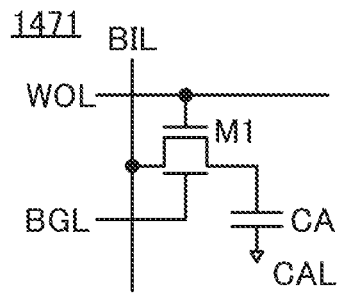
FIGS. 21A-21H Circuit diagrams each showing a configuration example of a memory device of one embodiment of the present invention.
Figure 21B:
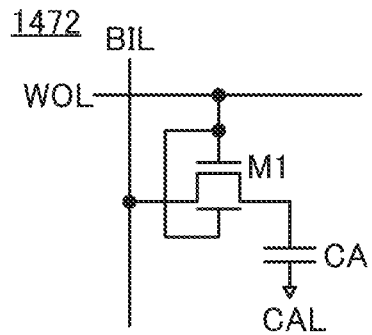
Figure 21C:
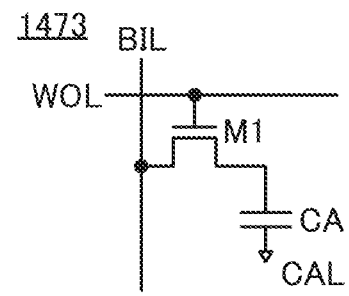
Figure 21D:
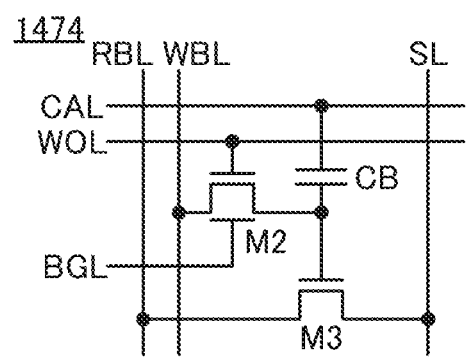
Figure 21E:
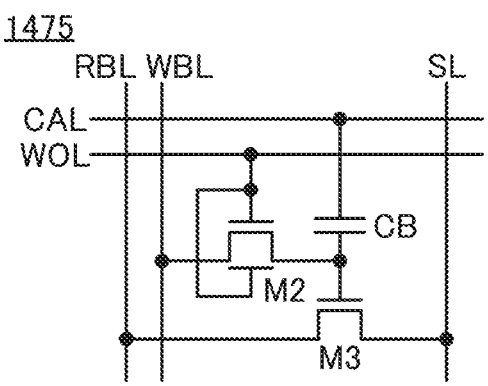
Figure 21F:
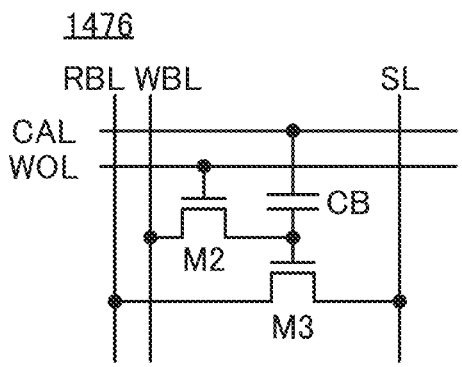
Figure 21G:
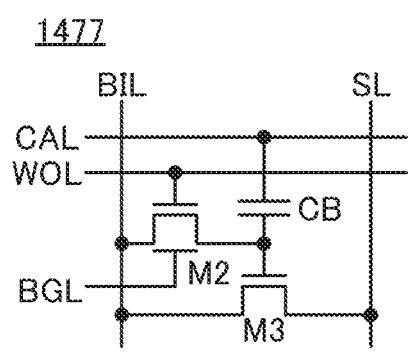

FIGS. 21(A) to 21(C) each illustrate a circuit configuration example of a memory cell of a DRAM. In this specification and the like, a DRAM using a memory cell including one OS transistor and one capacitor is referred to as DOSRAM (registered trademark) (Dynamic Oxide Semiconductor Random Access Memory) in some cases. A memory cell 1471 illustrated in FIG. 21(A) includes a transistor M1 and a capacitor CA. Note that the transistor M1 includes a gate (also referred to as a top gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

The memory cell MC is not limited to the memory cell 1471, and the circuit structure can be changed. For example, as in a memory cell 1472 illustrated in FIG. 21(B), the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 21(C).

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of refresh of the memory cell can be decreased. In addition, refresh operation of the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. Thus, the bit line capacitance can be small, and the storage capacitance of the memory cell can be reduced.

[NOSRAM]

FIGS. 21(D) to 21(G) each illustrate a circuit configuration example of a gain-cell memory cell including two transistors and one capacitor. A memory cell 1474 illustrated in FIG. 21(D) includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as NOSRAM (registered trademark) (Nonvolatile Oxide Semiconductor RAM) in some cases.

A first terminal of the transistor M2 is connected to a first terminal of the capacitor CB. A second terminal of the transistor M2 is connected to a wiring WBL. A gate of the transistor M2 is connected to the wiring WOL. A back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing, data retaining, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

The memory cell MC is not limited to the memory cell 1474, and the circuit configuration can be changed as appropriate. For example, as in a memory cell 1475 illustrated in FIG. 21(E), the back gate of the transistor M2 may be connected not to the wiring BGL but to the wiring WOL in the memory cell MC. Alternatively, for example, the memory cell MC may be a memory cell including as single-gate transistor, that is, the transistor M2 not including a back gate, as in a memory cell 1476 illustrated in FIG. 21(F). Alternatively, for example, in the memory cell MC, the wiring WBL and the wiring RBL may be combined into one wiring BIL, as in a memory cell 1477 illustrated in FIG. 21(G).

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. That is, with the use of the transistor M2, written data can be retained for a long time, and thus the frequency of refresh of the memory cell can be decreased. In addition, refresh operation of the memory cell can be unnecessary. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, also referred to as a Si transistor in some cases). The conductivity type of the Si transistor may be of either an n-channel type or a p-channel type. The Si transistor has higher field-effect mobility than the OS transistor in some cases. Therefore, a Si transistor may be used as the transistor M3 functioning as a reading transistor. Furthermore, the transistor M2 can be provided to be stacked over the transistor M3 when a Si transistor is used as the transistor M3; therefore, the area occupied by the memory cell can be reduced, leading to high integration of the memory device.

Alternatively, the transistor M3 may be an OS transistor. When an OS transistor is used as each of the transistor M2 and the transistor M3, the circuit of the memory cell array 1470 can be formed using only n-channel transistors.

Figure 21H:
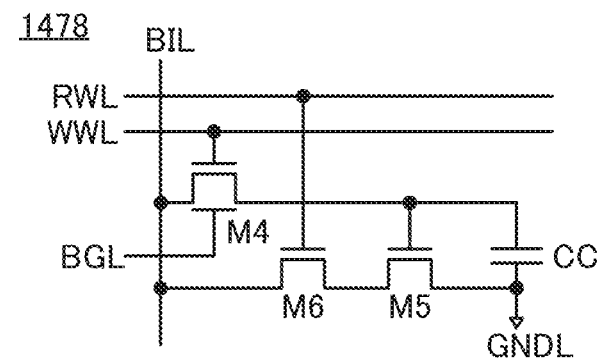

FIG. 21(H) illustrates an example of a gain-cell memory cell including three transistors and one capacitor. A memory cell 1478 illustrated in FIG. 21(H) includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate that is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in any of the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. Positions and functions of these circuits, wirings connected to the circuits, circuit elements, and the like can be changed, deleted, or added as needed.

The structure described in this embodiment can be used in an appropriate combination with the structures described in the other embodiments, the examples, and the like.

Embodiment 5

In this embodiment, an example of a chip 1200 on which the semiconductor device of the present invention is mounted will be described with reference to FIG. 22. A plurality of circuits (systems) are mounted on the chip 1200. The technique for integrating a plurality of circuits (systems) on one chip as described above is referred to as system on chip (SoC) in some cases.

Figure 22A:
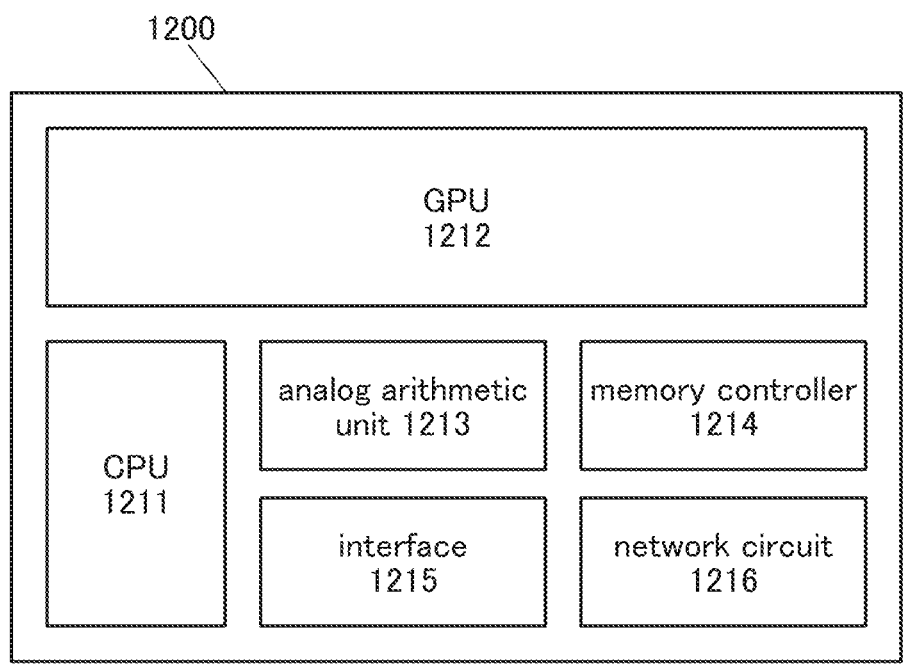
FIGS. 22A-22B Schematic views of a semiconductor device of one embodiment of the present invention.

As illustrated in FIG. 22(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 22B:
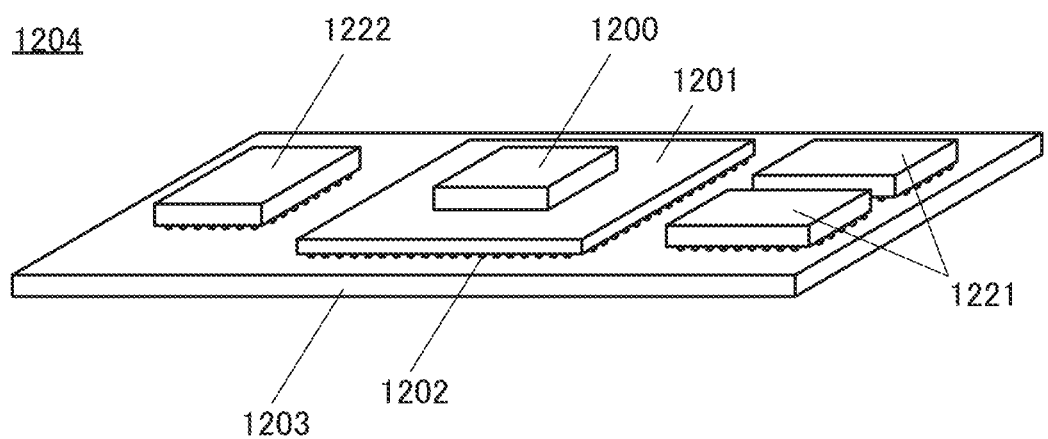

A bump (not illustrated) is provided on the chip 1200, and as illustrated in FIG. 22(B), the chip 1200 is connected to a first surface of a printed circuit board (PCB) 1201. A plurality of bumps 1202 are provided on the rear side of the first surface of the PCB 1201, and the PCB 1201 is connected to a motherboard 1203.

A memory device such as a DRAM 1221 or a flash memory 1222 may be provided over the motherboard 1203. For example, the DOSRAM described in the above embodiment can be used as the DRAM 1221. For example, the NOSRAM described in the above embodiment can be used as the flash memory 1222.

The CPU 1211 preferably includes a plurality of CPU cores. Furthermore, the GPU 1212 preferably includes a plurality of GPU cores. The CPU 1211 and the GPU 1212 may each include a memory for storing data temporarily. Alternatively, a common memory for the CPU 1211 and the GPU 1212 may be provided in the chip 1200. The NOSRAM or the DOSRAM described above can be used as the memory. The GPU 1212 is suitable for parallel computation of a number of data and thus can be used for image processing or product-sum operation. When an image processing circuit or a product-sum operation circuit including an oxide semiconductor of the present invention is provided in the GPU 1212, image processing and product-sum operation can be performed with low power consumption.

In addition, since the CPU 1211 and the GPU 1212 are provided in the same chip, a wiring between the CPU 1211 and the GPU 1212 can be shortened; accordingly, the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the analog arithmetic unit 1213 may include the above-described product-sum operation circuit.

The memory controller 1214 includes a circuit functioning as a controller of the DRAM 1221 and a circuit functioning as the interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, USB (Universal Serial Bus), HDMI (registered trademark) (High-Definition Multimedia Interface), or the like can be used.

The network circuit 1216 includes a network circuit such as a LAN (Local Area Network). Furthermore, the network circuit 1216 may include a circuit for network security.

The circuits (systems) can be formed in the chip 1200 in the same manufacturing process. Therefore, even when the number of circuits needed for the chip 1200 is increased, there is no need to increase the number of steps in the manufacturing process; thus, the chip 1200 can be manufactured at low cost.

The motherboard 1203 provided with the PCB 1201 on which the chip 1200 including the GPU 1212 is mounted, the DRAM 1221, and the flash memory 1222 can be referred to as a GPU module 1204.

The GPU module 1204 includes the chip 1200 formed using the SoC technology, and thus can have a small size. Furthermore, the GPU module 1204 is excellent in image processing, and thus is suitably used in a portable electronic device such as a smartphone, a tablet terminal, a laptop PC, or a portable (mobile) game console. Furthermore, the product-sum operation circuit using the GPU 1212 can implement a method such as a deep neural network (DNN), a convolutional neural network (CNN), a recurrent neural network (RNN), an autoencoder, a deep Boltzmann machine (DBM), a deep belief network (DBN), or the like; thus, the chip 1200 can be used as an AI chip or the GPU module 1204 can be used as an A1 system module.

The structure described in this embodiment can be used in an appropriate combination with the structures described in the other embodiments, the examples, and the like.

Embodiment 6

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to removable memory devices such as memory cards (e.g., SD cards), USB memories, and SSDs (solid state drives). FIG. 23 schematically illustrates some structure examples of removable memory devices. The semiconductor device described in the above embodiment is processed into a packaged memory chip and used in a variety of storage devices and removable memories, for example.

FIG. 23(A) is a schematic view of a USB memory. A USB memory 1100 includes a housing 1101, a cap 1102, a USB connector 1103, and a substrate 1104. The substrate 1104 is held in the housing 1101. For example, a memory chip 1105 and a controller chip 1106 are attached to the substrate 1104. The semiconductor device described in the above embodiment can be incorporated in the memory chip 1105 or the like.

FIG. 23(B) is a schematic external view of an SD card, and FIG. 23(C) is a schematic view of the internal structure of the SD card. An SD card 1110 includes a housing 1111, a connector 1112, and a substrate 1113. The substrate 1113 is held in the housing 1111. For example, a memory chip 1114 and a controller chip 1115 are attached to the substrate 1113. When the memory chip 1114 is also provided on the rear surface side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

FIG. 23(D) is a schematic external view of an SSD, and FIG. 23(E) is a schematic view of the internal structure of the SSD. An SSD 1150 includes a housing 1151, a connector 1152, and a substrate 1153. The substrate 1153 is held in the housing 1151. For example, a memory chip 1154, a memory chip 1155, and a controller chip 1156 are attached to the substrate 1153. The memory chip 1155 is a work memory for the controller chip 1156, and a DOSRAM chip may be used, for example. When the memory chip 1154 is also provided on the rear surface side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments, the examples, and the like.

Embodiment 7

The semiconductor device of one embodiment of the present invention can be used for a chip or a processor such as a CPU or a GPU. FIG. 24 illustrates specific examples of electronic devices including a chip or a processor such as a CPU or a GPU of one embodiment of the present invention.
<Electronic Device and System>

The GPU or the chip of one embodiment of the present invention can be incorporated into a variety of electronic devices. Examples of electronic devices include a digital camera, a digital video camera, a digital photo frame, a mobile phone, a portable game machine, a portable information terminal, and an audio reproducing device in addition to electronic devices provided with a relatively large screen, such as a television device, a desktop or laptop personal computer, a monitor for a computer and the like, digital signage, and a large game machine like a pachinko machine. When the integrated circuit or the chip of one embodiment of the present invention is provided in an electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radioactive rays, flow rate, humidity, gradient, oscillation, a smell, or infrared rays).

The electronic device of one embodiment of the present invention can have a variety of functions. For example, the electronic device can have a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium. FIG. 24 illustrates examples of electronic devices.

[Mobile Phone]

FIG. 24(A) illustrates a mobile phone (smartphone), which is a type of information terminal. An information terminal 5500 includes a housing 5510 and a display portion 5511. As input interfaces, a touch panel is provided in the display portion 5511 and a button is provided in the housing 5510.

The information terminal 5500 can execute an application utilizing artificial intelligence, with the use of the chip of one embodiment of the present invention. Examples of the application utilizing artificial intelligence include an application for interpreting a conversation and displaying its content on the display portion 5511; an application for recognizing letters, figures, and the like input to the touch panel of the display portion 5511 by a user and displaying them on the display portion 5511; and an application for biometric authentication using fingerprints, voice prints, or the like.

[Information Terminal]

FIG. 24(B) illustrates a desktop information terminal 5300. The desktop information terminal 5300 includes a main body 5301 of the information terminal, a display 5302, and a keyboard 5303.

Like the information terminal 5500 described above, the desktop information terminal 5300 can execute an application utilizing artificial intelligence, with the use of the chip of one embodiment of the present invention. Examples of the application utilizing artificial intelligence include design-support software, text correction software, and software for automatic menu generation. Furthermore, with the use of the desktop information terminal 5300, novel artificial intelligence can be developed.

Note that in the above description, a smartphone and a desktop information terminal are shown as examples of the electronic devices in FIGS. 24(A) and 24(B); alternatively, the electronic device can be an information terminal other than a smartphone and a desktop information terminal. Examples of information terminals other than a smartphone and a desktop information terminal include a PDA (Personal Digital Assistant), a laptop information terminal, and a workstation.

[Household Appliance]

FIG. 24(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is used in the electric refrigerator-freezer 5800, the electric refrigerator-freezer 5800 including artificial intelligence can be obtained. Utilizing the artificial intelligence enables the electric refrigerator-freezer 5800 to have a function of automatically making a menu based on foods stored in the electric refrigerator-freezer 5800 and food expiration dates, for example, a function of automatically adjusting the temperature to be appropriate for the foods stored in the electric refrigerator-freezer 5800, and the like.

Although the electric refrigerator-freezer is described here as an example of a household appliance, other examples of a household appliance include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

FIG. 24(D) illustrates a portable game machine 5200 as an example of a game machine. The portable game machine 5200 includes a housing 5201, a display portion 5202, a button 5203, and the like.

When the GPU or the chip of one embodiment of the present invention is used in the portable game machine 5200, the portable game machine 5200 with low power consumption can be achieved. Moreover, heat generation from a circuit can be reduced owing to low power consumption; thus, the influence of heat generation on the circuit, the peripheral circuit, and the module can be reduced.

Furthermore, when the GPU or the chip of one embodiment of the present invention is used in the portable game machine 5200, the portable game machine 5200 including artificial intelligence can be obtained.

In general, the progress of a game, the actions and words of game characters, and expressions of a phenomenon and the like in the game are determined by the program in the game; however, the use of artificial intelligence in the portable game machine 5200 enables expressions not limited by the game program. For example, questions posed by the player, progress of the game, timing when an event occurs in the game, the actions and words of the characters appearing in the game, and the like can be changed for various expressions without being limited by the game program.

When a game requiring a plurality of players is played on the portable game machine 5200, the artificial intelligence can create a virtual game player; thus, the game can be played alone with the game player created by the artificial intelligence as an opponent.

Although the portable game machine is illustrated as an example of a game machine in FIG. 24(D), the game machine using the GPU or the chip of one embodiment of the present invention is not limited thereto. Examples of the game machine using the GPU or the chip of one embodiment of the present invention include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be used in an automobile, which is a moving vehicle, and around a driver's seat in the automobile.

FIG. 24(E1) illustrates an automobile 5700 as an example of a moving vehicle, and FIG. 24(E2) is a diagram illustrating the periphery of a windshield inside the automobile. FIG. 24(E2) illustrates a display panel 5701, a display panel 5702, and a display panel 5703 that are attached to a dashboard and a display panel 5704 that is attached to a pillar.

The display panel 5701 to the display panel 5703 can provide various kinds of information by displaying a speedometer, a tachometer, mileage, a fuel gauge, a gear state, air-condition setting, and the like. The content, layout, or the like of the display on the display panels can be changed as appropriate to suit the user's preference, so that the design can be improved. The display panel 5701 to the display panel 5703 can also be used as lighting devices.

The display panel 5704 can compensate for the view obstructed by the pillar (a blind spot) by showing an image taken by an imaging device (not illustrated) provided on the outside of the automobile 5700. That is, displaying an image taken by the imaging device provided on the outside of the automobile 5700 leads to compensation for the blind spot and enhancement of safety. In addition, showing an image for compensating for the area which a driver cannot see makes it possible for the driver to confirm safety more easily and comfortably. The display panel 5704 can also be used as a lighting device.

Since the GPU or the chip of one embodiment of the present invention can be used as a component of artificial intelligence, the chip can be used in an automatic driving system of the automobile 5700, for example. The chip can also be used for a system for navigation, risk prediction, or the like. The display panel 5701 to the display panel 5704 may display information regarding navigation information, risk prediction, and the like.

Although an automobile is described above as an example of a moving vehicle, moving vehicles are not limited to an automobile. Examples of moving vehicles include a train, a monorail train, a ship, and a flying object (a helicopter, an unmanned aircraft (a drone), an airplane, and a rocket), and these moving vehicles can include a system utilizing artificial intelligence when equipped with the chip of one embodiment of the present invention.

[Broadcasting System]

The GPU or the chip of one embodiment of the present invention can be used in a broadcasting system.

FIG. 24(F) schematically shows data transmission in a broadcasting system. Specifically, FIG. 24(F) shows a path in which a radio wave (a broadcasting signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 24(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 24(F) and may be satellite broadcasting using an artificial satellite, data broadcasting using an optical line, or the like.

The above-described broadcasting system may utilize artificial intelligence by using the chip of one embodiment of the present invention. When the broadcast data is transmitted from the broadcast station 5680 to the TV 5600 at home, the broadcast data is compressed by an encoder. When the antenna 5650 receives the compressed broadcast data, the compressed broadcast data is decompressed by a decoder of the receiving device in the TV 5600. With the use of artificial intelligence, for example, a display pattern included in an image to be displayed can be recognized in motion compensation prediction, which is one of the compressing methods for the encoder. In-frame prediction utilizing artificial intelligence, for instance, can also be performed. For another example, when the broadcast data with low resolution is received and displayed on the TV 5600 with high resolution, image interpolation such as upconversion can be performed in the broadcast data decompression by the decoder.

The above-described broadcasting system utilizing artificial intelligence is suitable for ultra-high definition television (UHDTV: 4K, 8K) broadcasting, which needs a large amount of broadcast data.

As an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, application examples of artificial intelligence, its effects, and the like described in this embodiment can be combined as appropriate with the description of another electronic device.

This embodiment can be implemented in an appropriate combination with any of the structures described in the other embodiments, the examples, and the like.

Example 1

In this example, a transistor having a structure similar to that of the transistor 10*d* illustrated in FIG. 9 and FIG. 10 (hereinafter referred to as Sample 1) was fabricated as the semiconductor device of one embodiment of the present invention. Observation results of the semiconductor device with a scanning transmission electron microscope (STEM) will be described.

First, a structure of Sample 1 will be described. As illustrated in FIG. 9 and FIG. 10, Sample 1 includes the insulator 224 placed over a substrate (not illustrated), the oxide 230*b* placed over the insulator 224, the oxide 230*c* placed over the oxide 230*b*, the insulator 250 placed over the oxide 230*c*, and the conductor 260 placed over the insulator 250. Although not illustrated in FIG. 9 and FIG. 10, Sample 1 includes the oxide 230*a* between the insulator 224 and the oxide 230*b* like the transistor 200 illustrated in FIG. 11. The conductor 260 is a stacked film of the conductor 260*a* and the conductor 260*b*.

As the insulator 224, 35-nm-thick silicon oxynitride was used.

As the oxide 230*a*, 5-nm-thick In—Ga—Zn oxide deposited by a DC sputtering method was used. In the deposition of the oxide 230*a*, an oxide target with In:Ga:Zn=1:3:4 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As the oxide 230*b*, 15-nm-thick In—Ga—Zn oxide deposited by a DC sputtering method was used. In the deposition of the oxide 230*b*, an oxide target with In:Ga:Zn=4:2:4.1 [atomic ratio] was used; an argon gas at 30 sccm and an oxygen gas at 15 sccm were used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

The oxide 230*c* is a stacked film. As a lower film of the oxide 230*c*, 5-nm-thick In—Ga—Zn oxide deposited by a DC sputtering method was used. In the deposition of the lower film of the oxide 230*c*, an oxide target with In:Ga:Zn=4:2:4.1 [atomic ratio] was used; an oxygen gas at 45 sccm was used as a deposition gas; the deposition pressure was 0.7 Pa (measured with Miniature Gauge MG-2 manufactured by CANON ANELVA CORPORATION); the deposition power was 500 W; the substrate temperature was 200° C.; and the target-substrate distance was 60 mm.

As an upper film of the oxide 230c, 5-nm-thick In—Ga—Zn oxide deposited by a DC sputtering method was used. Note that in the deposition of the upper film of the oxide 230c, an oxide target with In:Ga:Zn=1:3:4 [atomic ratio] was used, and the other deposition conditions were similar to those for the oxide 230a.

As the insulator 250, 10-nm-thick silicon oxynitride was used. As the conductor 260a, 5-nm-thick titanium nitride was used. As the conductor 260b, tungsten was used.

Sample 1 having the above structure is a transistor having a channel length of 200 nm and a channel width of 60 nm. Note that like the transistor 200, Sample 1 includes the insulator 214, the insulator 216, the conductor 205, the insulator 222, the conductor 242, the insulator 254, the conductor 240, the insulator 280, the insulator 274, the insulator 281, and the like in addition to the above structure.

Figure 25:
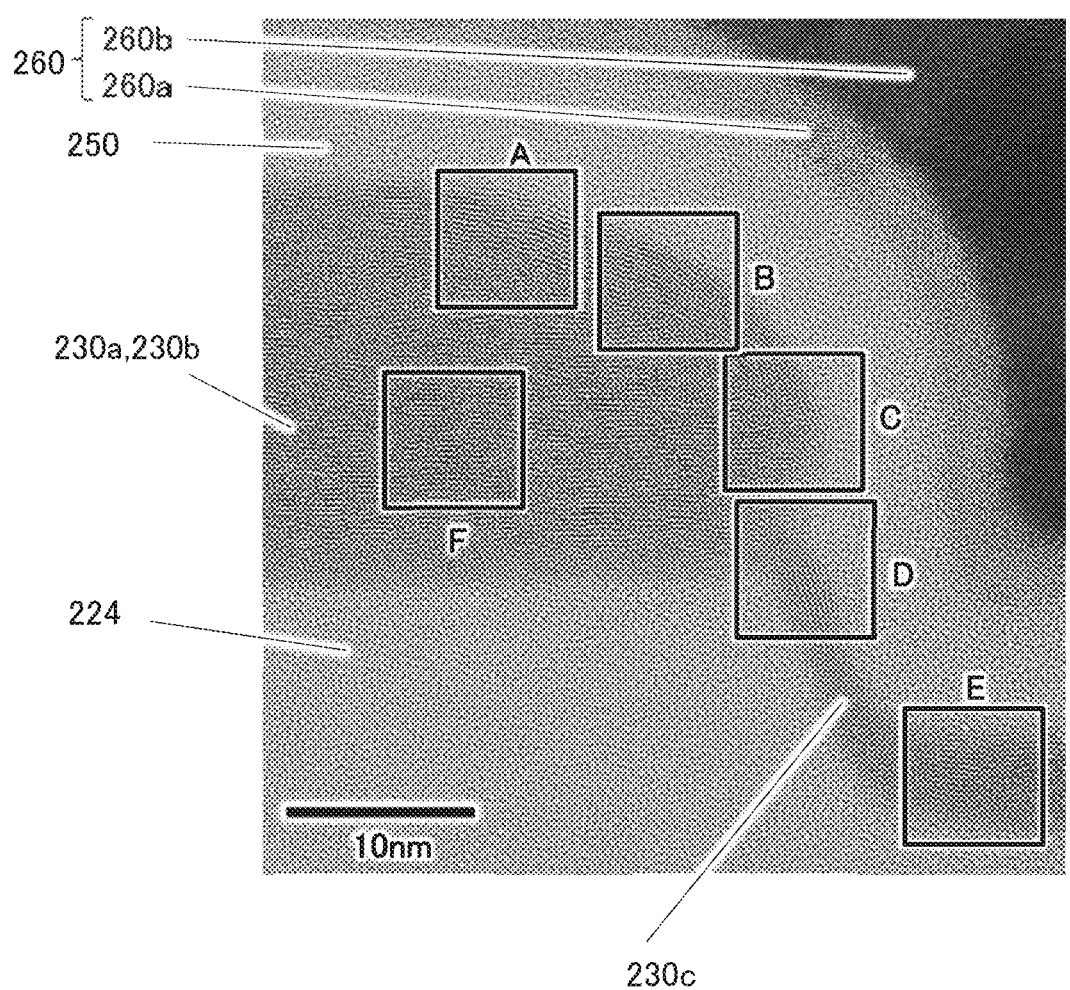
FIG. 25 A cross-sectional TEM image of Example of the present invention.

A cross-sectional TEM image of the fabricated Sample 1 was taken with JEM-ARM200F manufactured by JEOL Ltd. in the Cs-TEM mode at an accelerating voltage of 200 kV. FIG. 25 shows a result of the cross-sectional TEM image that was taken. FIG. 25 is a cross-sectional TEM image of the channel formation region of the oxide 230 and the vicinity thereof in the channel width direction.

FIG. 26 shows enlarged cross-sectional TEM images of a region A to a region F shown in FIG. 25. Here, the region A includes the oxide 230c in contact with the top surface of the oxide 230b. The region B includes the oxide 230c in contact with the end portion of the top surface of the oxide 230b. The region C includes the oxide 230c in contact with the side surface of the oxide 230b. The region D includes the oxide 230c in contact with the side surface of the insulator 224. The region E includes the oxide 230c in contact with the top surface of the insulator 224. The region F includes the oxide 230b.

In the region A to the region E shown in FIG. 25 and FIGS. 26(A) to 26(E), the oxide 230c was deposited to have an extremely small thickness of approximately 2 nm to 5 nm. However, as shown in FIG. 26(A) to FIG. 26(E), in the oxide 230c in each of the regions, a layered CAAC-OS was formed. Here, arrows illustrated in FIG. 26(A) to FIG. 26(E) indicate a direction substantially perpendicular to the film of the oxide 230c, and the directions of the arrows are substantially the same as the normal direction of layered crystals of the oxide 230c, that is, the c-axis direction of the CAAC-OS. Thus, it is found that the CAAC-OS of the oxide 230c is arranged along unevenness of the formation surface of the oxide 230c or the film surface of the oxide 230c.

Figure 26A:
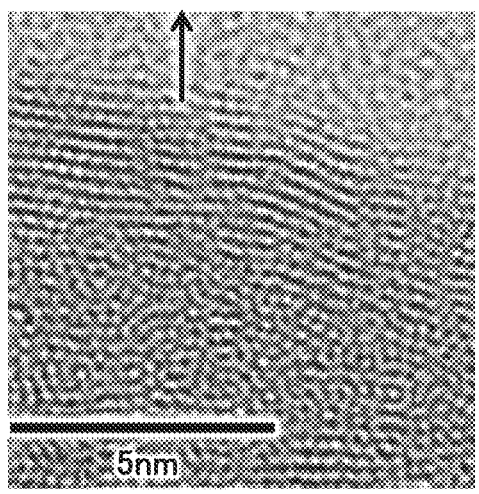
FIGS. 26A-26F Cross-sectional TEM images of Example of the present invention.
Figure 26B:
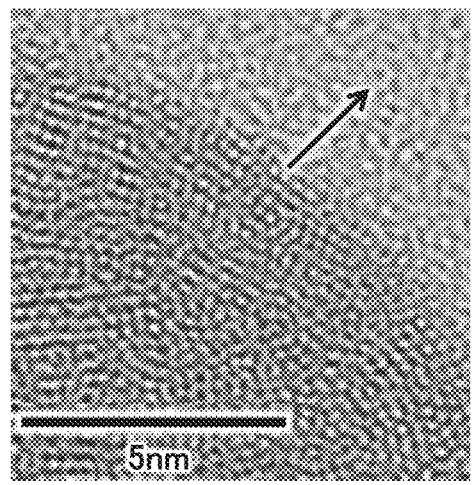
Figure 26C:
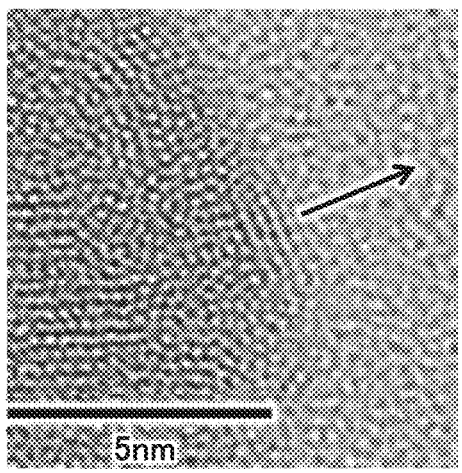
Figure 26D:
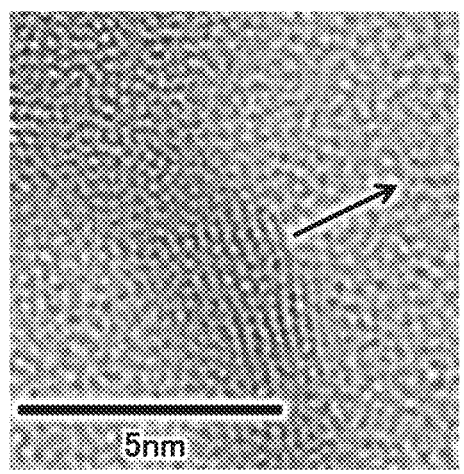
Figure 26E:
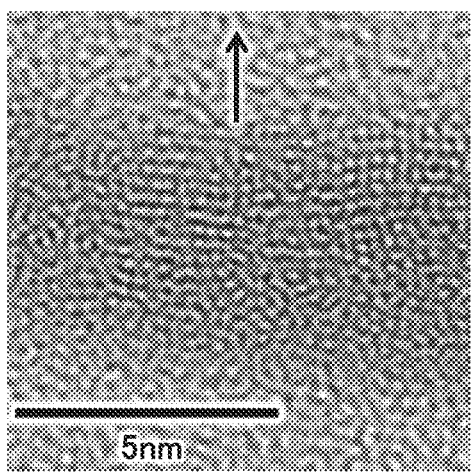
Figure 26F:
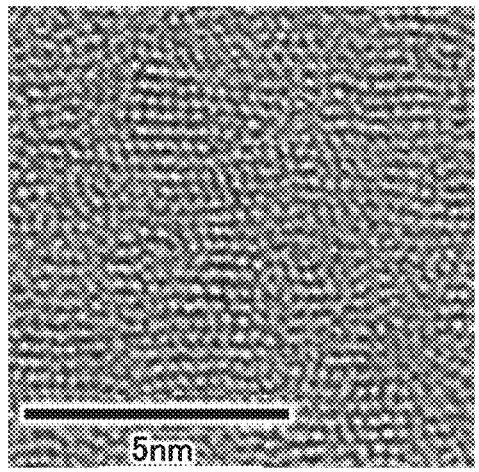

As illustrated in FIG. 25 and FIG. 26(F), the layered crystal in the region F is also arranged substantially parallel to the top surface of the insulator 224. Thus, it is found that the CAAC-OS of the oxide 230b is arranged along the formation surface or film surface of the oxide 230b.

From the above, in Sample 1, it is assumed that the region F corresponding to the region 54 in FIG. 10(B) has the crystal structure illustrated in FIG. 10(D) and the region C corresponding to the region 55 in FIG. 10(B) has the crystal structure illustrated in FIG. 10(E). Thus, Sample 1 roughly satisfies the band diagram model shown in FIG. 10(C), and thus is considered to be able to prevent the inhibition of carrier transfer.

At least part of the structure, the method, and the like described above in this example can be implemented in appropriate combination with the embodiments and examples described in this specification.

Example 2

In this example, the crystal structure of the metal oxide of one embodiment of the present invention was evaluated. Specifically, an image of Sample 2 in which a metal oxide was formed obtained with high-angle annular dark field scanning transmission electron microscope (HAADF-STEM) was observed, and elementary analysis was performed using energy dispersive X-ray spectroscopy (EDX).

First, a method for fabricating Sample 2 will be described.

As a metal oxide, a 100-nm-thick In—Ga—Zn oxide was deposited over an yttria-stabilized zirconia (YSZ) substrate by a sputtering method. In the deposition of the In—Ga—Zn oxide, an oxide target with In:Ga:Zn=4:2:4.1 [atomic ratio] was used, the flow rate of oxygen gas was 30 sccm, the pressure was 0.4 Pa, the DC power source was 200 W, and the substrate temperature was 300° C.

Next, heat treatment was performed. As the heat treatment, treatment was performed at 1200° C. in an atmosphere containing oxygen for one hour.

Through the above steps, Sample 2 was fabricated.

An HAADF-STEM image of the fabricated Sample 2 was obtained. The HAADF-STEM image was obtained using an atomic resolution analytical electron microscope JEM-ARM200F manufactured by JEOL Ltd.

The luminance of a point observed in the HAADF-STEM image increases in proportion to the square of the atomic number of the atom corresponding to the point. That is, a point corresponding to an atom with a larger atomic number is observed whiter (with higher brightness). In the In—Ga—Zn oxide, in terms of atomic number, In is the largest, Ga and Zn are the second largest, and O is the smallest. Thus, the point corresponding to In is observed whiter with higher brightness. In addition, the points corresponding to Ga and Zn are observed darker with lower brightness than the point corresponding to In. In addition, since the luminance of the point corresponding to O is extremely low, the position of O is difficult to specify in some cases.

Figure 27:
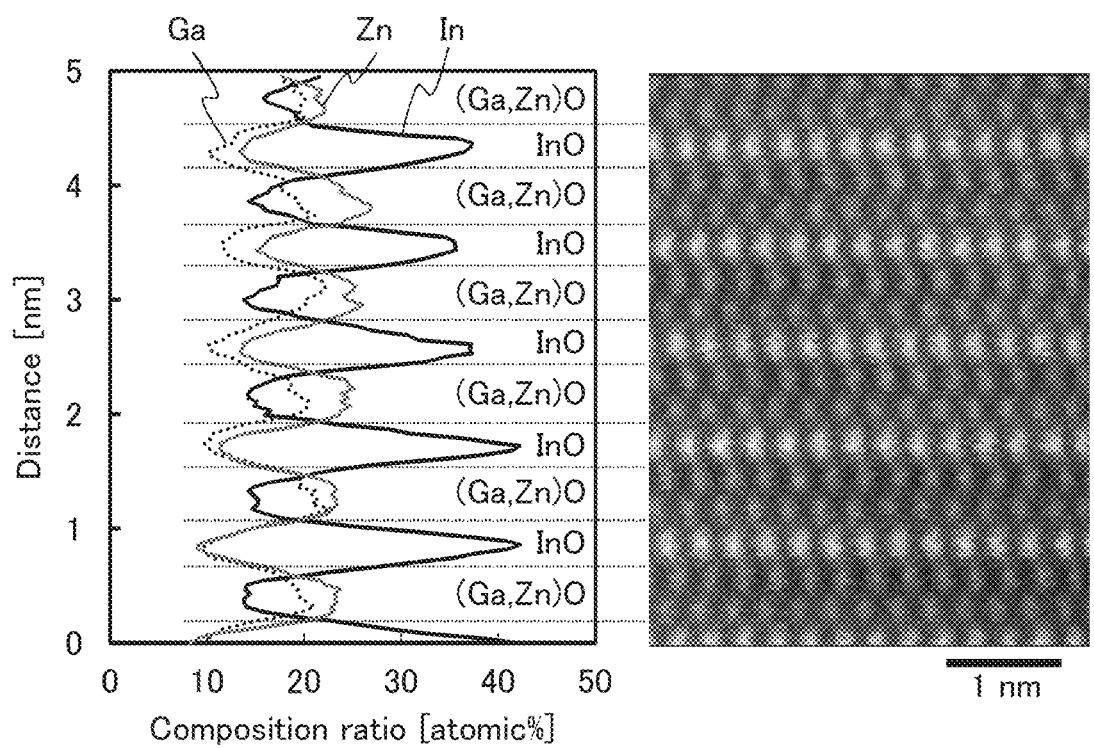
FIG. 27 A cross-sectional TEM image and a diagram showing EDX liner analysis of a sample of Example.

The cross-sectional HAADF-STEM image of Sample 2 is shown on the right side of FIG. 27. The vertical direction of the sheet is the normal direction of the formation surface of the metal oxide (YSZ substrate surface), and the horizontal direction and normal direction of the sheet are directions parallel to the formation surface of the metal oxide (YSZ substrate surface).

From the cross-sectional HAADF-STEM image shown on the right side of FIG. 27, it is confirmed that a layered structure is formed in the metal oxide formed in Sample 2. In addition, points with different luminance were observed. It is estimated that a point with relatively high luminance is a point corresponding to In, and a point with relatively low luminance is a point corresponding to Ga or Zn. In addition, points with substantially the same luminance aligned in the horizontal direction of the sheet were observed. It is estimated that the line in which the points with relatively high luminance are aligned in the horizontal direction of the sheet is the InO layer, and the line in which the points with relatively low luminance are aligned is the (Ga,Zn)O layer. In addition, the line in which the points with relatively high luminance are aligned in the horizontal direction of the sheet and the line in which the points with relatively low luminance are aligned in the horizontal direction of the sheet were observed alternately in the vertical direction of the sheet. Thus, it is confirmed that a layered structure in which the InO layer and the (Ga,Zn)O layer are stacked is formed in the metal oxide formed in Sample 2.

Next, elementary analysis using EDX was performed on Sample 2. In the EDX measurement, to measure a region while scanning the region and evaluate two-dimensionally is referred to as EDX plane analysis in some cases. In addition, to extract data of a linear region from EDX plane analysis and evaluate the atomic concentration distribution in the region is referred to as EDX linear analysis in some cases.

An energy dispersive X-ray spectrometer AnalysisStation JED-2300T manufactured by JEOL Ltd. was used as an elementary analysis apparatus. A Si drift detector was used to detect an X-ray emitted from the sample.

FIG. 27 shows on the left side the measurement results of EDX linear analysis performed on the same region as the region where the cross-sectional HAADF-STEM image shown in the right side of FIG. 27 is obtained. In the left drawing of FIG. 27, the vertical axis represents a distance (Distance) [nm] from a reference position (0 nm) to the formation surface of the metal oxide (YSZ substrate surface) in the normal direction. In addition, the horizontal axis represents the proportion of each element in constituent elements (Composition ratio) [atomic %].

From FIG. 27, it is found that the line in which the points with relatively high luminance are aligned in the horizontal direction of the sheet is the InO layer because the line has the highest proportion of In. In addition, it is found that the line in which the points with relatively low luminance are aligned in the horizontal direction of the sheet is the (Ga, Zn)O layer because the line has high proportion of Ga or Zn. Note that approximately 15 atomic % of In is detected also from the line in which the points with relatively low luminance are aligned in the horizontal direction of the sheet, which indicates that In is mixed in the (Ga,Zn)O layer.

Thus, it is confirmed that the In—Ga—Zn oxide has the layered structure in which the InO layer and the (Ga,Zn)O layer are stacked.

At least part of the structure, the method, and the like described above in this example can be implemented in appropriate combination with other embodiments and examples described in this specification.

Example 3

In this example, the operation frequency of the DOSRAM described in Embodiment 4 was estimated.

An "allowable voltage fluctuation", which is one of specifications required for a DOSRAM, is the allowable amount of fluctuation of a voltage applied to the capacitor of a DOSRAM after data writing. A "data retention time" of a DOSRAM is the time taken for the fluctuation amount of a voltage applied to the capacitor included in the DOSRAM to reach the allowable voltage fluctuation. In this example, the "allowable voltage fluctuation" was 0.2 V, and the "data retention time" was the time taken for a voltage applied to the capacitor (a storage capacitance of 3.5 fF) to decrease by 0.2 V from the state after data writing. For example, in this example, DOSRAM data retention of one hour means that the time taken for a potential applied to the capacitor included in the DOSRAM to decrease by 0.2 V after data writing is one hour.

The data retention time of a DOSRAM depends on the amount of cutoff current of the transistor included in the DOSRAM. Here, the cutoff current of the transistor can be replaced with a drain current $I_D$ (hereinafter referred to as Icut) at a gate voltage $V_G$ of 0 V. For example, in the case where the data retention characteristics of the DOSRAM depend on only the amount of Icut of the transistor included in the DOSRAM, the data retention time of the DOSRAM is inversely proportional to the amount of Icut of the transistor included in the DOSRAM.

Figure 28:
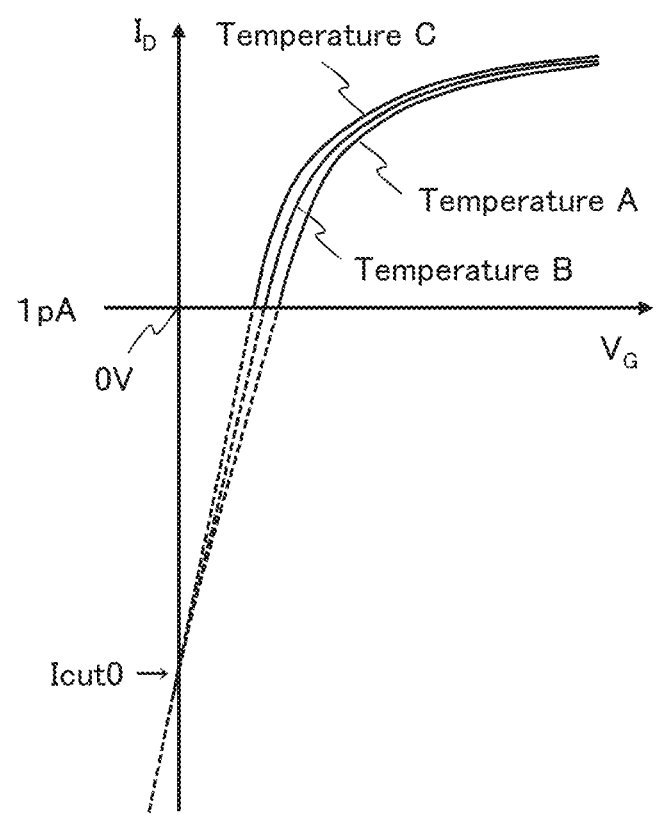
FIG. 28 A diagram illustrating temperature dependence of $V_G$—$I_D$ characteristics of a transistor.

In the case where Icut of the transistor included in the DOSRAM is known, the data retention time of the DOSRAM can be calculated by dividing the amount of charge lost from the capacitor during data retention (0.7 fC corresponding to the product of the capacitor's storage capacitance (3.5 fF) and the amount of decrease of the voltage applied to the capacitor (0.2 V)) by Icut. Furthermore, when a DOSRAM retention time target is set and the above charge amount 0.7 fC is divided by the retention time, a value of Icut required for the transistor included in the DOSRAM (hereinafter referred to as Icut0) can be estimated. In the case where the retention time target is one hour, Icut required for the transistor was approximately 200 zA ($200 \times 10^{-21}$ A). By adjusting the back gate voltage so that Icut0 shown in FIG. 28 becomes 200 zA, a DOSRAM having excellent data-retention characteristics and a high operation frequency in a wide temperature range can be achieved. In this example, the relation between the back gate voltage and the operation frequency of the DOSRAM was evaluated.

For the estimation of the operation frequency of the DOSRAM, a transistor (hereinafter referred to as Sample 3) having a structure similar to that of the transistor 10*d* illustrated in FIG. 9 and FIG. 10 was fabricated, and parameters necessary for the estimation was extracted from the electrical characteristics. In this example, the transistor 10*d* was assumed as the transistor M1 in FIG. 21(A), and the operation frequency of the DOSRAM was estimated.

First, a structure of Sample 3 will be described. As illustrated in FIG. 9 and FIG. 10, Sample 3 includes the insulator 224 placed over a substrate (not illustrated), the oxide 230*b* placed over the insulator 224, the oxide 230*c* placed over the oxide 230*b*, the insulator 250 placed over the oxide 230*c*, and the conductor 260 placed over the insulator 250. Although not illustrated in FIG. 9 and FIG. 10, Sample 3 includes the oxide 230*a* between the insulator 224 and the oxide 230*b* like the transistor 200 illustrated in FIG. 11. The conductor 260 is a stacked film of the conductor 260*a* and the conductor 260*b*.

As the insulator 224, 35-nm-thick silicon oxynitride was used.

As the oxide 230*a*, 5-nm-thick In—Ga—Zn oxide deposited by a DC sputtering method was used. In the deposition of the oxide 230*a*, an oxide target with In:Ga:Zn=1:3:4 [atomic ratio] was used; an oxygen gas at 45 sccm was used as a deposition gas; the deposition pressure was 0.7 Pa; the deposition power was 500 W; the substrate temperature was 200° C.; and the target-substrate distance was 60 mm.

As the oxide 230*b*, 20-nm-thick In—Ga—Zn oxide deposited by a DC sputtering method was used. In the deposition of the oxide 230*b*, an oxide target with In:Ga:Zn=4:2:4.1 [atomic ratio] was used; an argon gas at 30 sccm and an oxygen gas at 15 sccm were used as a deposition gas; the deposition pressure was 0.7 Pa; the deposition power was 500 W; the substrate temperature was 200° C.; and the target-substrate distance was 60 mm.

As the oxide 230*c*, 5-nm-thick In—Ga—Zn oxide deposited by a DC sputtering method was used. In the deposition of the oxide 230*c*, an oxide target with In:Ga:Zn=4:2:4.1 [atomic ratio] was used; an oxygen gas at 45 sccm was used as the deposition gas; the deposition pressure was 0.7 Pa; the deposition power was 500 W; the substrate temperature was 130° C.; and the target-substrate distance was 60 mm.

As the insulator 250, 8-nm-thick silicon oxynitride was used. As the conductor 260*a*, 10-nm-thick titanium nitride was used. As the conductor 260*b*, tungsten was used.

Sample 3 having the above structure is a transistor having a channel length of 0.37 μm and a channel width of 0.24 μm. Note that like the transistor 200, Sample 3 includes the insulator 214, the insulator 216, the conductor 205, the insulator 222, the conductor 242, the insulator 254, the conductor 240, the insulator 280, the insulator 274, the insulator 281, and the like in addition to the above structure.

Next, $I_D$—$V_G$ measurement was performed on the transistor 10d of Sample 3. The $I_D$-$V_G$ measurement was performed under conditions where a drain potential $V_D$ of the transistor was +1.08 V, a source potential $V_S$ was 0 V, and the gate potential $V_G$ was swept from −1.0 V to +3.3 V. A backgate voltage $V_{BG}$ was −7.1 V. Measurement temperatures were three levels of −40° C., 27° C., and 85° C. Specifically, the $I_D$—$V_G$ measurement of the transistor was performed in a state in which a 5-inch-square substrate where the transistor subjected to the measurement was formed was fixed on a thermochuck set at each of the above temperatures. In addition, three elements were measured at each measurement temperature.

A shift voltage (Vsh) and a subthreshold swing value (Svalue) of the transistor were calculated from the obtained $I_D$—$V_G$ curve. Vsh is defined as, in the $I_D$—$V_G$ curve of the transistor, $V_G$ at which the tangent at a point where the slope of the curve is the steepest intersects the straight line of $I_D$=1 pA. Svalue refers to the amount of change in gate voltage in the subthreshold region by which drain current is changed by one digit at a constant drain voltage.

As described in Embodiment 2, the transistor 10d uses a metal oxide in the channel formation region. The transistor using a metal oxide in the channel formation region has an extremely low leakage current in an off state, compared with a transistor using Si in a channel formation region, for example. For that reason, in the transistor using a metal oxide in the channel formation region, it is sometimes difficult to detect Icut by actual measurement. Since it was difficult to actually measure Icut of the transistor 10d, Icut was estimated from Vsh and Svalue, which were obtained from the above $I_D$—$V_G$ curve, by extrapolation using Formula (1). Note that as shown in Formula (1), $I_D$ was assumed to decrease monotonically in accordance with Svalue until the off-state current of the transistor reaches $V_G$=0 V.

[Formula 1]

$$I_{cut} = 1 \times 10^{\left(-12 - \frac{V_{sh}}{S_{value}}\right)} \quad (1)$$

Next, $I_D$—$V_S$ measurement was performed on the transistor 10d.

Here, a method of estimating the DOSRAM operation frequency is described. The DOSRAM operation frequency is the inverse of a data write cycle time of the DOSRAM. The data write cycle time of the DOSRAM is a parameter set by a charging time of the capacitor included in the DOSRAM, for example. In this example, the time corresponding to 40% of the data write cycle time of the DOSRAM (the inverse of the DOSRAM operation frequency) is set as the charging time of the capacitor included in the DOSRAM.

The DOSRAM operation frequency depends on the charging time of the capacitor included in the DOSRAM. Therefore, for the estimation of the DOSRAM operation frequency, first, it is necessary to know the charging time of the capacitor included in the DOSRAM in advance. In this example, a state where a potential of 0.52 V or higher is applied to the capacitor (a storage capacitance of 3.5 fF) included in the DOSRAM was defined as "a charged state" of the capacitor. Accordingly, in this example, the time from when DOSRAM data write operation starts until when the potential applied to the capacitor reaches 0.52 V corresponds to the charging time of the capacitor included in the DOSRAM.

Figure 29A:
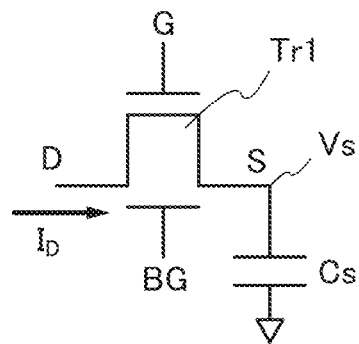
FIGS. 29A-29C Diagrams illustrating a method for calculating operation frequency.

The charging time of the capacitor included in the DOSRAM depends on the amount of $I_D$ of the transistor included in the DOSRAM at the time of DOSRAM data writing. Hence, in this example, DOSRAM data write operation was reproduced by actual application of a potential assumed to be applied to the transistor included in the DOSRAM at the time of DOSRAM data writing (see FIG. 29(A)) to the transistor (L/W=0.37/0.24 μm) according to one embodiment of the present invention, and $I_D$ of the transistor at that time was measured. FIG. 29(A) assumes the case where data is written to the capacitor CA through the transistor M1, which are illustrated in FIG. 21(A). D represents a drain, G represents a gate, and S represents a source. The potential of the source of a transistor Tr1 (a voltage applied to a capacitor Cs) is represented by $V_s$. When the transistor Tr1 is turned on, the current $I_D$ flows and the capacitor Cs is charged. Specifically, $I_D$ of the transistor was measured under conditions where the gate potential Vg of the transistor was +2.97 V, the drain potential Vd was +1.08 V, and the source potential $V_S$ was swept from 0 V to +1.2 V. The back gate voltage $V_{BG}$ was −7.1 V. Measurement temperatures were three levels of −40° C., 27° C., and 85° C.

Note that the DOSRAM was assumed to have a structure including a transistor having a channel length (L) of 60 nm and a channel width (W) of 60 nm, and a capacitor having a storage capacitance of 3.5 fF. The value of $I_D$ obtained from the transistor 10d (L/W=0.37 μm/0.24 μm) was corrected to correspond to the size of a transistor (L/W=60/60 nm) that was assumed to be included in the DOSRAM.

Figure 29B:
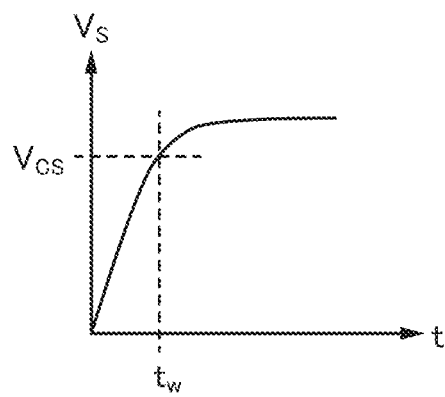

Charging is regarded as being completed when $V_S$ reaches a write judgement voltage $V_{CS}$ after DOSRAM charging is started. The time in that moment is denoted as a charging time $t_W$ (see FIG. 29(B)). When a charge stored in a capacitor that is included in the DOSRAM and has a storage capacitance Cs [F] is Q [C], the charging time is $t_W$ [sec], a potential applied to the capacitor by charging is $V_{CS}$ (=$V_S$) [V], and the drain current of the transistor included in the DOSRAM is $I_D$ [A], the relation of Formula (2) shown below is established between the parameters.

[Formula 2]

$$Q = \int_0^{t_w} I_D dt = C_S \times V_{CS} \quad (2)$$

Figure 29C:
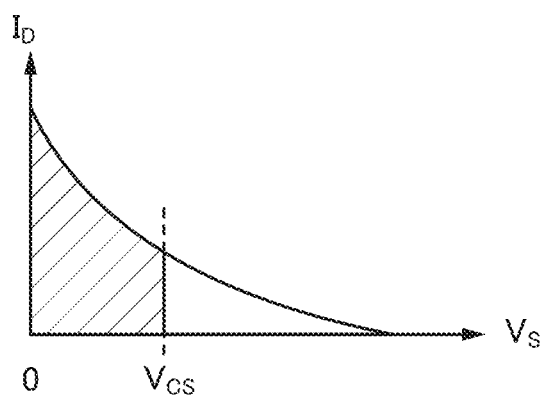

By modification of Formula (2), the charging time $t_W$ of the capacitor included in the DOSRAM can be represented by Formula (3) shown below (see FIG. 29(C)).

[Formula 3]

$$t_w = \int_0^{V_{CS}} \frac{C_S}{I_D} dV_S \quad (3)$$

In this example, 3.5 fF was substituted for Cs in Formula (3), +0.52 V was substituted for $V_{CS}$, and $I_D$ obtained from the above $I_D$—$V_S$ measurement was substituted, whereby the charging time $t_W$ of the capacitor included in the DOSRAM was calculated.

The relation between operation frequency $f$ of the memory device 1400 and the charging time $t_W$ can be represented by Formula (4).

[Formula 4]

$$f = \frac{A}{t_w} \quad (4)$$

In Formula (4), A is a coefficient. In the memory device 1400, the time required for writing within the time of one operation is assumed to be 40%; hence, in this example, the operation frequency $f$ was calculated with a coefficient A of 0.4.

Figure 30:
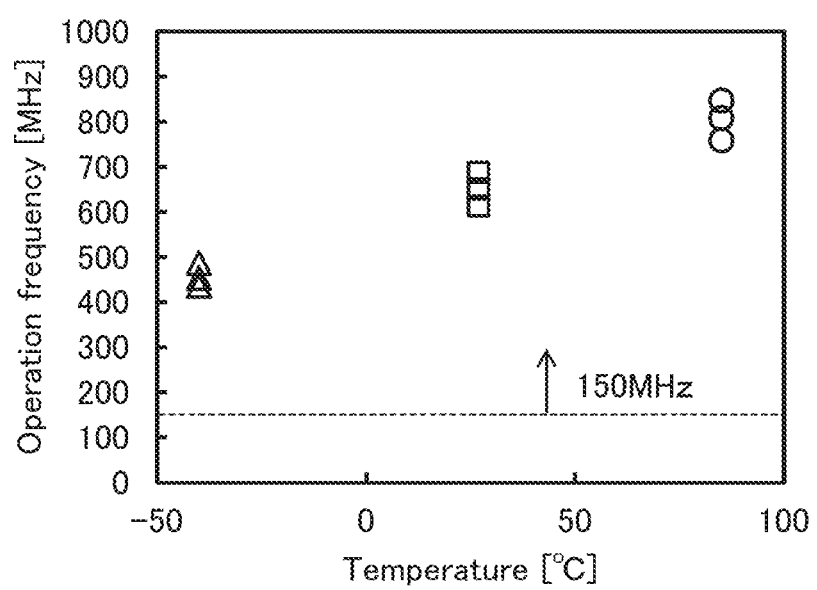
FIG. 30 A diagram showing calculation results of operation frequency.
Figure 31:
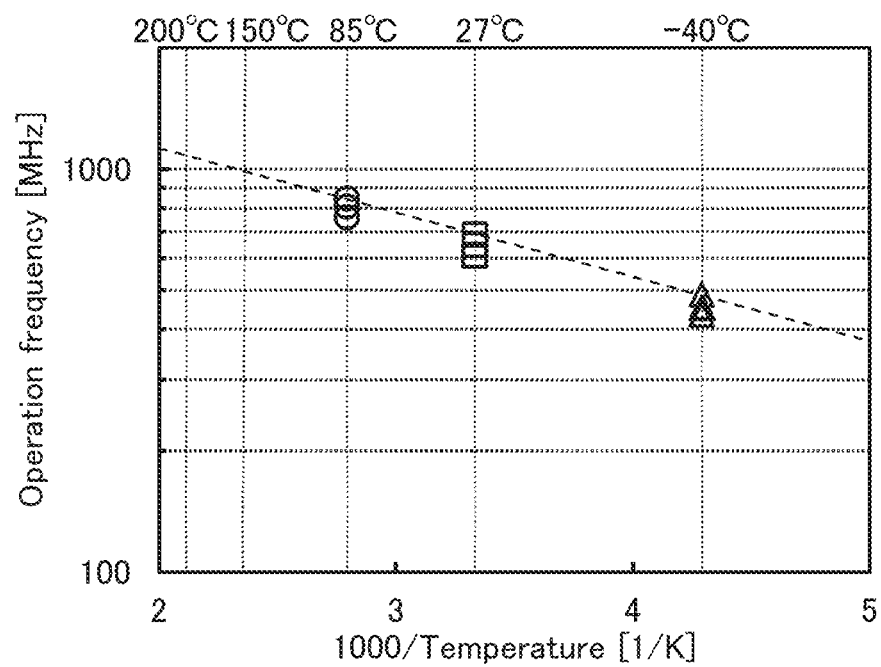
FIG. 31 A diagram showing calculation results of operation frequency.

FIG. 30 and FIG. 31 shows the operation frequency of the DOSRAM including Sample 3 when the power supply voltage was 3.3 V and the back gate voltage was −7.1 V In FIG. 30, the horizontal axis represents temperature (Temperature) [° C.] and the vertical axis represents the operation frequency [MHz]. In FIG. 31, the horizontal axis represents the inverse of temperature (1000/Temperature) [K$^{-1}$] and the horizontal axis represents the operation frequency [MHz]. As shown in FIG. 30 and FIG. 31, it is confirmed that the operation frequency increases with increasing temperature. As shown in FIG. 31, by extrapolation of the calculated operation frequency, the operation frequency at 200° C. is estimated to be higher than or equal to 1 GHz.

From the above, it is found that using a metal oxide in the channel formation region of the transistor included in the DOSRAM increases the operation frequency of the DOSRAM with an increase in temperature.

At least part of the structure, the method, and the like described above in this example can be implemented in appropriate combination with other embodiments and examples described in this specification.

Example 4

In this example, the temperature dependence of the carrier concentration and Hall mobility of the metal oxide was evaluated. Specifically, the Hall effect measurement with different temperatures was performed on Sample 4 in which a metal oxide was deposited, and the carrier concentration and Hall mobility of the metal oxide at each temperature was calculated using the results.

Here, the Hall effect measurement is a method in which electrical characteristics such as carrier density, mobility, and resistivity are measured with the use of the Hall effect; in the Hall effect, when a magnetic field is applied to the object through which a current flows in a direction perpendicular to the direction of the current, an electromotive force is produced in directions perpendicular to both the current and the magnetic field. Here, the Hall effect measurement using the Van der Pauw method was performed. Note that ResiTest manufactured by TOYO Corporation was used for the Hall effect measurement.

First, a method for fabricating Sample 4 is described.

Over a glass substrate, 400-nm-thick silicon nitride was deposited and 50-nm-thick silicon oxynitride was deposited over the silicon nitride.

Next, as a metal oxide to be measured, a 35-nm-thick In—Ga—Zn oxide was deposited over the silicon oxynitride by a sputtering method. In the deposition of the In—Ga—Zn oxide, an oxide target with In:Ga:Zn=1:1:1 [atomic ratio] was used; the flow rate of argon gas was 20 sccm, the flow rate of oxygen gas was 10 sccm; the pressure was 0.4 Pa; the DC power source was 200 W; and the substrate temperature was 300° C.

Next, heat treatment was performed. As the heat treatment, treatment was performed at 450° C. in an atmosphere containing nitrogen for one hour, and subsequently treatment was performed at 450° C. in an atmosphere containing oxygen and nitrogen for one hour.

Through the above steps, Sample 4 was fabricated.

The Hall effect measurement was performed on Sample 4 in the temperature range from 159° C. to 239° C. in steps of approximately 10° C.

Figure 32A:
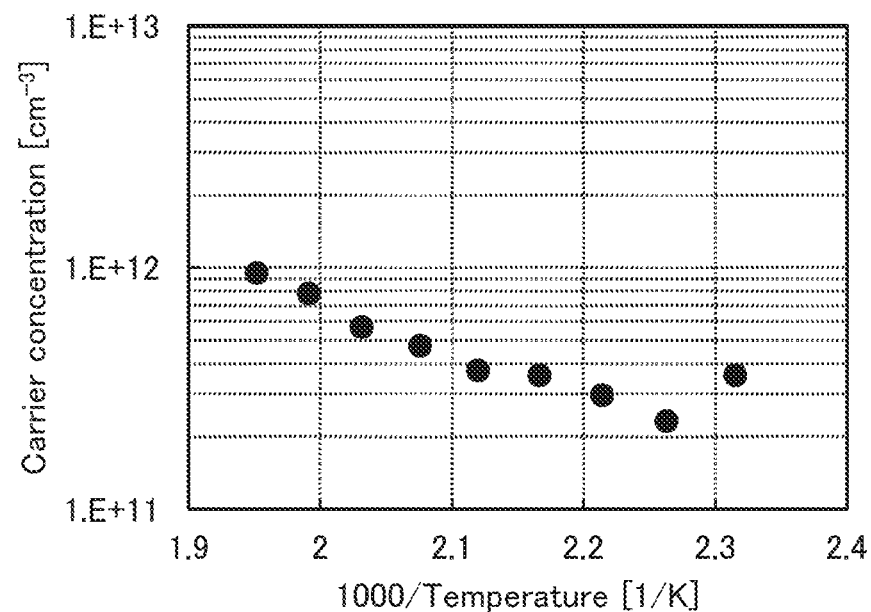
FIGS. 32A-32B Diagrams showing the carrier concentration and the Hall mobility of an oxide semiconductor of one embodiment of the present invention.

FIG. 32(A) shows a change in carrier concentration of the metal oxide with respect to the measurement temperature. The horizontal axis represents the inverse of measurement temperature (1000/Temperature) [K$^{-1}$] and the vertical axis represents the carrier concentration [cm$^{-3}$] of the metal oxide.

From FIG. 32(A), it is found that the carrier concentration of the metal oxide increases as the inverse of the measurement temperature decreases (as the measurement temperature increases).

Figure 32B:
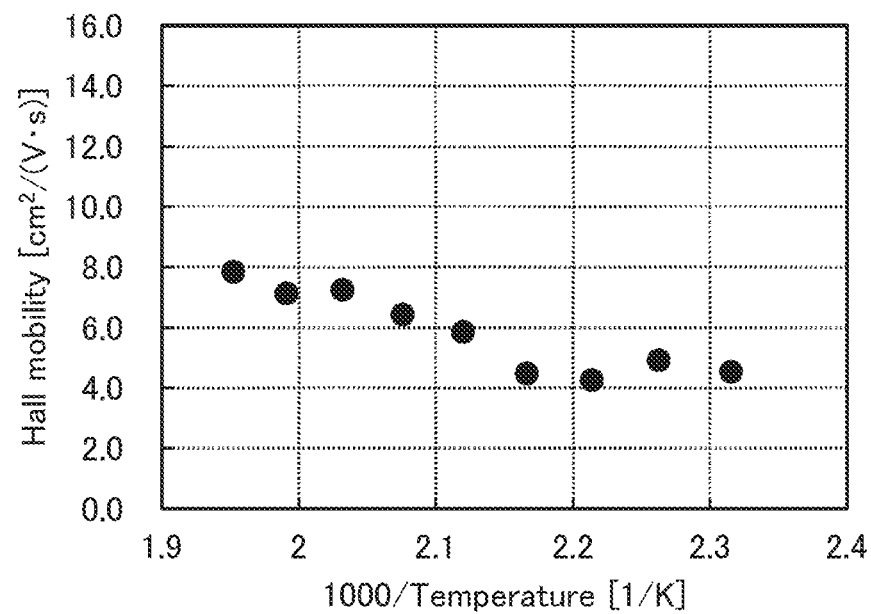

FIG. 32(B) shows a change in Hall mobility of the metal oxide with respect to the measurement temperature. The horizontal axis represents the inverse of measurement temperature (1000/Temperature) [K$^{-1}$], and the vertical axis represents the Hall mobility [cm$^{-2}$/(V·s)] of the metal oxide.

From FIG. 32(B), it is found that the Hall mobility of the metal oxide increases as the inverse of the measurement temperature decreases (as the measurement temperature increases).

From the above, it is confirmed that the mobility of the metal oxide tends to increase with increasing temperature.

At least part of the structure, the method, and the like described in this example can be implemented in appropriate combination with other embodiments and examples described in this specification.

REFERENCE NUMERALS

10: transistor, 10a: transistor, 10b: transistor, 10c: transistor, 10d: transistor, 51: region, 52: region, 53: region, 54: region, 55: region, 100: capacitor, 110: conductor, 112: conductor, 120: conductor, 130: insulator, 140: insulator, 150: insulator, 200: transistor, 200A: transistor, 200B: transistor, 200C: transistor, 205: conductor, 210: insulator, 212: insulator, 214: insulator, 216: insulator, 218: conductor, 222: insulator, 224: insulator, 230: oxide, 230a: oxide, 230b: oxide, 230c: oxide, 230c1: oxide, 230c2: oxide, 231: region, 231a: region, 231b: region, 234: region, 240: conductor, 240a: conductor, 240b: conductor, 241: insulator, 241a: insulator, 241b: insulator, 242: conductor, 242a: conductor, 242b: conductor, 243: region, 243a: region, 243b: region, 244a: barrier film, 244b: barrier film, 250: insulator, 254: insulator, 254a: insulator, 254b: insulator, 254c: insulator, 260: conductor, 260a: conductor, 260b: conductor, 273: insulator, 274: insulator, 280: insulator, 280a: insulator, 280b: insulator, 281: insulator, 282: insulator, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: transistor, 405: conductor, 424a: insulator, 424b: insulator, 430c: oxide, 431a: oxide, 431b: oxide, 432a: oxide, 432b: oxide, 440: conductor, 440a: conductor, 440b: conductor, 442: conductor, 442a: conductor, 442b: conductor, 450: insulator, 460: conductor, 460a: conductor, 460b: conductor, 1001: wiring, 1002: wiring, 1003: wiring, 1004:

wiring, 1005: wiring, 1006: wiring, 1007: wiring, 1008: wiring, 1009: wiring, 1010: wiring

The invention claimed is:

1. A transistor comprising:
a crystalline metal oxide; and
a gate, a source, and a drain,
wherein the crystalline metal oxide comprising a first layer and a second layer,
wherein the first layer has a wider bandgap than the second layer,
wherein the first layer and the second layer form a crystal lattice, and
wherein in the case where a temperature increases, the crystalline metal oxide is configured such that a thickness of the second layer in a c-axis direction is decreased.

2. The transistor according to claim 1,
wherein the crystalline metal oxide comprises a first metal oxide, a second metal oxide over the first metal oxide, and a third metal oxide over the second metal oxide, and
wherein the first metal oxide, the second metal oxide, and the third metal oxide each comprise the first layer and the second layer.

3. The transistor according to claim 2,
wherein the first layer included in the second metal oxide and the second layer included in the second metal oxide are each placed substantially parallel to a formation surface of the second metal oxide.

4. The transistor according to claim 3,
wherein in a channel width direction of the transistor, the third metal oxide covers a top surface and a side surface of the second metal oxide,
wherein the gate covers the top surface and the side surface of the second metal oxide, and
wherein in a region where the side surface of the second metal oxide faces the third metal oxide, a c-axis direction of the third metal oxide is different from a c-axis direction of the second metal oxide.

5. The transistor according to claim 2,
wherein the first metal oxide, the second metal oxide, and the third metal oxide each comprise the first layer and the second layer, and
wherein the first layer included in the second metal oxide and the second layer included in the second metal oxide are each placed substantially perpendicularly to a formation surface of the second metal oxide.

6. The transistor according to claim 2,
wherein a bottom surface of a first region not overlapping with the second metal oxide in the gate is at a lower position than a bottom surface of the second metal oxide, and
wherein a bottom surface of a second region positioned opposite to the first region with the second metal oxide sandwiched therebetween in the gate is at a lower position than the bottom surface of the second metal oxide.

7. The transistor according to claim 2,
further comprising a second gate below the first metal oxide to overlap with at least part of a region where the second metal oxide and the gate overlap with each other.

8. The transistor according to claim 2,
wherein the first layer comprises an element M (M is one or more selected from Al, Ga, Y, and Sn) and Zn, and
wherein the second layer comprises In.

9. The transistor according to claim 1,
wherein one or both of a channel length and a channel width of the transistor comprises a region of less than or equal to 100 nm.

* * * * *